United States Patent
Nihashi et al.

(10) Patent No.: US 10,788,754 B2
(45) Date of Patent: Sep. 29, 2020

(54) PATTERN FORMING METHOD AND ELECTRONIC DEVICE MANUFACTURING METHOD

(71) Applicant: FUJIFILM Corporation, Tokyo (JP)

(72) Inventors: Wataru Nihashi, Shizuoka (JP); Toru Tsuchihashi, Shizuoka (JP); Hideaki Tsubaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 29 days.

(21) Appl. No.: 15/853,973

(22) Filed: Dec. 26, 2017

(65) Prior Publication Data
US 2018/0120705 A1    May 3, 2018

Related U.S. Application Data

(63) Continuation of application No. PCT/JP2016/068912, filed on Jun. 24, 2016.

(30) Foreign Application Priority Data

Jul. 1, 2015 (JP) ................................. 2015-132963
Jun. 21, 2016 (JP) ................................. 2016-122975

(51) Int. Cl.
G03F 7/32 (2006.01)
G03F 7/20 (2006.01)
G03F 7/039 (2006.01)
G03F 7/038 (2006.01)
G03F 7/004 (2006.01)

(52) U.S. Cl.
CPC .............. *G03F 7/32* (2013.01); *G03F 7/0048* (2013.01); *G03F 7/038* (2013.01); *G03F 7/039* (2013.01); *G03F 7/322* (2013.01); *G03F 7/325* (2013.01); *G03F 7/2059* (2013.01)

(58) Field of Classification Search
CPC ....................................................... G03F 7/26
See application file for complete search history.

(56) References Cited

U.S. PATENT DOCUMENTS

| | | | |
|---|---|---|---|
| 9,448,482 B2 | 9/2016 | Iwato et al. | |
| 2011/0291312 A1 | 12/2011 | Sakihama et al. | |
| 2014/0120470 A1 | 5/2014 | Pohlers et al. | |
| 2015/0293446 A1* | 10/2015 | Yokokawa | ............ C08F 212/14 430/311 |

FOREIGN PATENT DOCUMENTS

| | | |
|---|---|---|
| JP | 2000330284 | 11/2000 |
| JP | 2013127525 | 6/2013 |
| JP | 2013127526 | 6/2013 |
| JP | 2014123105 | 7/2014 |
| JP | 2014240092 | 12/2014 |
| TW | 201435502 | 9/2014 |

OTHER PUBLICATIONS

Machine translation of JP 2013-127525, description, date of translation:Aug. 26, 2019. (Year: 2019).*
Machine translation of JP 2013-127525, claims, date of translation:Aug. 26, 2019. (Year: 2019).*
"International Search Report (Form PCT/ISA/210) of PCT/JP2016/068912," dated Jul. 19, 2016, with English translation thereof, pp. 1-9.
"Written Opinion of the International Searching Authority (Form PCT/ISA/237) of PCT/JP2016/068912," dated Jul. 19, 2016, with English translation thereof, pp. 1-13.
"Office Action of Taiwan Counterpart Application", dated Feb. 27, 2020, with English translation thereof, p. 1-p. 12.

* cited by examiner

*Primary Examiner* — Kathleen Duda
(74) *Attorney, Agent, or Firm* — JCIPRNET

(57) ABSTRACT

Provided are a positive tone pattern forming method in which development is carried out using a developer containing an organic solvent with use of a composition containing (A) a resin which has a repeating unit containing a moiety capable of forming a polar interaction and whose polarity is decreased due to release of the polar interaction by the action of an acid or a base, or a composition containing (A') a resin having a repeating unit containing a polar group and (B) a compound capable of forming a polar interaction with the polar group of the resin (A'); and an electronic device manufacturing method including such a pattern forming method.

13 Claims, No Drawings

PATTERN FORMING METHOD AND ELECTRONIC DEVICE MANUFACTURING METHOD

CROSS REFERENCE TO RELATED APPLICATIONS

This is a continuation of International Application No. PCT/JP2016/068912 filed on Jun. 24, 2016, and claims priorities from Japanese Patent Application No. 2015-132963 filed on Jul. 1, 2015 and Japanese Patent Application No. 2016-122975 filed on Jun. 21, 2016, the entire disclosures of which are incorporated herein by reference.

BACKGROUND OF THE INVENTION

1. Field of the Invention

The present invention relates to a pattern forming method, an electronic device manufacturing method, and an electronic device. More specifically, the present invention relates to a positive tone pattern forming method, which is suitable for use in a production process of a semiconductor such as an integrated circuit (IC), a production process of a circuit board of, for example, a liquid crystal or a thermal head, and other lithography processes of photofabrication, an electronic device manufacturing method, and an electronic device.

2. Description of the Related Art

Since the emergence of resist for KrF excimer laser (248 nm), a pattern forming method utilizing chemical amplification has been used in order to compensate for any sensitivity reduction due to light absorption. For example, in a positive chemical amplification method, firstly, a photoacid generator contained in an exposed area is decomposed by light irradiation to thereby generate an acid. Then, in the post exposure bake (PEB) process or the like, an alkali-insoluble group contained in a photosensitive composition is changed into an alkali-soluble group by the catalytic action of the generated acid. Thereafter, development is carried out using, for example, an alkaline developer. Thereby, the exposed area is removed to obtain a desired pattern.

For use in the above method, various alkaline developers have been proposed. For example, an aqueous alkaline developer containing 2.38 mass % TMAH (aqueous solution of tetramethylammonium hydroxide) is generally used as such an alkaline developer.

The wavelength shortening of an exposure light source and the realization of high numerical apertures (high NA) for a projector lens have been advanced in order to cope with the miniaturization of semiconductor elements. Consequently, a pattern forming method using ArF excimer laser having a wavelength of 193 nm, electron beams, or the like, a method in which the space between a projector lens and a sample is filled with a liquid having a high refractive index (hereinafter, also referred to as an "immersion liquid") (that is, an "immersion method"), and further, a method of carrying out exposure using extreme ultraviolet (EUV) having a further shorter wavelength (13.5 nm) have been proposed.

For example, JP2000-330284A and JP2014-123105A disclose a pattern forming method where a chemically amplified resist composition containing a resin having an acid-decomposable repeating unit in which an alkali-soluble group protected by a protective group becomes alkali-soluble due to elimination of the protective group by the action of an acid (also referred to as an "acid-decomposable resin), a photoacid generator, and an organic ammonium salt is developed with an alkaline developer.

SUMMARY OF THE INVENTION

However, in the positive tone pattern forming method using a conventional chemically amplified resist composition as disclosed in JP2000-330284A and JP2014-123105A, further improvements of sensitivity, resolution, line width roughness (LWR) performance, and local pattern dimension uniformity (Local-CDU performance) are required, in particular, in the formation of an ultrafine pattern (for example, a line and space pattern with a line width of 20 nm or less, a contact hole pattern with a pore size of 30 nm or less, or the like).

An object of the present invention is to provide a positive tone pattern forming method which is capable of forming a pattern having excellent sensitivity, resolution, line width roughness (LWR) performance, and local pattern dimension uniformity (Local-CDU performance), in particular, in the formation of an ultrafine pattern (for example, a line and space pattern with a line width of 20 nm or less, a contact hole pattern with a pore size of 30 nm or less, or the like). Another object of the present invention is to provide an electronic device manufacturing method including such a pattern forming method, and an electronic device manufactured by such a manufacturing method.

That is, the foregoing objects can be achieved by the following means.

<1> A positive tone pattern forming method, comprising:
a step (1) of forming a film using an actinic ray-sensitive or radiation-sensitive resin composition containing
(A) a resin which has a repeating unit containing a moiety capable of forming a polar interaction and whose polarity is decreased due to release of the polar interaction by the action of an acid or a base,
(C) a compound capable of generating an acid or a base upon irradiation with actinic rays or radiation, and
(D) a solvent, in which the solubility of the composition in an organic solvent is increased by the action of exposure;
a step (2) of exposing the film; and
a step (3) of developing the exposed film using a developer containing an organic solvent after exposure, in this order of steps.

<2> A positive tone pattern forming method, comprising:
a step (1') of forming a film using an actinic ray-sensitive or radiation-sensitive resin composition containing
(A') a resin having a repeating unit having a polar group,
(B) a compound capable of forming a polar interaction with the polar group of the resin (A'),
(C) a compound capable of generating an acid or a base upon irradiation with actinic rays or radiation, and
(D) a solvent, in which the polar interaction formed between the polar group of the resin (A') and the compound (B) is released by the action of an acid or a base, thus decreasing the polarity of the composition and increasing the solubility of the composition in an organic solvent;
a step (2) of exposing the film; and
a step (3) of developing the exposed film using a developer containing an organic solvent after exposure, in this order of steps.

<3> The pattern forming method according to <1> or <2>, in which the organic solvent contained in the developer is an ester-based solvent.

<4> The pattern forming method according to any one of <1> to <3>, in which an acid dissociation constant pKa(A) of the group generated by releasing the polar interaction of the resin (A) or an acid dissociation constant pKa(A') of the polar group of the resin (A') is 3.0 or more.

<5> The pattern forming method according to any one of <1> to <4>, in which the group generated by releasing the polar interaction of the resin (A) or the polar group of the resin (A') is a carboxyl group or a hydroxyl group.

<6> The pattern forming method according to any one of <1> to <5>, in which the content of the repeating unit containing a moiety capable of forming a polar interaction in the resin (A) or the content of the repeating unit having a polar group in the resin (A') is 5 to 50 mol % with respect to all repeating units of the resin (A) or the resin (A').

<7> The pattern forming method according to <2>, in which the compound (B) is an ionic basic compound.

<8> The pattern forming method according to <2> or <7>, in which the compound (B) is represented by General Formula (B1).

(B1)

In General Formula (B1), $A^-$ represents an organic acid anion, $X^+$ represents a nitrogen cation, a sulfur cation, or an iodine cation, Ry represents a hydrogen atom, an alkyl group, a cycloalkyl group, an aryl group, an aralkyl group, or a heterocyclic group, Rx represents an alkyl group, a cycloalkyl group, an aryl group, an aralkyl group, or a heterocyclic group; a plurality of Rx's may be the same or different; the plurality of Rx's may be bonded to each other to form a ring; and the formed ring may have a nitrogen atom, an oxygen atom, or a sulfur atom as a ring member, and n2 represents 4 in the case where $X^+$ is a nitrogen cation, n2 represents 3 in the case where $X^+$ is a sulfur cation, and n2 represents 2 in the case where $X^+$ is an iodine cation.

<9> The pattern forming method according to <2>, <7> or <8>, in which the compound (B) is a tetraalkylammonium salt.

<10> The pattern forming method according to any one of <2>, and <7> to <9>, in which the content of the compound (B) is 3.0 mass % or more in the total solid content of the actinic ray-sensitive or radiation-sensitive resin composition.

<11> The pattern forming method according to any one of <1> to <10>, in which the compound (C) is a compound capable of generating an acid upon irradiation with actinic rays or radiation.

<12> The pattern forming method according to any one of <1> to <11>, in which an acid dissociation constant pKa(C) of the acid generated upon exposure of the compound (C) is less than 3.0.

<13> The pattern forming method according to any one of <1> to <12>, in which the content of the compound (C) is 5.0 mass % or more in the total solid content of the actinic ray-sensitive or radiation-sensitive resin composition.

<14> The pattern forming method according to any one of <1> to <13>, in which an absolute value of the difference pKa(A)−pKa(C) between the acid dissociation constant pKa (A) of the group generated by releasing the polar interaction of the resin (A) and the acid dissociation constant pKa(C) of the acid or base generated upon exposure of the compound (C), or an absolute value of the difference pKa(A')−pKa(C) between the acid dissociation constant pKa(A') of the polar group of the resin (A') and the acid dissociation constant pKa(C) of the acid or base generated upon exposure of the compound (C) is 6.0 or more.

<15> The pattern forming method according to any one of <1> to <14>, in which the mass ratio of a solvent having a hydroxyl group to a solvent having no hydroxyl group in the solvent (D) is 40/60 to 100/0.

<16> The pattern forming method according to any one of <1> to <15>, in which a heating step is not provided after the step (2).

<17> An electronic device manufacturing method, comprising the pattern forming method according to any one of <1> to <16>.

According to the present invention, it is possible to provide a positive tone pattern forming method which is capable of forming a pattern having excellent sensitivity, resolution, line width roughness (LWR) performance, and local pattern dimension uniformity (Local-CDU performance), in particular, in the formation of an ultrafine pattern (for example, a line and space pattern with a line width of 20 nm or less, a contact hole pattern with a pore size of 30 nm or less, or the like). Further, according to the present invention, it is possible to provide an electronic device manufacturing method including such a pattern forming method, and an electronic device manufactured by such a manufacturing method.

DESCRIPTION OF THE PREFERRED EMBODIMENTS

Hereinafter, embodiments of the present invention will be described in detail.

In the description of the present specification, in the case where a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

The term "actinic rays" or "radiation" as used herein refers to, for example, a bright line spectrum of mercury lamp, far ultraviolet rays represented by excimer laser, extreme ultraviolet rays (EUV), X-rays, or electron beams (EB). The term "light" as used herein refers to actinic rays or radiation.

Unless otherwise indicated, the term "exposure" as used herein includes not only exposure to a bright line spectrum of mercury lamp, far ultraviolet rays represented by excimer laser, extreme ultraviolet rays, X-rays, EUV, or the like but also lithography with particle beams such as electron beams and ion beams.

As used herein, the term "(meth)acrylic monomer" refers to at least one monomer having a structure of "$CH_2=CH-CO-$" or "$CH_2=C(CH_3)-CO-$". Similarly, "(meth)acrylate" and "(meth)acrylic acid" refers to "at least one of acrylate or methacrylate" and "at least one of acrylic acid or methacrylic acid", respectively.

The weight-average molecular weight of a resin, as used herein, is a polystyrene-conversion value measured by a gel permeation chromatography (GPC) method. GPC can be based on a method using HLC-8120 (manufactured by Tosoh Corporation), TSK gel Multipore HXL-M (manufactured by Tosoh Corporation, 7.8 mm ID×30.0 cm) as a column, and tetrahydrofuran (THF) or N-methyl-2-pyrrolidone (NMP) as an eluent.

Hereinafter, the pattern forming method of the present invention will be described in detail.

<Pattern Forming Method>

The pattern forming method of the present invention includes the following first and second aspects.

(First Aspect)

The first aspect of the pattern forming method of the present invention is a positive tone pattern forming method, including:

a step (1) of forming a film using an actinic ray-sensitive or radiation-sensitive resin composition containing (A) a resin which has a repeating unit containing a moiety capable of forming a polar interaction and whose polarity is decreased due to release of the polar interaction by the action of an acid or a base, (C) a compound capable of generating an acid or a base upon irradiation with actinic rays or radiation, and (D) a solvent, in which the solubility of the composition in an organic solvent is increased by the action of exposure;

a step (2) of exposing the film; and a step (3) of developing the exposed film using a developer containing an organic solvent after exposure, in this order of steps.

(Second Aspect)

The second aspect of the pattern forming method of the present invention is a positive tone pattern forming method, including:

a step (1') of forming a film using an actinic ray-sensitive or radiation-sensitive resin composition containing (A') a resin having a repeating unit having a polar group, (B) a compound capable of forming a polar interaction with the polar group of the resin (A'), (C) a compound capable of generating an acid or a base upon irradiation with actinic rays or radiation, and (D) a solvent, in which the polar interaction formed between the polar group of the resin (A') and the compound (B) is released by the action of an acid or a base, thus decreasing the polarity of the composition and increasing the solubility of the composition in an organic solvent;

a step (2) of exposing the film; and a step (3) of developing the exposed film using a developer containing an organic solvent after exposure, in this order of steps.

According to the present invention, it is possible to provide a positive tone pattern forming method which is capable of forming a pattern having excellent sensitivity, resolution, LWR performance, and Local-CDU performance, in particular, in the formation of an ultrafine pattern (for example, a line and space pattern with a line width of 20 nm or less, a contact hole pattern with a pore size of 30 nm or less, or the like).

Although the reason is not clear, it is presumed as follows.

In a conventional positive tone pattern forming method, a pattern is formed by increasing the solubility of a resin having an acid-decomposable repeating unit in an alkaline developer by the action of an acid generated upon exposure. In this case, it is considered that an acid decomposition reaction process by the acid generated upon exposure becomes a rate-determining step of pattern formation.

On the other hand, in the pattern forming method of the present invention, the polar interaction in the resin (A) or the polar interaction between the resin (A') and the compound (B) is released by the action of an acid or a base generated upon exposure, which results in a decreased polarity of the resin to increase the solubility thereof in a developer containing an organic solvent to thereby form a positive tone pattern. In this case, it is considered that high sensitivity can be achieved because the process of generating an acid or a base upon exposure becomes a rate-determining step of pattern formation.

Further, for example, in the case of pattern formation using a conventional chemically amplified mechanism, diffusion of an acid leads to deterioration of resolution, LWR performance, and Local-CDU performance particularly in a fine pattern.

In contrast, in the present invention, the mechanism by which the polar interaction in the resin (A) or the polar interaction between the resin (A') and the compound (B) is released by the action of an acid or a base generated upon exposure is the same as in the neutralization reaction, that is, it is a non-chemically amplified type. In the present invention, it is considered that the pattern formation is carried out using such a non-chemically amplified mechanism, and pattern formation can be carried out without requiring diffusion of an acid, so that satisfactory resolution, LWR performance, and Local-CDU performance can be achieved.

Based on the above reasons, it is considered that the present invention can achieve sensitivity, resolution, LWR performance, and Local-CDU performance at an extremely high level.

[Actinic Ray-Sensitive or Radiation-Sensitive Resin Composition]

The actinic ray-sensitive or radiation-sensitive resin composition used in the pattern forming method of the present invention will be described.

In the present invention, the actinic ray-sensitive or radiation-sensitive resin composition is used in positive development (development where solubility in a developer increases upon exposure, an unexposed area remains as a pattern, and an exposed area is removed). The actinic ray-sensitive or radiation-sensitive resin composition of the present invention is an actinic ray-sensitive or radiation-sensitive resin composition for organic solvent development using a developer containing an organic solvent. Here, the expression "for organic solvent development" means at least an application to be subjected to a development step using a developer containing an organic solvent. The actinic ray-sensitive or radiation-sensitive resin composition of the present invention is typically a non-chemically amplified positive resist composition.

The radiation-sensitive or actinic ray-sensitive resin composition of the present invention is preferably used for electron beam or extreme ultraviolet exposure, and more preferably for extreme ultraviolet exposure.

It is preferred that various materials (for example, a resist solvent, a developer, a rinsing liquid, a composition for forming an antireflection film, a composition for forming a topcoat, and the like) used in the actinic ray-sensitive or radiation-sensitive resin composition of the present invention, and the pattern forming method of the present invention do not contain impurities such as metals, metal salts containing halogen, acids, and alkalis. The content of impurities contained in these materials is preferably 1 ppm or less, more preferably 1 ppb or less, still more preferably 100 ppt or less, particularly preferably 10 ppt or less, and particularly preferably 1 ppt or less. It is most preferred that those materials are substantially free of impurities (below the detection limit of the measuring apparatus).

The method for removing impurities such as metals from various materials may be, for example, filtration using a filter. As for the filter pore size, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferred. The filter may be preliminarily washed with an organic solvent and then used. In the step of filtration using a filter, plural kinds of filters may be connected in series or in parallel, and then used. In the case of using plural kinds of filters, a combination of filters having different pore sizes and/or materials may be used. In addition, various materials may be filtered plural times, and a step of filtering plural times may be a circulatory filtration step.

Moreover, examples of the method for reducing impurities such as metals contained in various materials include a method of selecting raw materials having a small content of metals as raw materials constituting various materials, a method of subjecting raw materials constituting various materials to filtration using a filter, and a method of carrying out distillation under conditions where contamination is suppressed as much as possible by such as lining of the inside of the apparatus with Teflon (registered trademark). The preferred conditions for the filtration using a filter, which is carried out for raw materials constituting various materials, are the same as described above.

In addition to filtration using a filter, removal of impurities by an adsorbing material may be carried out, or a combination of filtration using a filter and filtration using an adsorbing material may be used. As the adsorbing material, known adsorbing materials may be used. For example, inorganic adsorbing materials such as silica gel and zeolite, and organic adsorbing materials such as activated carbon may be used.

[(A) Resin Having Repeating Unit Containing Moiety Capable of Forming Polar Interaction and Having Decreased Polarity Due to Release of Polar Interaction by Action of Acid or Base]

The actinic ray-sensitive or radiation-sensitive resin composition of the first aspect of the present invention contains (A) a resin which has a repeating unit containing a moiety capable of forming a polar interaction, and has a decreased polarity due to release of the polar interaction by the action of an acid or a base (also referred to as "resin (A)").

The resin (A) is a resin which has a repeating unit containing a moiety capable of forming a polar interaction, and has a decreased polarity due to release of the polar interaction by the action of an acid or a base.

In the actinic ray-sensitive or radiation-sensitive resin composition containing the resin (A) and the compound (C), the polar interaction in the resin (A) is released by the action of an acid or a base generated from the compound (C) upon exposure, which results in an increased solubility of the resin in a developer containing an organic solvent, so that a positive tone pattern can be formed.

The resin (A) generates a group in the case where the polar interaction is released. The acid dissociation constant pKa(A) of the group generated by releasing the polar interaction of the resin (A) is preferably 3.0 or more, more preferably 3.5 or more, and still more preferably 4.0 or more. From the viewpoint of sensitivity and resolution, the pKa(A) is preferably 3.0 or more.

Here, the acid dissociation constant pKa(A) of the group generated by releasing the polar interaction of the resin (A) is calculated for the monomer corresponding to the repeating unit having the group generated by releasing the polar interaction, using ACD/LABs pKa DB (Version 8.0) (Fujitsu Limited).

In the resin (A), the group generated in the case where the polar interaction is released is preferably a polar group, and more preferably a carboxyl group or a hydroxyl group.

The repeating unit containing a moiety capable of forming a polar interaction in the resin (A) is preferably a repeating unit represented by General Formula (1-1).

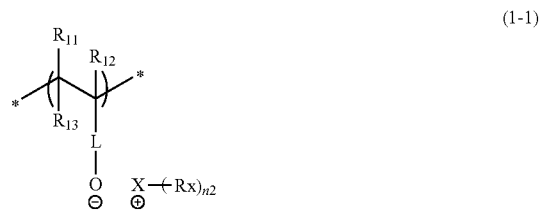

(1-1)

In General Formula (1-1)

$R_{11}$ to $R_{13}$ each independently represent a hydrogen atom, an alkyl group, a cycloalkyl group, a halogen atom, a cyano group, or an alkoxycarbonyl group.

$X^+$ represents a nitrogen cation, a sulfur cation, or an iodine cation.

Rx represents an alkyl group, a cycloalkyl group, an aryl group, an aralkyl group, or a heterocyclic group. In the case where there is a plurality of Rx's, the plurality of Rx's may be the same or different. In the case where there is a plurality of Rx's, the plurality of Rx's may be bonded to each other to form a ring, and the formed ring may have a nitrogen atom, an oxygen atom, or a sulfur atom as a ring member.

n2 represents 4 in the case where $X^+$ is a nitrogen cation, n2 represents 3 in the case where $X^+$ is a sulfur cation, and n2 represents 2 in the case where $X^+$ is an iodine cation.

L represents a divalent linking group formed of a non-metallic atom.

$R_{13}$ and L may be bonded to each other to form a ring.

* represents a bond.

L may be, for example, an alkylene group, a cycloalkylene group, an oxygen atom, a sulfur atom, a carbonyl group, an ester bond, a sulfonyl group, an arylene group, —NH—, or a divalent linking group obtained by combining these groups and atoms. Specific examples of L include linking groups having the following structures and divalent linking groups obtained by combining these linking groups.

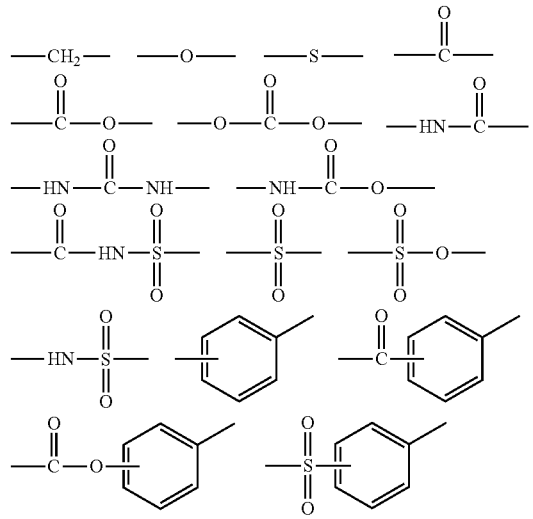

A carbonyl group or an arylene group is particularly preferable as L in General Formula (1-1). In the case where L represents an arylene group, it is preferably a phenylene group. In the case where L represents an arylene group, the arylene group may have a substituent.

The alkyl group as $R_{11}$ to $R_{13}$ is an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, or a dodecyl group, and preferably an alkyl group having 8 or less carbon atoms. These alkyl groups may have a substituent.

Examples of the alkyl group contained in the alkoxycarbonyl group as $R_{11}$ to $R_{13}$ are the same as those mentioned above for the alkyl group as $R_{11}$ to $R_{13}$.

The cycloalkyl group as $R_{11}$ to $R_{13}$ may be monocyclic or polycyclic. The cycloalkyl group is preferably a monocyclic cycloalkyl group having 3 to 8 carbon atoms, such as a cyclopropyl group, a cyclopentyl group, or a cyclohexyl group. These cycloalkyl groups may have a substituent.

$R_{11}$ to $R_{13}$ preferably represent a hydrogen atom or an alkyl group, and more preferably represent a hydrogen atom or a methyl group. $R_{11}$ and $R_{13}$ most preferably represent a hydrogen atom.

$R_{13}$ and L may be bonded to each other. In the case where $R_{13}$ and L are bonded to each other, it is preferred that $R_{13}$ represents a single bond or an alkylene group, and L represents a trivalent linking group formed of a nonmetallic atom. In the case where $R_{13}$ represents an alkylene group, it is preferably an alkylene group obtained by removing one hydrogen atom from the above-mentioned alkyl group. In the case where L represents a trivalent linking group formed of a nonmetallic atom, it is preferably a trivalent linking group obtained by removing one hydrogen atom from the above-mentioned divalent linking group.

Each of the groups represented by $R_{11}$ to $R_{13}$ and L may have a substituent. Examples of the substituent include an alkyl group, a cycloalkyl group, an aryl group, an amino group, an amido group, a ureido group, a urethane group, a hydroxyl group, a carboxy group, a halogen atom, an alkoxy group, a thioether group, an acyl group, an acyloxy group, an alkoxycarbonyl group, a cyano group, and a nitro group. These substituents preferably have 8 or less carbon atoms.

$X^+$ represents a nitrogen cation, a sulfur cation, or an iodine cation, and is preferably a nitrogen cation or a sulfur cation and more preferably a nitrogen cation.

Rx represents an alkyl group, a cycloalkyl group, an aryl group, an aralkyl group, or a heterocyclic group. From the viewpoint of improving solvent solubility and improving defect performance, at least one of an (n2) number of Rx's preferably has 3 or more carbon atoms, more preferably 5 or more carbon atoms, and still more preferably 6 or more carbon atoms. From the viewpoint of improving resolution, Rx preferably has 10 or less carbon atoms. From the viewpoint of improving LWR performance, Rx preferably represents an alkyl group.

The alkyl group of Rx may be, for example, preferably a linear or branched alkyl group having 1 to 20 carbon atoms, such as a methyl group, an ethyl group, a propyl group, an isopropyl group, an n-butyl group, a sec-butyl group, a pentyl group, a hexyl group, a 2-ethylhexyl group, an octyl group, or a dodecyl group, more preferably an alkyl group having 1 to 10 carbon atoms, and still more preferably an alkyl group having 1 to 4 carbon atoms.

The cycloalkyl group of Rx may be monocyclic or polycyclic and is preferably a cycloalkyl group having 3 to 15 carbon atoms, more preferably a cycloalkyl group having 3 to 10 carbon atoms, and still more preferably a cycloalkyl group having 3 to 6 carbon atoms. Specific examples of the cycloalkyl group of Rx include a cyclopropyl group, a cyclobutyl group, a cyclopentyl group, a cyclohexyl group, a cycloheptyl group, a cyclooctyl group, a decahydronaphthyl group, a cyclodecyl group, a 1-adamantyl group, a 2-adamantyl group, a 1-norbornyl group, and a 2-norbornyl group. The cycloalkyl group of Rx is preferably a cyclopropyl group, a cyclopentyl group, or a cyclohexyl group.

The aryl group of Rx may be, for example, an aryl group having 6 to 18 carbon atoms, such as a phenyl group or a naphthyl group, and more preferably an aryl group having 6 to 10 carbon atoms.

The aralkyl group of Rx is preferably an aralkyl group having 6 to 20 carbon atoms, and more preferably an aralkyl group having 7 to 12 carbon atoms. Specific examples of the aralkyl group of Rx include a benzyl group, a phenethyl group, a naphthylmethyl group, and a naphthylethyl group.

The heterocyclic group of Rx is preferably a heterocyclic group having 2 to 20 carbon atoms, and more preferably a heterocyclic group having 2 to 12 carbon atoms. Specific examples of the heterocyclic group of Rx include a triazolyl group, an imidazolyl group, a pyrrolyl group, a pyridyl group, a pyrazyl group, a tetrahydrofuranyl group, a tetrahydropyranyl group, a tetrahydrothiophene group, a piperidyl group, a piperazyl group, a furanyl group, a pyranyl group, and a chromanyl group.

The alkyl group, cycloalkyl group, aryl group, aralkyl group, and heterocyclic group as Rx may further have a substituent.

Specific examples and preferred examples of the substituent, which the alkyl group, cycloalkyl group, aryl group, aralkyl group, and heterocyclic group as Rx may further have, include the same groups as those of the specific examples and preferred examples described above as the substituents which the respective groups represented by $R_{11}$ to $R_{13}$ and L may have.

In the case where there is a plurality of Rx's, the plurality of Rx's may be the same or different.

In the case where there is a plurality of Rx's, the plurality of Rx's may be bonded to each other to form a ring, and the formed ring may have a nitrogen atom, an oxygen atom, or a sulfur atom as a ring member.

Examples of the formed ring include cycloalkane rings such as a cyclopentane ring, a cyclohexane ring, an adamantane ring, a norbornene ring, and a norbomane ring, and hetero rings such as an imidazole ring, a piperidine ring, a tetrahydrothiophene ring, a tetrahydrothiopyran ring, and a dibenzothiophene ring. These rings may have a substituent, and examples of the substituent that may be contained in the ring are the same groups as those of the specific examples and preferred examples described above as the substituents which the respective groups represented by $R_{11}$ to $R_{13}$ and L may have.

In the case where $X^+$ is a sulfur cation, the case where two Rx's are bonded to each other to form a ring may be, for example, a case where any one of the following structures is obtained.

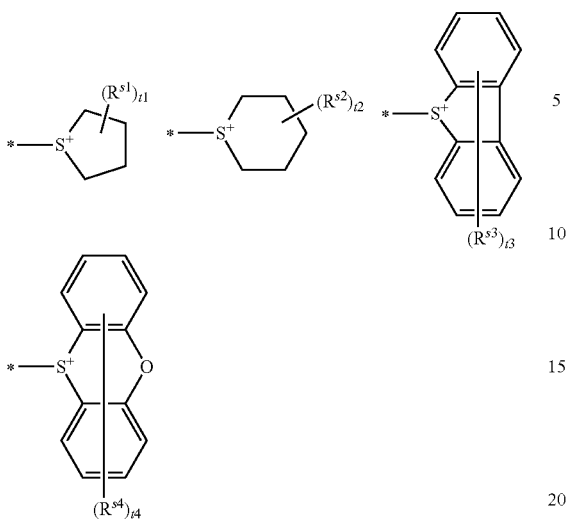

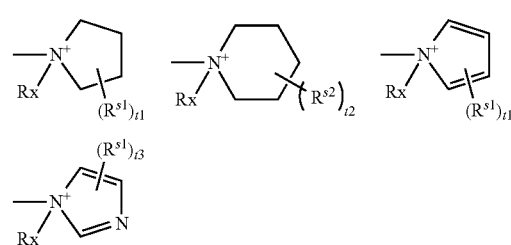

In these formulae,
$R^{S1}$, $R^{S2}$, $R^{S3}$, and $R^{S4}$ each independently represent a hydroxyl group, an alkyl group having 1 to 12 carbon atoms, an alkoxy group (preferably having 1 to 12 carbon atoms), or an alicyclic hydrocarbon group (preferably having 3 to 12 carbon atoms). t1 represents an integer of 0 to 4, t2 represents an integer of 0 to 5, t3 represents an integer of 0 to 8, and t4 represents an integer of 0 to 8, respectively. * represents a bond. Preferred examples of the alkyl group referred to herein include linear or branched alkyl groups having 1 to 20 carbon atoms, such as a methyl group, an ethyl group, a propyl group, an isopropyl group, an n-butyl group, a sec-butyl group, a pentyl group, a hexyl group, a 2-ethylhexyl group, an octyl group, and a dodecyl group; with respect to the alkoxy group, for example, the alkyl group contained in the alkoxy group is preferably the same alkyl group as that mentioned above as the alkyl group; examples of the alicyclic hydrocarbon group include a cycloalkyl group, an aryl group, and an aralkyl group; preferred examples of the cycloalkyl group include monocyclic or polycyclic cycloalkyl groups having 3 to 10 carbon atoms, such as a cyclopropyl group, a cyclobutyl group, a cyclopentyl group, a cyclohexyl group, a cycloheptyl group, a cyclooctyl group, a decahydronaphthyl group, a cyclodecyl group, a 1-adamantyl group, a 2-adamantyl group, a 1-norbornyl group, and a 2-norbornyl group; preferred examples of the aryl group include aryl groups having 6 to 18 carbon atoms, such as a phenyl group and a naphthyl group; and preferred examples of the aralkyl group include aralkyl groups having 6 to 20 carbon atoms, such as a benzyl group, a phenethyl group, a naphthylmethyl group, and a naphthylethyl group. With respect to those having the following structure among the foregoing groups, one or two of the methylene groups constituting the ring may be substituted by oxygen atoms or carbonyl groups.

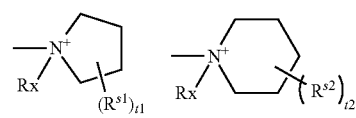

In the case where $X^+$ is a nitrogen cation, the case where two Rx's are bonded to each other to form a ring may be, for example, a case where any one of the following structures is obtained.

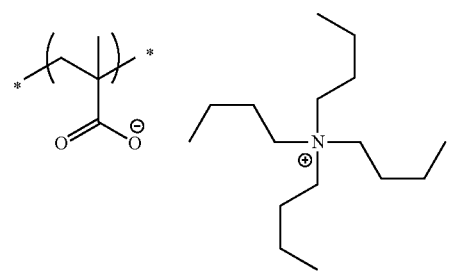

In these formulae, $R^{S1}$ and $R^{S2}$ each independently represent a hydroxyl group, an alkyl group (preferably having 1 to 12 carbon atoms), an alkoxy group (preferably having 1 to 12 carbon atoms), or an alicyclic hydrocarbon group (preferably having 3 to 12 carbon atoms). t1 represents an integer of 0 to 4, t2 represents an integer of 0 to 5, and t3 represents an integer of 0 to 3, respectively. Rx represents an alkyl group, a cycloalkyl group, an aryl group, an aralkyl group, or a heterocyclic group. Specific examples of each of the alkyl group, alkoxy group, and alicyclic hydrocarbon group referred to herein include those already exemplified in the respective ranges of the number of carbon atoms. With respect to those having the following structure among the foregoing groups, one or two of the methylene groups constituting the ring may be substituted by oxygen atoms or carbonyl groups.

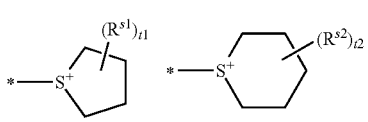

Specific examples of the repeating unit represented by General Formula (1-1) are shown below, but the present invention is not limited thereto.

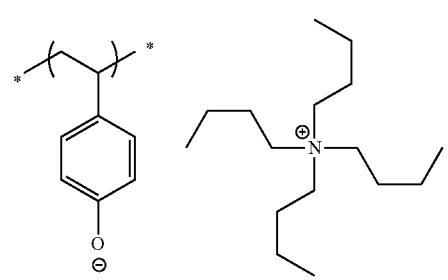

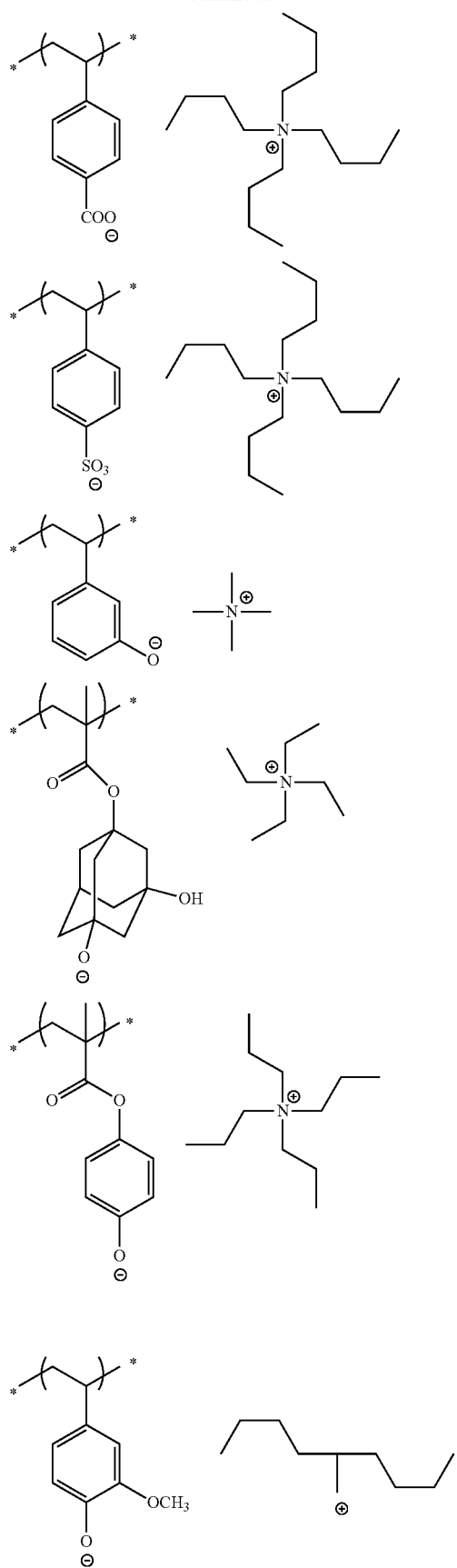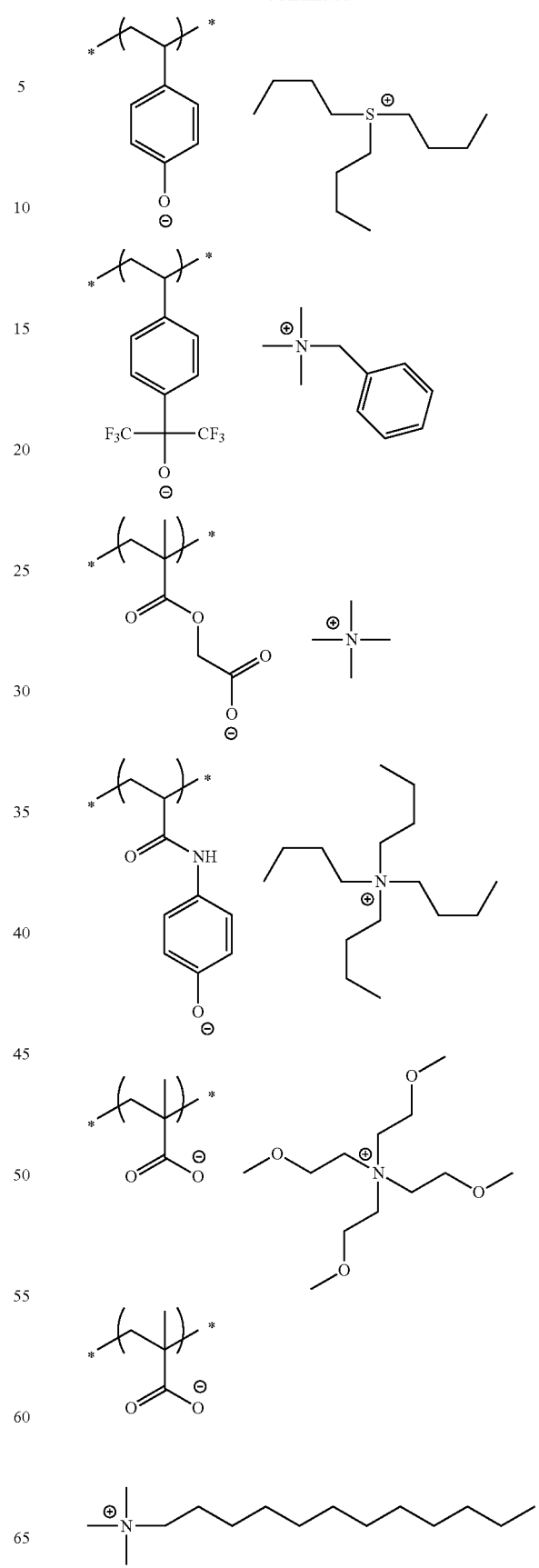

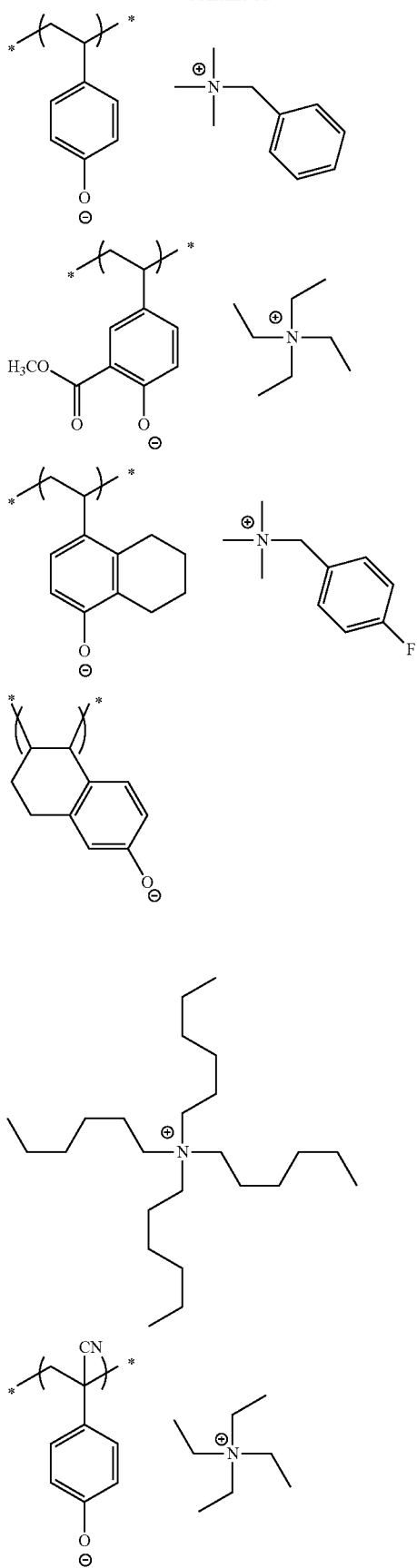
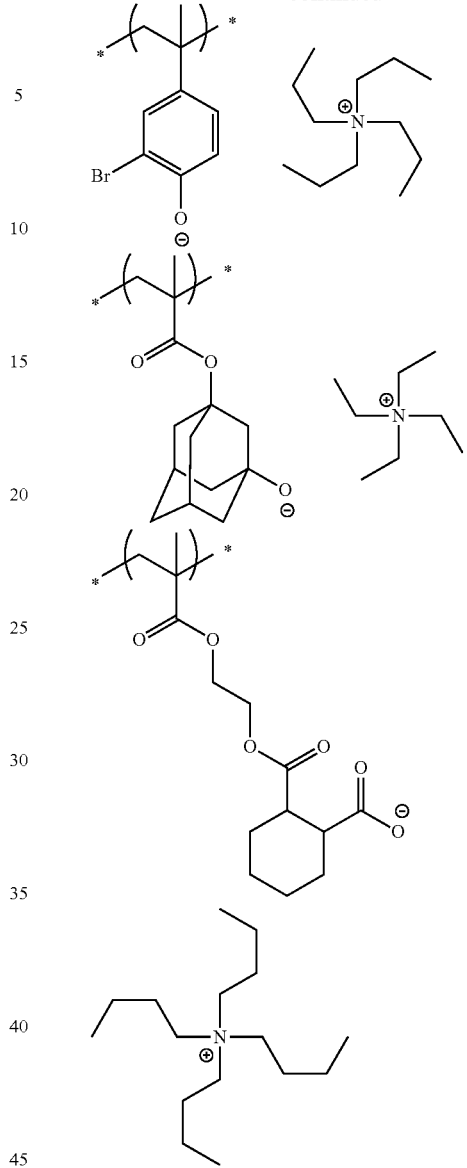

The content of the repeating unit containing a moiety capable of forming a polar interaction in the resin (A) is preferably 5 to 50 mol %, more preferably 5 to 45 mol %, and still more preferably 10 to 40 mol %, with respect to all repeating units of the resin (A). In the case where the content of the repeating unit containing a moiety capable of forming a polar interaction is 5 mol % or more, it is preferable from the viewpoint of pattern film reduction and resolution. In the case where the content of the repeating unit containing a moiety capable of forming a polar interaction is 50 mol % or less, it is preferable from the viewpoint of sensitivity and resolution.

[(A') Resin Having Repeating Unit Having Polar Group]

The actinic ray-sensitive or radiation-sensitive resin composition of the second aspect of the present invention contains (A') a resin having a repeating unit having a polar group (also referred to as a "resin (A')").

Since the polar group of the resin (A') is capable of forming a polar interaction, in the actinic ray-sensitive or radiation-sensitive resin composition containing the resin (A') and the compound (B), the polar group of the resin (A') and the compound (B) form a polar interaction. Then, this polar interaction is released due to the action of an acid or a base generated from the compound (C) upon exposure, which results in a decreased polarity of the resin to increase the solubility thereof in a developer containing an organic solvent, so that a positive tone pattern can be formed.

The acid dissociation constant pKa(A') of the polar group of the resin (A') is preferably 3.0 or more, more preferably 3.5 or more, and still more preferably 4.0 or more. From the viewpoint of sensitivity/resolution, pKa(A') is preferably 3.0 or more.

Here, the acid dissociation constant pKa(A') of the polar group of the resin (A') is measured in the same manner as the acid dissociation constant pKa(A) of the group generated by releasing the polar interaction of the resin (A).

The polar group contained in the resin (A') is not particularly limited as long as it is capable of forming a polar interaction with the compound (B), but it is preferably an acidic or basic group, more preferably a group in which O⁻ in General Formula (1-1) is neutralized with H⁺, and still more preferably a carboxyl group or a hydroxyl group.

The resin (A') preferably has a repeating unit represented by General Formula (1-2).

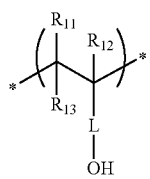

(1-2)

In General Formula (1-2), $R_{11}$ to $R_{13}$ each independently represent a hydrogen atom, an alkyl group, a cycloalkyl group, a halogen atom, a cyano group, or an alkoxycarbonyl group.

L represents a divalent linking group formed of a non-metallic atom.

$R_{13}$ and L may be bonded to each other.

* represents a bond.

In General Formula (1-2), $R_{11}$ to $R_{13}$ and L have the same definitions as those described for General Formula (1-1), and specific examples and preferred ranges of the respective groups are also the same as those in General Formula (1-1).

L in General Formula (1-2) is particularly preferably a carbonyl group or an arylene group. In the case where L represents an arylene group, it is preferably a phenylene group. In the case where L represents an arylene group, the arylene group may have a substituent, and the substituent in the case of having a substituent is preferably a hydroxyl group among the substituents represented by General Formula (1-1).

Specific examples of the repeating unit represented by General Formula (1-2) are shown below, but the present invention is not limited thereto.

In the following specific examples, Rx represents H, $CH_3$, $CH_2OH$, or $CF_3$.

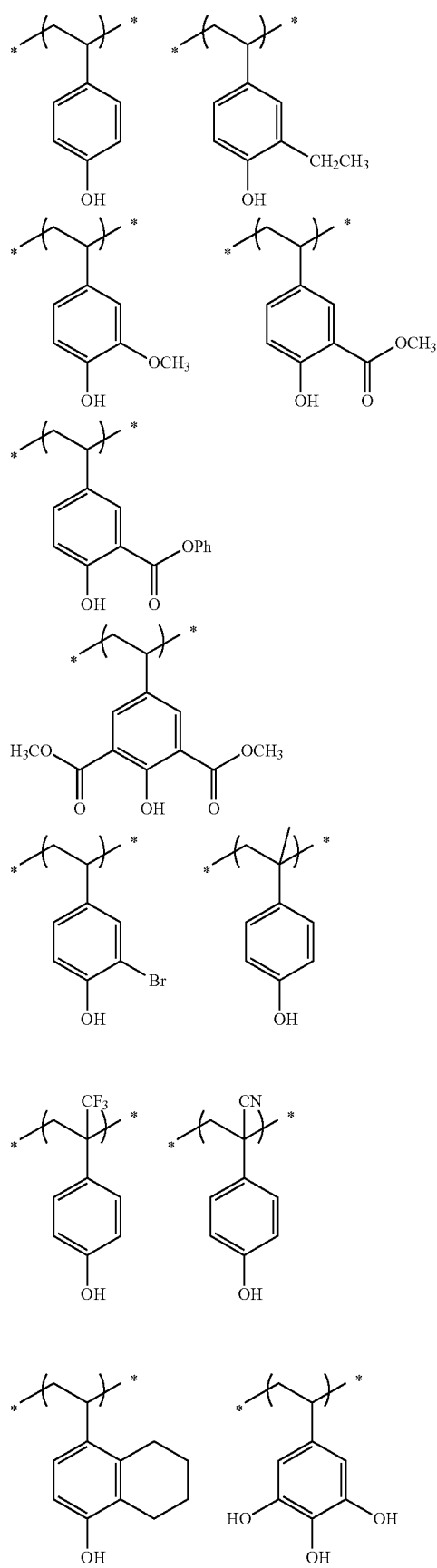

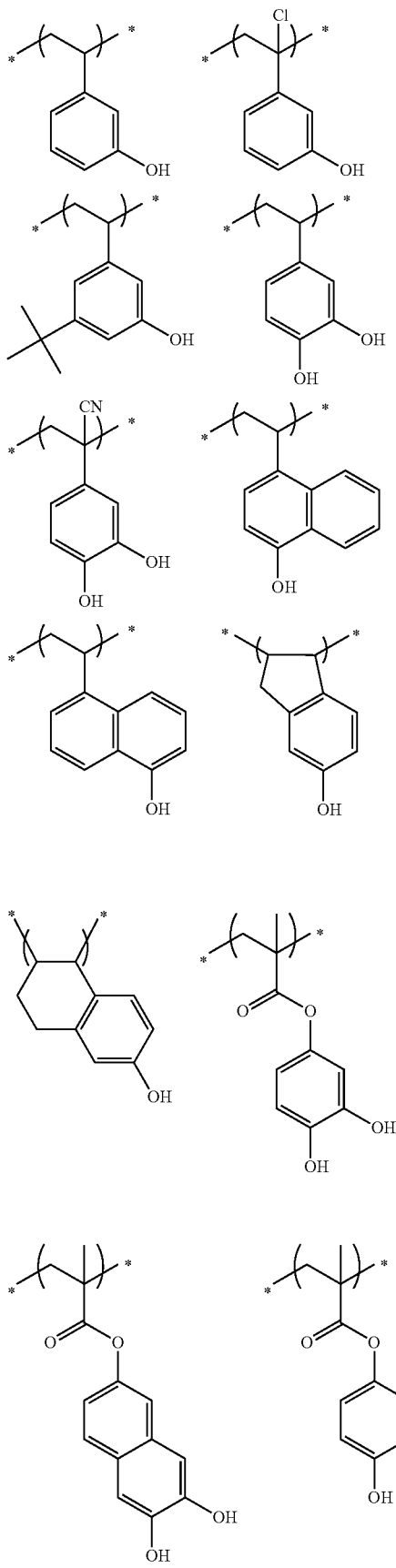
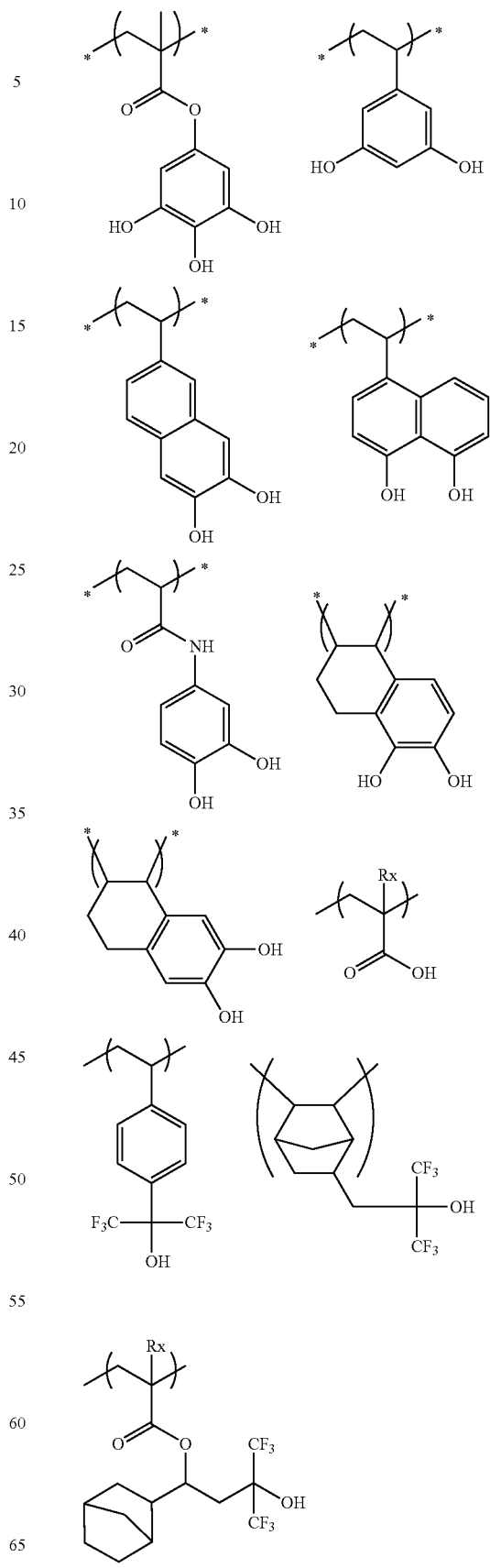

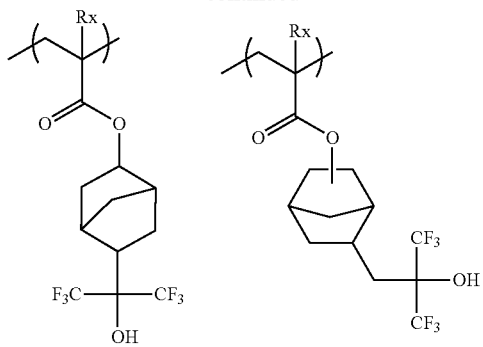
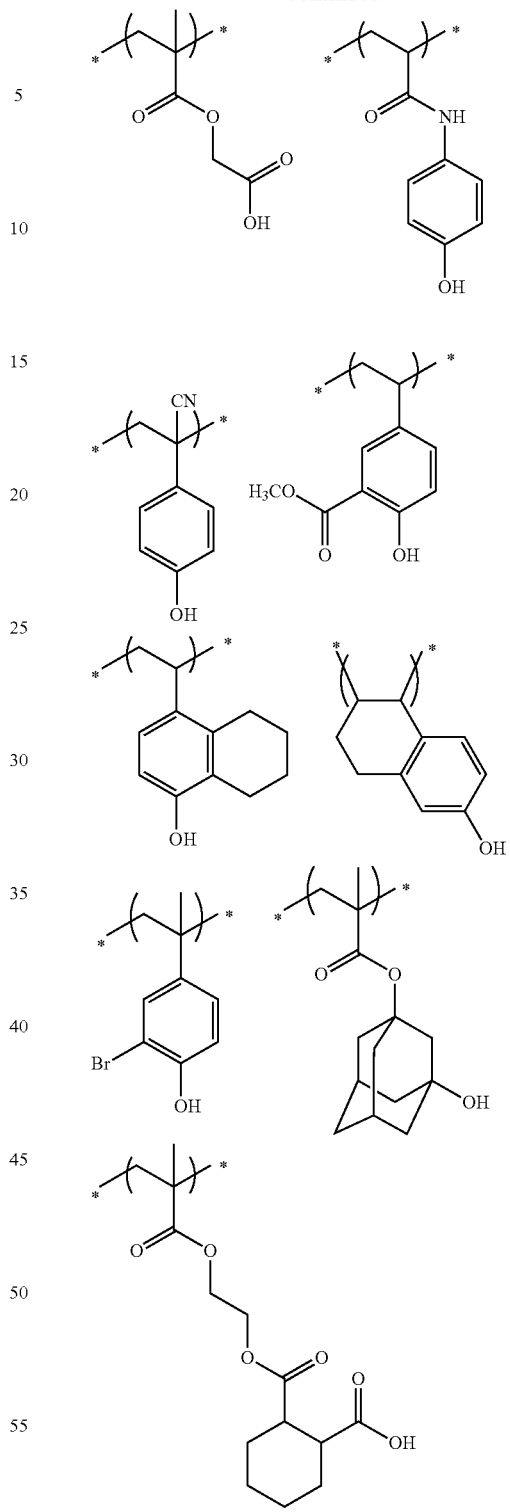

The content of the repeating unit having a polar group in the resin (A') is preferably 5 to 50 mol %, more preferably 5 to 45 mol %, and still more preferably 10 to 40 mol %, with respect to all repeating units of the resin (A'). In the case where the content of the repeating unit having a polar group is 5 mol % or more, it is preferable from the viewpoint of pattern film reduction and resolution. In the case where the content of the repeating unit having a polar group is 50 mol % or less, it is preferable from the viewpoint of sensitivity and resolution.

The resins (A) and (A') may have a repeating unit having at least one of a lactone structure or a sultone structure.

The repeating unit having a lactone structure is more preferably a repeating unit represented by General Formula (AII).

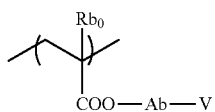
(AII)

In General Formula (AII), $Rb_0$ represents a hydrogen atom, a halogen atom, or an alkyl group (preferably having 1 to 4 carbon atoms) which may have a substituent.

Preferred examples of the substituent, which the alkyl group of $Rb_0$ may have, include a hydroxyl group and a halogen atom. Examples of the halogen atom of $Rb_0$ include a fluorine atom, a chlorine atom, a bromine atom, and an iodine atom. $Rb_0$ is preferably a hydrogen atom, a methyl group, a hydroxymethyl group, or a trifluoromethyl group, and particularly preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combining these groups and bonds. Ab is preferably a single bond or a divalent linking group represented by -$Ab_1$-$CO_2$—.

$Ab_1$ is a linear or branched alkylene group or a monocyclic or polycyclic cycloalkylene group, preferably a methylene group, an ethylene group, a cyclohexylene group, an adamantylene group, or a norbornylene group.

V represents a group having a lactone structure.

As the group having a lactone structure, any group may be used as long as it has a lactone structure, but a group having a 5- to 7-membered ring lactone structure is preferable. It is preferred that the 5- to 7-membered ring lactone structure is condensed with another ring structure in a fashion to form a bicyclo structure or a spiro structure. That is, it is more preferred that the resins (A) and (A') have a repeating unit containing a group having a lactone structure represented by any one of General Formulae (LC1-1) to (LC1-17). The lactone structure may be directly bonded to the main chain of the resin (A) or (A'). Preferred lactone structures are (LC1-1), (LC1-4), (LC1-5), (LC1-6), (LC1-8), (LC1-13), and (LC1-14).

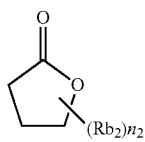
LC1-1

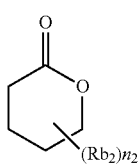
LC1-2

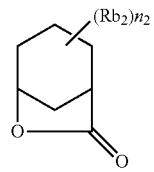
LC1-3

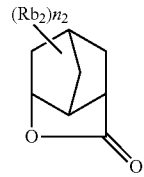
LC1-4

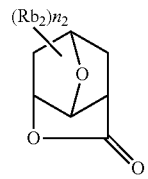
LC1-5

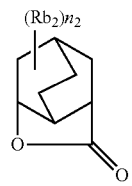
LC1-6

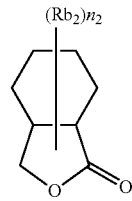
LC1-7

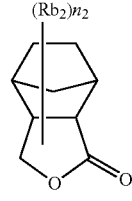
LC1-8

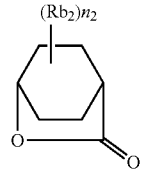
LC1-9

LC1-10

-continued

LC1-11
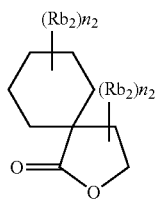

LC1-12
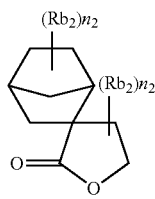

LC1-13
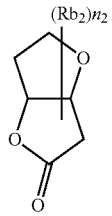

LC1-14
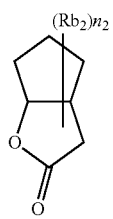

LC1-15
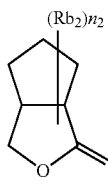

LC1-16
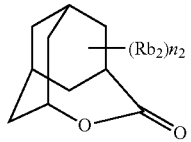

LC1-17
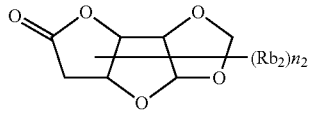

The lactone structure moiety may have or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. The substituent ($Rb_2$) is more preferably an alkyl group having 1 to 4 carbon atoms, a cyano group, or an acid-decomposable group. $n_2$ represents an integer of 0 to 4. In the case where $n_2$ is 2 or more, a plurality of substituents ($Rb_2$'s) may be the same or different or the plurality of substituents ($Rb_2$'s) may be bonded to each other to form a ring.

The repeating unit having a lactone structure usually has optical isomers, any of which may be used. One optical isomer may be used alone or a mixture of a plurality of optical isomers may be used. In the case of mainly using one optical isomer, the optical purity (ee) thereof is preferably 90% or more and more preferably 95% or more.

The resins (A) and (A') may or may not contain a repeating unit having a lactone structure. In the case of containing a repeating unit having a lactone structure, the content of the repeating unit in the resin (A) or (A') is preferably in the range of 1 to 70 mol %, more preferably in the range of 3 to 50 mol %, and still more preferably in the range of 5 to 45 mol %, with respect to all repeating units.

Specific examples of the repeating unit having a lactone structure in the resins (A) and (A') are shown below, but the present invention is not limited thereto. In the formulae, Rx represents H, $CH_3$, $CH_2OH$, or $CF_3$.

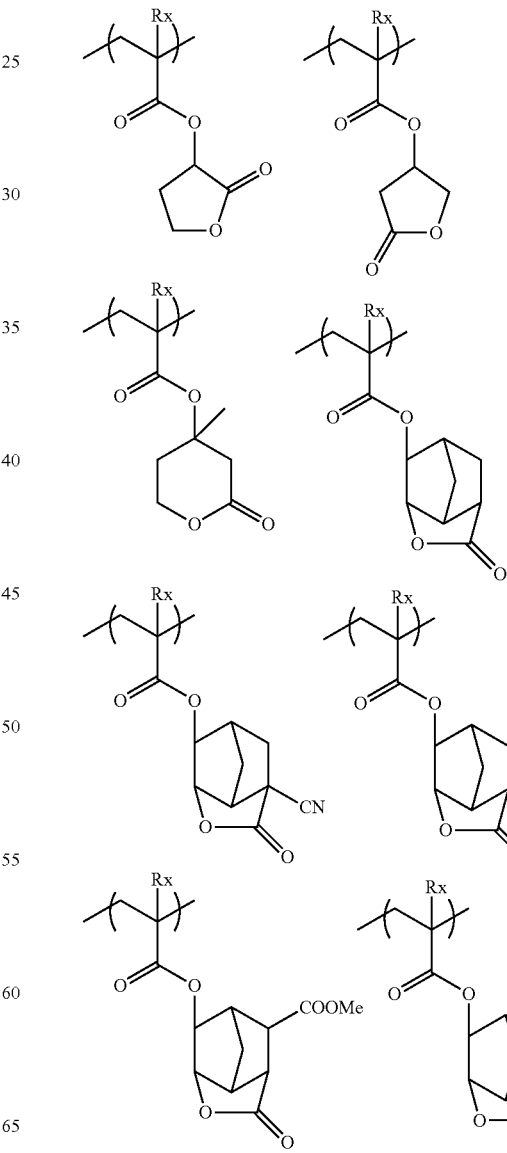

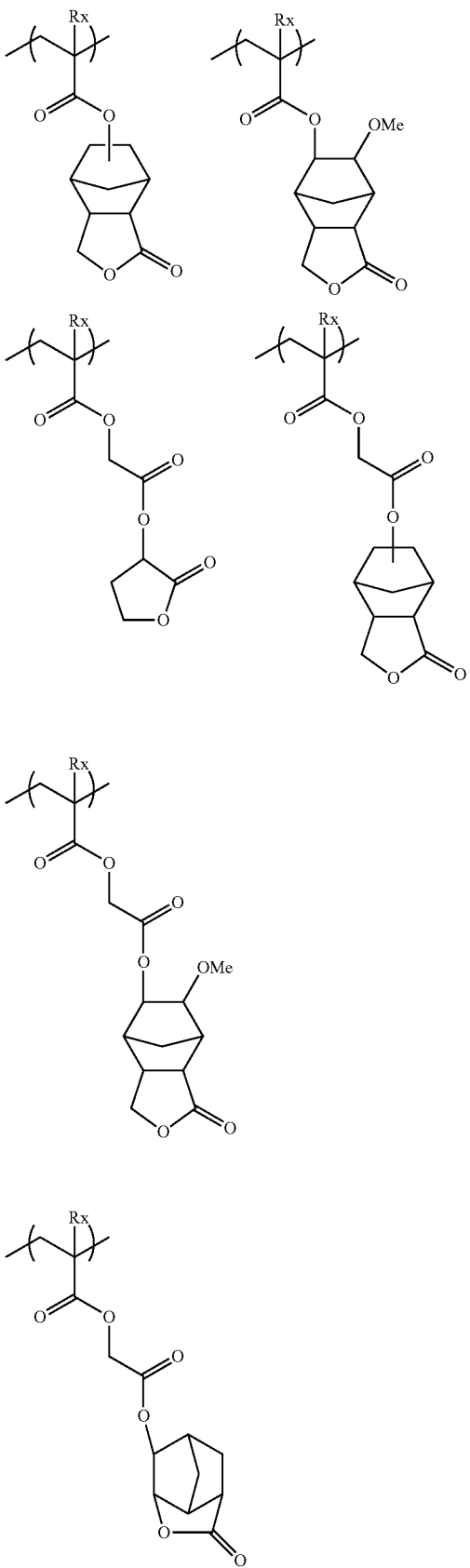

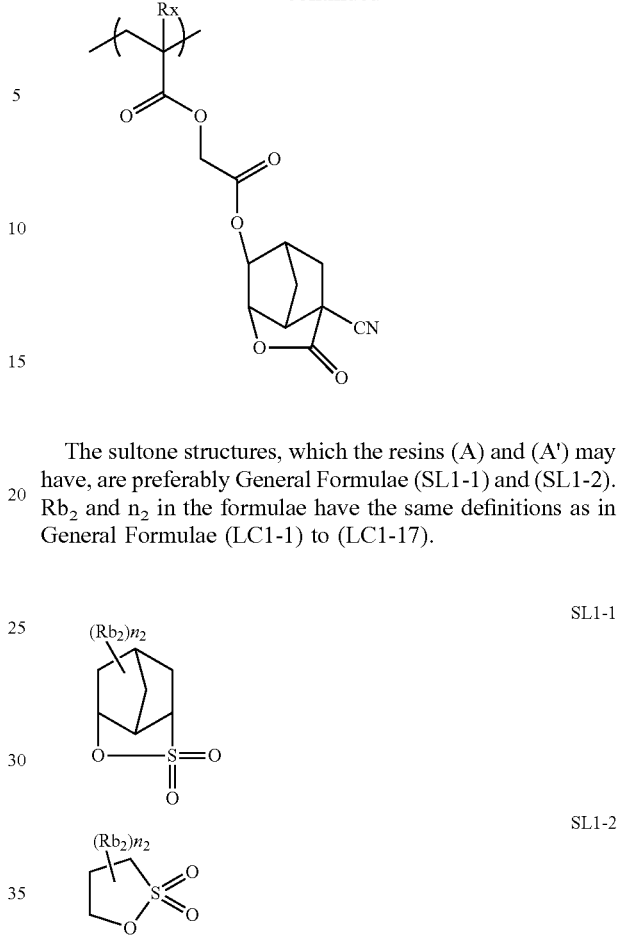

The sultone structures, which the resins (A) and (A') may have, are preferably General Formulae (SL1-1) and (SL1-2). $Rb_2$ and $n_2$ in the formulae have the same definitions as in General Formulae (LC1-1) to (LC1-17).

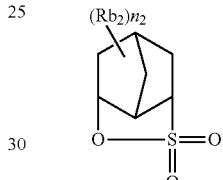

SL1-1

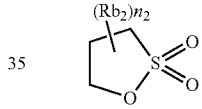

SL1-2

The repeating unit containing a sultone structure, which the resin (A) or (A') may have, is preferably a repeating unit in which a lactone structure in the repeating unit having a lactone structure is substituted with a sultone structure.

It is also preferred that the resins (A) and (A') further have repeating units (hereinafter, also referred to as "other repeating units") as shown below, as a repeating unit other than the above-mentioned repeating unit.

Examples of polymerizable monomers for forming these other repeating units include styrene, alkyl-substituted styrene, alkoxy-substituted styrene, halogen-substituted styrene, O-alkylated styrene, O-acylated styrene, hydrogenated hydroxystyrene, maleic acid anhydride, acrylic acid derivative (acrylic acid, acrylic acid ester, or the like), (meth)acrylic acid derivative (methacrylic acid, methacrylic acid ester, or the like), N-substituted maleimide, acrylonitrile, methacrylonitrile, vinyl naphthalene, vinyl anthracene, and indene which may have a substituent.

The resins (A) and (A') may or may not contain these other repeating units. In the case of being contained, the content of these other repeating units in the resin (A) or (A') is generally 1 to 30 mol %, preferably 1 to 20 mol %, and more preferably 5 to 10 mol %, with respect to all repeating units constituting the resin (A) or (A').

The resins (A) and (A') may contain a repeating unit represented by General Formula (IV) or General Formula (V).

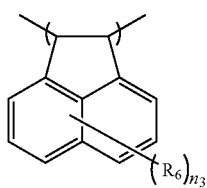
(IV)

In the formula,

R$_6$ represents a hydrogen atom, a hydroxyl group, a linear, branched or cyclic alkyl group, alkoxy group or acyloxy group having 1 to 10 carbon atoms, a cyano group, a nitro group, an amino group, a halogen atom, an ester group (—OCOR or —COOR: R represents an alkyl group or fluorinated alkyl group having 1 to 6 carbon atoms), or a carboxyl group.

n$_3$ represents an integer of 0 to 6.

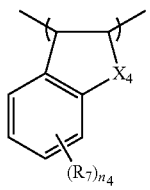
(V)

In the formula,

R$_7$ represents a hydrogen atom, a hydroxyl group, a linear, branched or cyclic alkyl group, alkoxy group or acyloxy group having 1 to 10 carbon atoms, a cyano group, a nitro group, an amino group, a halogen atom, an ester group (—OCOR or —COOR: R represents an alkyl group or fluorinated alkyl group having 1 to 6 carbon atoms), or a carboxyl group.

n$_4$ represents an integer of 0 to 4.

X$_4$ is a methylene group, an oxygen atom, or a sulfur atom.

Specific examples of the repeating unit represented by General Formula (IV) or General Formula (V) are shown below, but the present invention is not limited thereto.

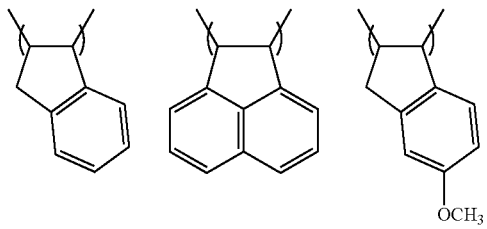

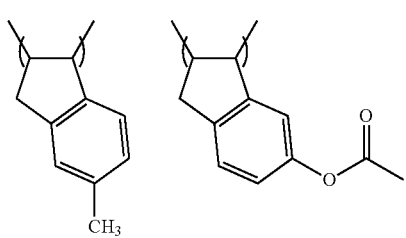

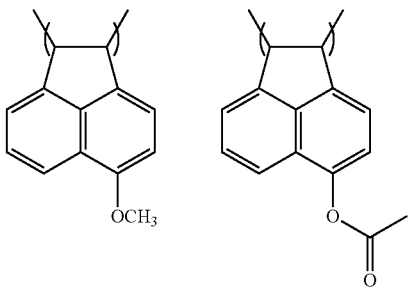

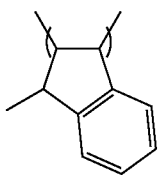

Specific examples of the above-mentioned resin (A) are shown below, but the present invention is not limited thereto.

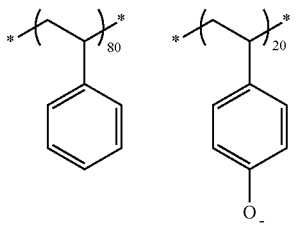

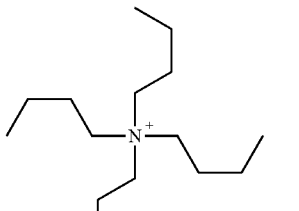

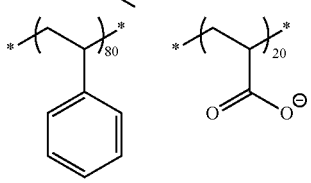

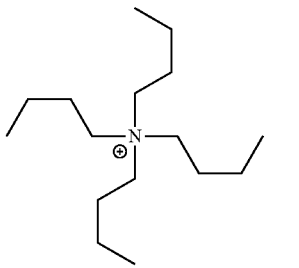

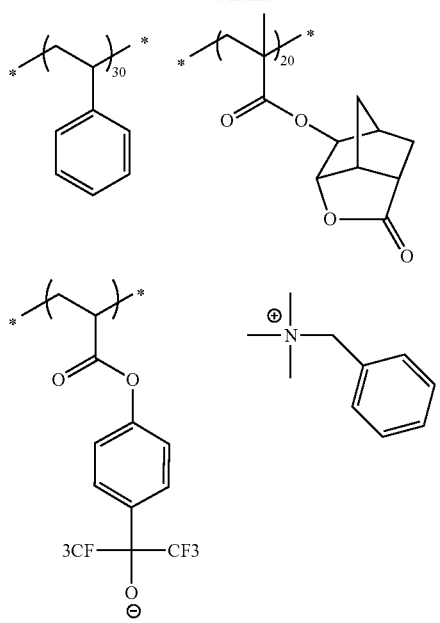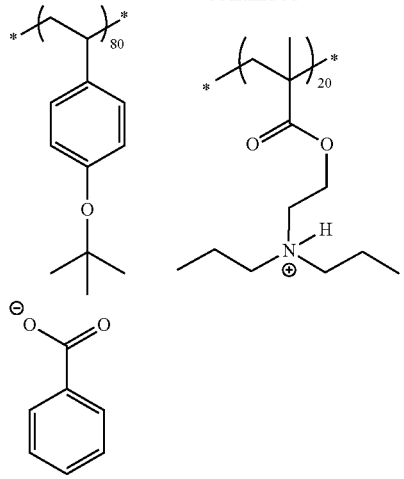
Specific examples of the above-mentioned resin (A') are shown below, but the present invention is not limited thereto.
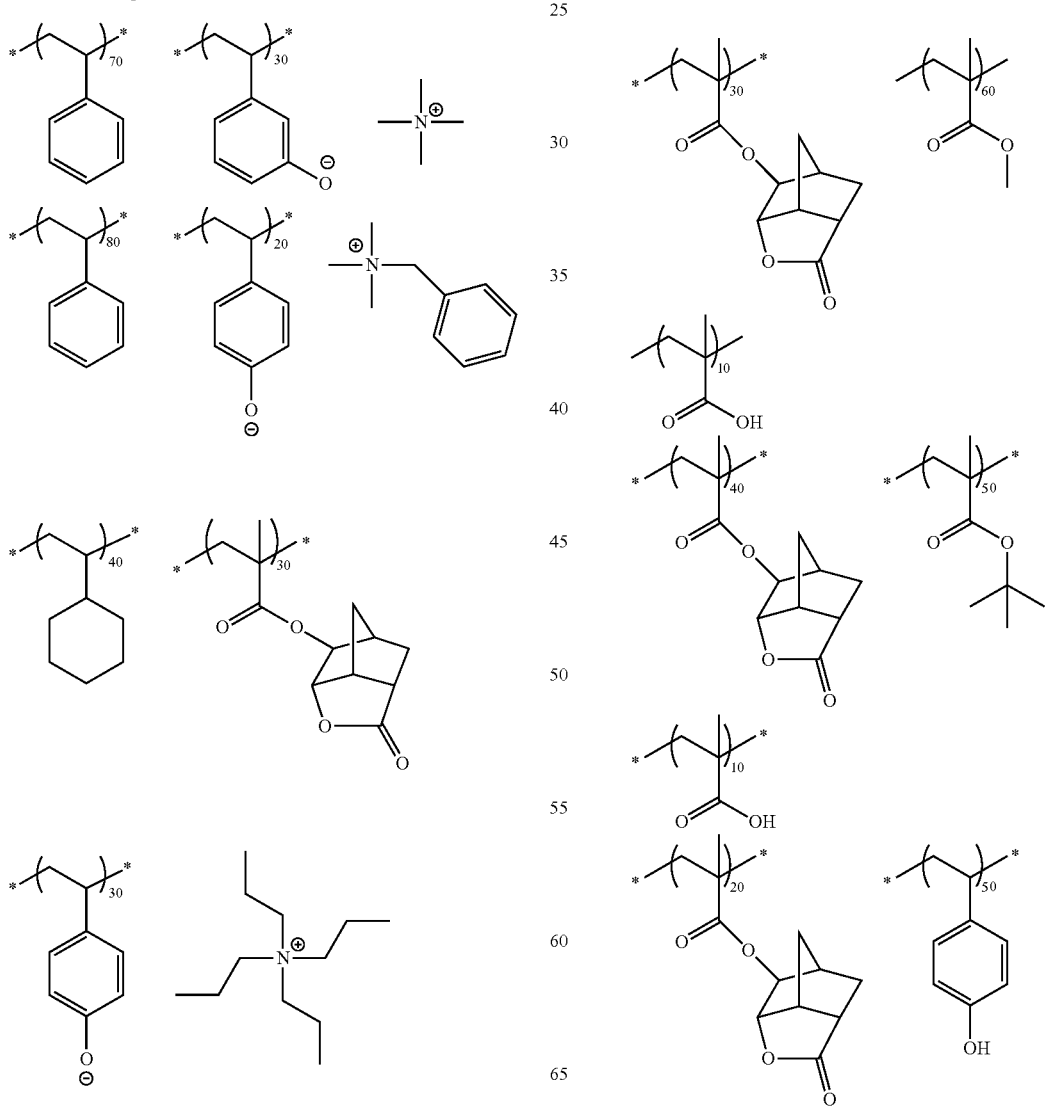

33
-continued
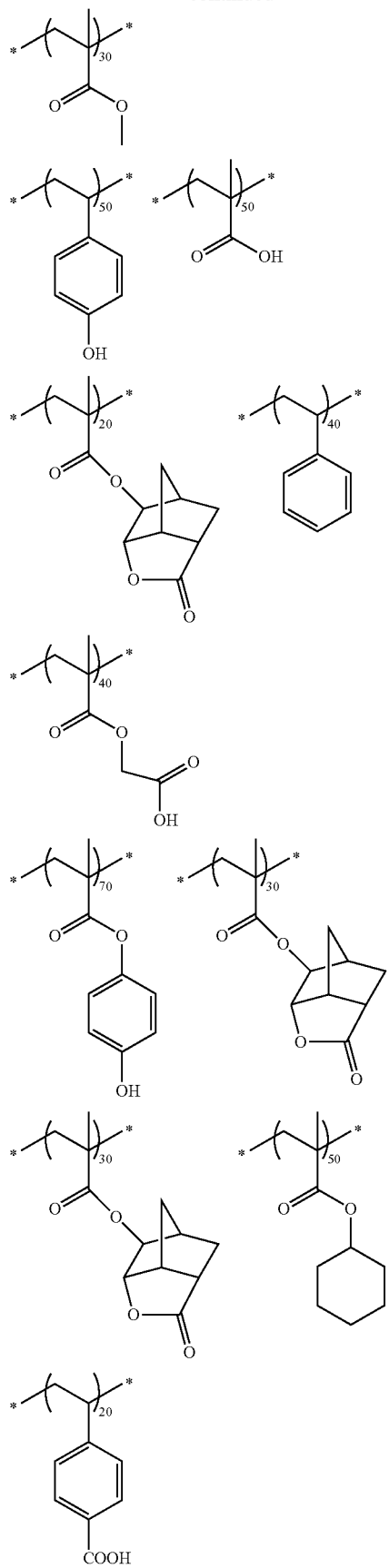
34
-continued
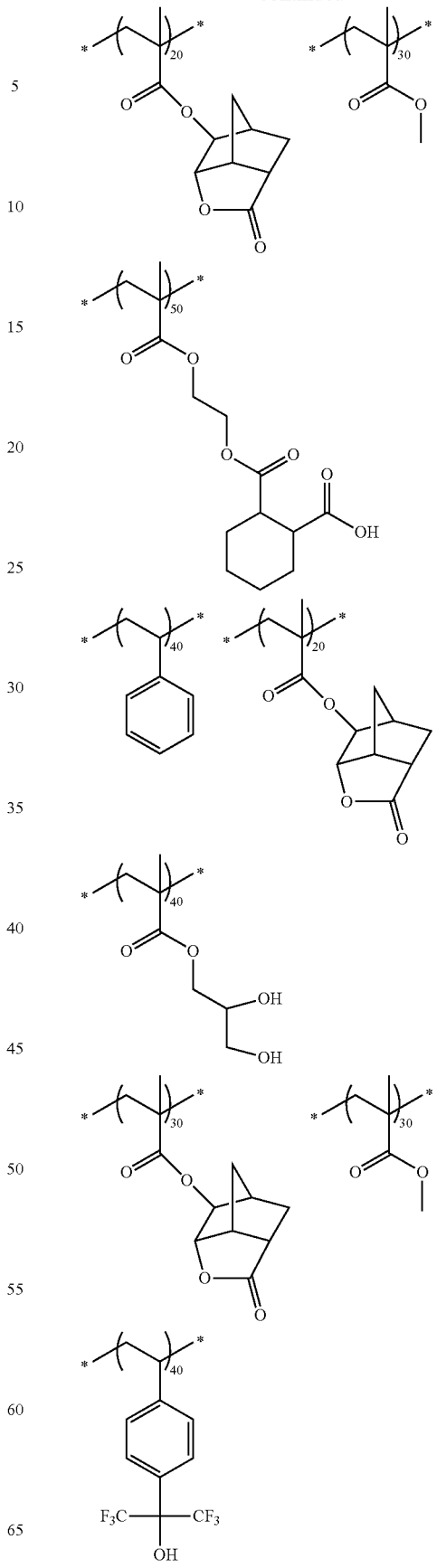

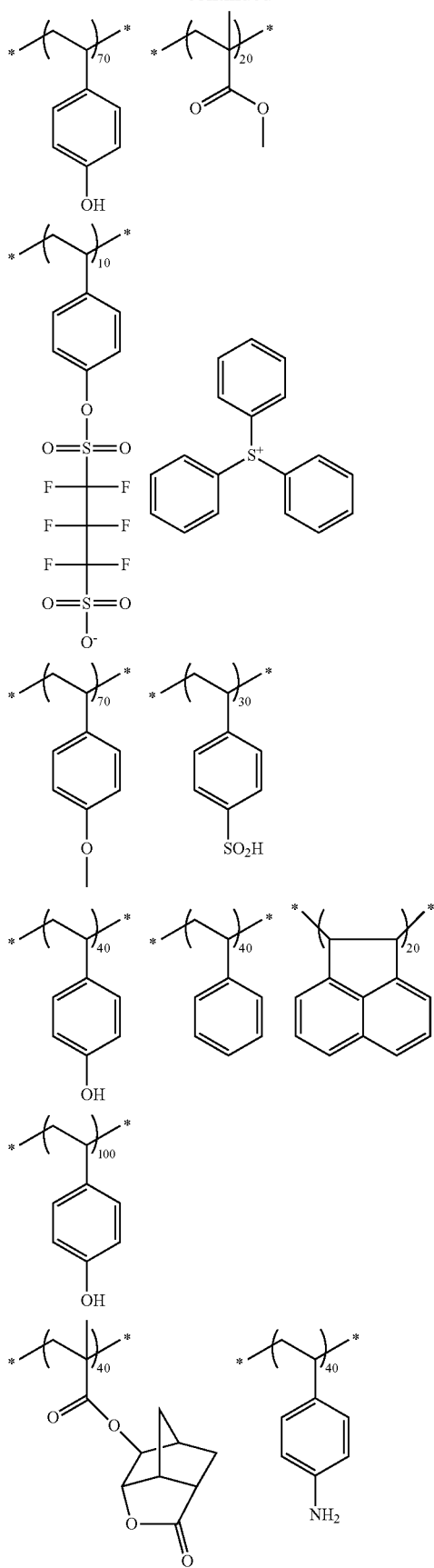
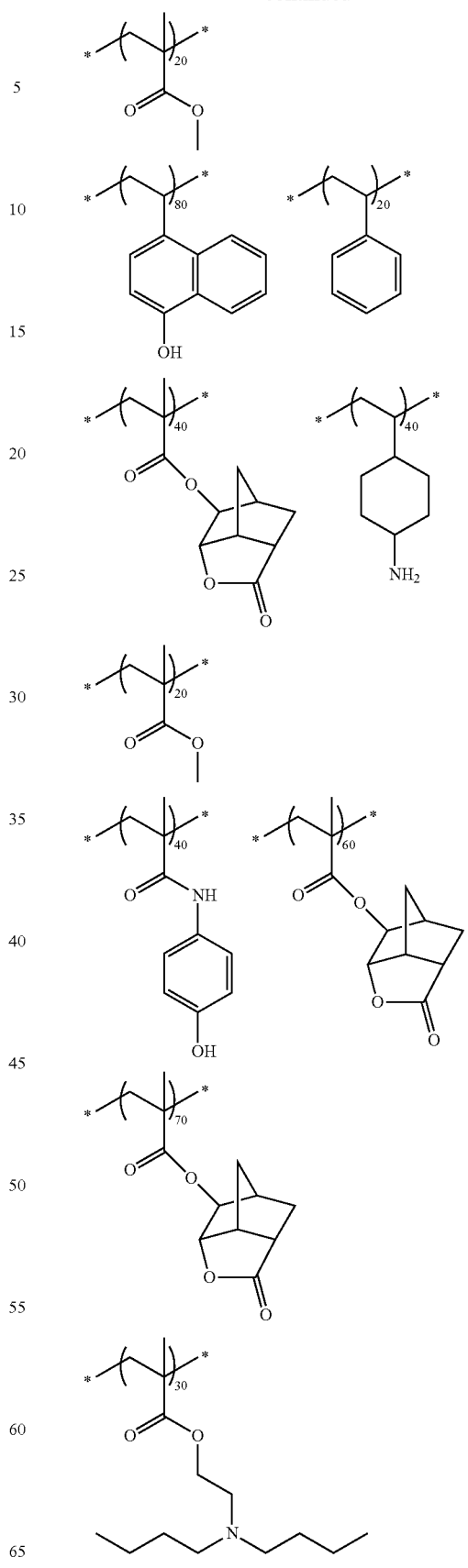

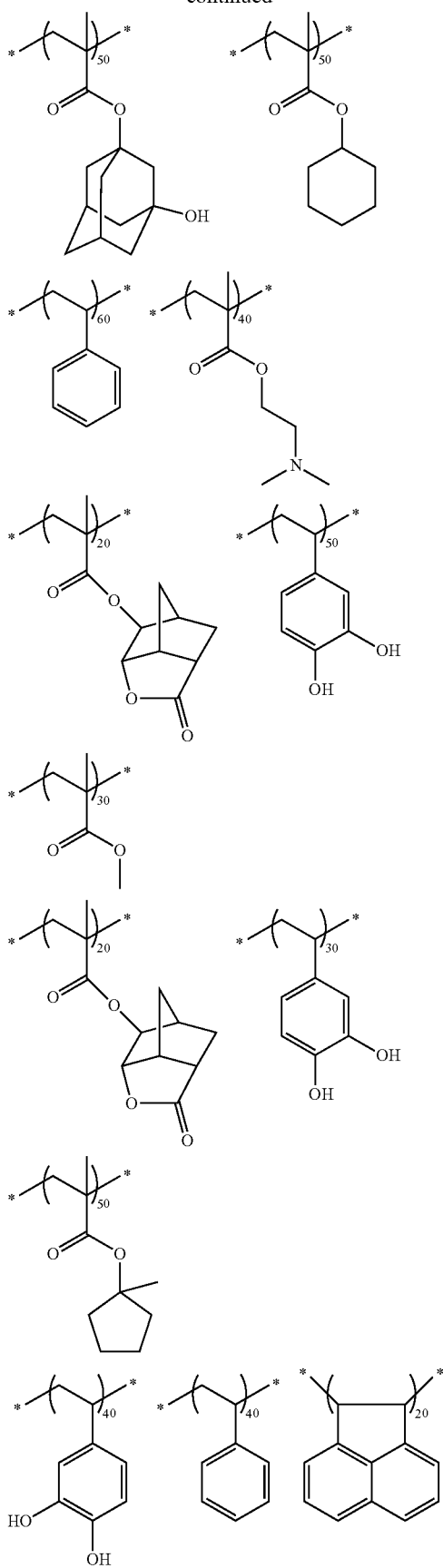
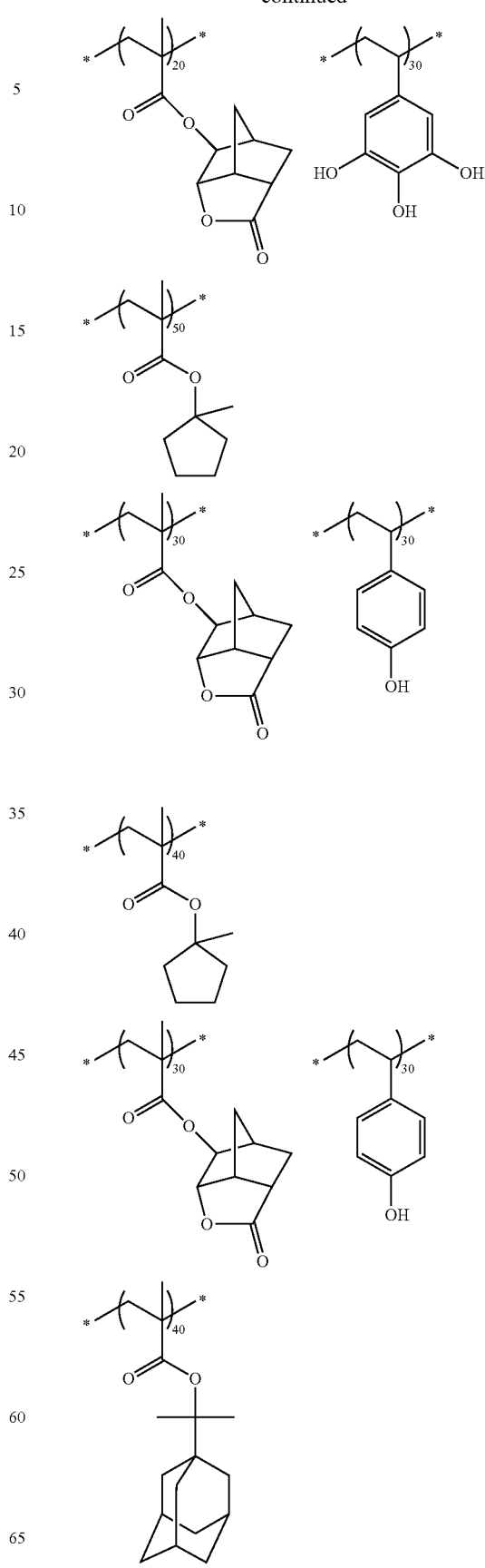

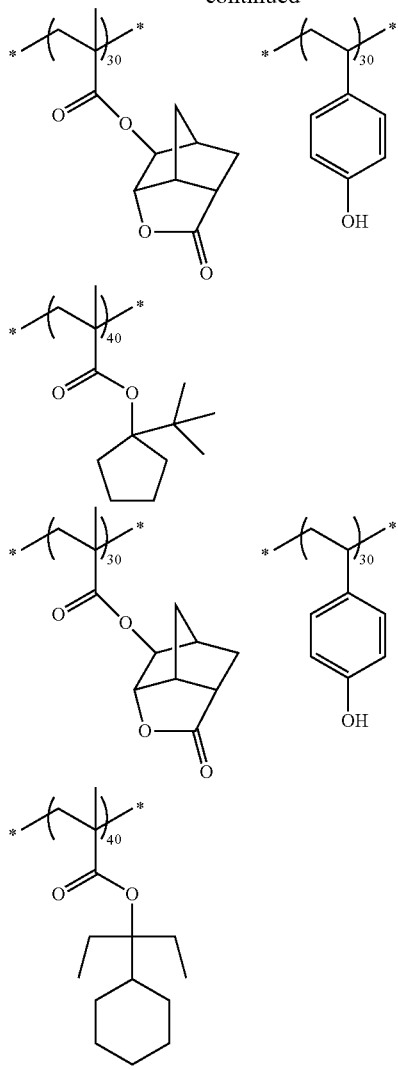

In the resins (A) and (A'), the content molar ratio of individual repeating structural units is appropriately set in order to adjust the dry etching resistance and standard developer aptitude of the resist, adhesiveness to substrate, resist profile, and general required performance of resist, that is, resolution, heat resistance, sensitivity, and the like.

The forms of the resins (A) and (A') may be in any of a random type, a block type, a comb type, and a star type.

The resins (A) and (A') can be synthesized, for example, by radical, cationic, or anionic polymerization of an unsaturated monomer corresponding to each structure. Further, it is also possible to obtain a desired resin by performing polymerization using an unsaturated monomer corresponding to the precursor of each structure, followed by a polymer reaction.

Examples of the general synthesis method include a bulk polymerization method in which polymerization is carried out by dissolving an unsaturated monomer and a polymerization initiator in a solvent and heating the solution, and a dropwise addition polymerization method in which a solution of an unsaturated monomer and a polymerization initiator is added dropwise to a heating solvent over 1 to 10 hours, with the dropwise addition polymerization method being preferable.

Examples of the solvent used in the polymerization include solvents that can be used in preparing an actinic ray-sensitive or radiation-sensitive resin composition to be described later. More preferably, it is preferred to carry out polymerization using the same solvent as the solvent used in the above-mentioned composition. Thus, generation of particles during storage can be suppressed.

The polymerization reaction is preferably carried out under an inert gas atmosphere such as nitrogen or argon. As the polymerization initiator, a commercially available radical initiator (an azo-based initiator, peroxide, or the like) is used to initiate the polymerization. As the radical initiator, an azo-based initiator is preferable, and the azo-based initiator having an ester group, a cyano group, or a carboxyl group is preferable. Preferred examples of the initiator include azobisisobutyronitrile, azobisdimethylvaleronitrile, and dimethyl 2,2'-azobis(2-methyl propionate). Where appropriate, the polymerization may be carried out in the presence of a chain transfer agent (for example, alkyl mercaptan or the like).

The concentration of the reactants is usually 5 to 70 mass %, and preferably 10 to 50 mass %. The reaction temperature is usually 10° C. to 150° C., preferably 30° C. to 120° C., and more preferably 40° C. to 100° C.

The reaction time is usually 1 to 48 hours, preferably 1 to 24 hours, and more preferably 1 to 12 hours.

After the completion of reaction, the reaction product is allowed to cool to room temperature and purified. The purification may be carried out by applying a conventional method such as a liquid-liquid extraction method by washing with water or combining suitable solvents to remove the residual monomer and oligomer components, a purification method in the solution state which includes conducting ultrafiltration to thereby extract and remove only components having a specific molecular weight or less, a re-precipitation method which includes dropwise adding a resin solution to a poor solvent, thus solidifying the resin in the poor solvent and removing the residual monomers and the like, or a purification method in the solid state which includes filtering a resin slurry and washing with a poor solvent. For example, the resin is precipitated as a solid by bringing the reaction solution into contact with a solvent in which the resin is sparingly soluble or insoluble (poor solvent) and which is in a volumetric amount of 10 times or less, preferably 10 to 5 times the volume of the reaction solution.

The solvent used at the operation of precipitation or re-precipitation from the polymer solution (precipitation or re-precipitation solvent) may be sufficient if it is a poor solvent for the polymer, and the solvent used may be appropriately selected according to the kind of the polymer from, for example, a hydrocarbon, a halogenated hydrocarbon, a nitro compound, an ether, a ketone, an ester, a carbonate, an alcohol, a carboxylic acid, water, and a mixed solvent containing the foregoing solvents. Among these, the precipitation or re-precipitation solvent is preferably a solvent containing at least an alcohol (particularly, methanol or the like) or water.

The amount of the precipitation or re-precipitation solvent used may be appropriately selected by taking into account the efficiency, yield, and the like, but it is generally 100 to 10,000 parts by mass, preferably 200 to 2,000 parts by mass, more preferably 300 to 1,000 parts by mass, with respect to 100 parts by mass of the polymer solution.

The temperature during the precipitation or re-precipitation may be appropriately selected by taking into account the efficiency or operability, but the temperature is usually about 0° C. to 50° C., preferably in the vicinity of room temperature (for example, about 20° C. to 35° C.). The precipitation or re-precipitation operation may be carried out using a commonly used mixing vessel such as stirring tank according to a known method such as batch system and continuous system.

The precipitated or re-precipitated polymer is usually subjected to commonly used solid-liquid separation such as filtration or centrifugation, then dried and used. The filtration is carried out using a solvent-resistant filter element preferably under pressure. The drying is carried out under atmospheric pressure or reduced pressure (preferably under reduced pressure) at a temperature of about 30° C. to 100° C. and preferably about 30° C. to 50° C.

Incidentally, after the resin is once precipitated and separated, the resin may be dissolved again in a solvent and then brought into contact with a solvent in which the resin is sparingly soluble or insoluble. That is, there may be used a method including, after the completion of the radical polymerization reaction above, precipitating a resin by bringing the polymer into contact with a solvent in which the polymer is sparingly soluble or insoluble (step a), separating the resin from the solution (step b), dissolving the resin again in a solvent to prepare a resin solution A (step c), precipitating a resin solid by bringing the resin solution A into contact with a solvent in which the resin is sparingly soluble or insoluble and which is in a volumetric amount of less than 10 times (preferably a volumetric amount of 5 times or less) the volume of the resin solution A (step d), and separating the precipitated resin (step e).

The polymerization reaction is preferably carried out under an inert gas atmosphere such as nitrogen or argon. As the polymerization initiator, a commercially available radical initiator (an azo-based initiator, peroxide, or the like) is used to initiate the polymerization. As the radical initiator, an azo-based initiator is preferable, and the azo-based initiator having an ester group, a cyano group, or a carboxyl group is preferable. Preferred examples of the initiator include azobisisobutyronitrile, azobisdimethylvaleronitrile, and dimethyl 2,2'-azobis(2-methyl propionate). The initiator is added or added in portionwise, as desired. After the reaction has been completed, the reaction mixture is poured into a solvent, and then a desired polymer is recovered by a method such as powder or solid recovery. The concentration of the reactants is 5 to 50 mass % and preferably 10 to 30 mass %. The reaction temperature is usually 10° C. to 150° C., preferably 30° C. to 120° C., and more preferably 60° C. to 100° C.

The molecular weight of the resins (A) and (A') in the present invention is not particularly limited, but the weight-average molecular weight is preferably in the range of 1,000 to 100,000, more preferably in the range of 1,500 to 60,000, and particularly preferably in the range of 2,000 to 30,000. By setting the weight-average molecular weight to the range of 1,000 to 100,000, it is possible to prevent deterioration of heat resistance and dry etching resistance and it is also possible to prevent deterioration of developability and deterioration of film formability due to an increase in viscosity.

The dispersity (Mw/Mn) is preferably 1.00 to 5.00, more preferably 1.00 to 3.50, and still more preferably 1.00 to 2.50. A resin having a smaller molecular weight distribution exhibits better resolution and resist shape, and better smoothness in the side wall of a resist pattern and roughness properties.

The resins (A) and (A') may be used alone or in combination of two or more thereof. The content of the resins (A) and (A') is preferably 20 to 99 mass %, more preferably 30 to 99 mass %, and still more preferably 40 to 99 mass %, based on the total solid content in the actinic ray-sensitive or radiation-sensitive resin composition.

[Compound (B) Capable of Forming Polar Interaction with Resin (A')]

The actinic ray-sensitive or radiation-sensitive resin composition according to the second aspect of the present invention is a compound (B) which is capable of forming a polar interaction with the polar group of the resin (A') (also referred to as a "compound (B)"). The compound (B) is preferably a compound having a stronger basicity as compared with phenol. In addition, the basic compound is preferably an organic basic compound, and more preferably a nitrogen-containing basic compound.

The compound (B) is not particularly limited as long as it is capable of forming a polar interaction with the resin (A'), but it is preferably an acidic or basic compound, more preferably an acidic or basic compound having a salt structure having a cation moiety and an anion moiety, and still more preferably an ionic basic compound.

The compound (B) is preferably a compound represented by General Formula (B1).

(B1)

In General Formula (B1), $A^-$ represents an organic acid anion.

$X^+$ represents a nitrogen cation, a sulfur cation, or an iodine cation.

Ry represents a hydrogen atom, an alkyl group, a cycloalkyl group, an aryl group, an aralkyl group, or a heterocyclic group.

Rx represents an alkyl group, a cycloalkyl group, an aryl group, an aralkyl group, or a heterocyclic group. A plurality of Rx's may be the same or different. In addition, the plurality of Rx's may be bonded to each other to form a ring, and the formed ring may have a nitrogen atom, an oxygen atom, or a sulfur atom as a ring member.

n2 represents 4 in the case where $X^+$ is a nitrogen cation, n2 represents 3 in the case where $X^+$ is a sulfur cation, and n2 represents 2 in the case where $X^+$ is an iodine cation.

In General Formula (B1), the conjugate base structure of the organic acid anion $A^-$ is not particularly limited and examples thereof include conjugate base structures such as a carboxylic acid group, a sulfonic acid group, a hydroxyl group, a mercapto group, an imide group, a sulfonamide group, a sulfonimide group, a methylene compound (a malonic acid derivative, an acetoacetic acid derivative, a cyanoacetic acid derivative, a malononitrile derivative, a cyclopentadiene derivative, a bissulfonylmethane derivative, or the like), and a nitrogen-containing aromatic compound (an imidazole derivative, an indole derivative, an isocyanuric acid derivative, or the like), among which a carboxylic acid group or a sulfonic acid group is preferable, and a carboxylic acid group is particularly preferable.

The organic acid anion $A^-$ is not particularly limited, and it is preferably a carboxylate anion or a sulfonate anion and particularly preferably a carboxylate anion.

$X^+$ represents a nitrogen cation, a sulfur cation, or an iodine cation, preferably represents a nitrogen cation or a sulfur cation, and more preferably represents a nitrogen cation.

Rx represents an alkyl group, a cycloalkyl group, an aryl group, an aralkyl group, or a heterocyclic group. From the viewpoint of improving solvent solubility and improving defect performance, at least one of an (n2) number of Rx's preferably has 3 or more carbon atoms, more preferably 5 or more carbon atoms, and still more preferably 6 or more carbon atoms. From the viewpoint of improving resolution, Rx preferably has 10 or less carbon atoms. From the viewpoint of improving LWR, Rx preferably represents an alkyl group.

The alkyl group of Rx may be, for example, preferably a linear or branched alkyl group having 1 to 20 carbon atoms, such as a methyl group, an ethyl group, a propyl group, an isopropyl group, an n-butyl group, a sec-butyl group, a pentyl group, a hexyl group, a 2-ethylhexyl group, an octyl group, or a dodecyl group, more preferably an alkyl group having 5 to 10 carbon atoms, and still more preferably an alkyl group having 6 to 8 carbon atoms.

The cycloalkyl group of Rx may be monocyclic or polycyclic and is preferably a cycloalkyl group having 3 to 15 carbon atoms, more preferably a cycloalkyl group having 3 to 10 carbon atoms, and still more preferably a cycloalkyl group having 3 to 6 carbon atoms. Specific examples of the cycloalkyl group of Rx include a cyclopropyl group, a cyclobutyl group, a cyclopentyl group, a cyclohexyl group, a cycloheptyl group, a cyclooctyl group, a decahydronaphthyl group, a cyclodecyl group, a 1-adamantyl group, a 2-adamantyl group, a 1-norbornyl group, and a 2-norbornyl group. The cycloalkyl group of Rx is preferably a cyclopropyl group, a cyclopentyl group, or a cyclohexyl group.

The aryl group of Rx may be, for example, an aryl group having 6 to 18 carbon atoms, such as a phenyl group or a naphthyl group, and more preferably an aryl group having 6 to 10 carbon atoms.

The aralkyl group of Rx is preferably an aralkyl group having 6 to 20 carbon atoms, and more preferably an aralkyl group having 7 to 12 carbon atoms. Specific examples of the aralkyl group of Rx include a benzyl group, a phenethyl group, a naphthylmethyl group, and a naphthylethyl group.

The heterocyclic group of Rx is preferably a heterocyclic group having 2 to 20 carbon atoms, and more preferably a heterocyclic group having 2 to 12 carbon atoms. Specific examples of the heterocyclic group of Rx include a triazolyl group, an imidazolyl group, a pyrrolyl group, a pyridyl group, a pyrazyl group, a tetrahydrofuranyl group, a tetrahydropyranyl group, a tetrahydrothiophene group, a piperidyl group, a piperazyl group, a furanyl group, a pyranyl group, and a chromanyl group.

The alkyl group, cycloalkyl group, aryl group, aralkyl group, and heterocyclic group as Rx may further have a substituent.

Specific examples and preferred examples of the substituent, which the alkyl group, cycloalkyl group, aryl group, aralkyl group, and heterocyclic group as Rx may further have, include the same groups as those of the specific examples and preferred examples of the substituents described above as the substituents which the respective groups represented by $R_{11}$ to $R_{13}$ and L in General Formula (1-1) may have.

In the case where there is a plurality of Rx's, the plurality of Rx's may be the same or different.

In the case where there is a plurality of Rx's, the plurality of Rx's may be bonded to each other to form a ring, and the formed ring may have a nitrogen atom, an oxygen atom, or a sulfur atom as a ring member.

Examples of the formed ring include a cycloalkane ring such as a cyclopentane ring, a cyclohexane ring, an adamantane ring, a norbornene ring, or a norbornane ring, and a hetero ring such as an imidazole ring, a piperidine ring, a tetrahydrothiophene ring, a tetrahydrothiopyran ring, or a dibenzothiophene ring. These rings may have a substituent, and examples of the substituent which may be contained in the ring include the same groups as those of the specific examples of the substituents described above as the substituents which may be contained in the respective groups represented by $R_{11}$ to $R_{13}$ and L in General Formula (1-1).

In the case where $X^+$ is a sulfur cation, the case where two Rx's are bonded to each other to form a ring may be a case where any one of the following structures is obtained.

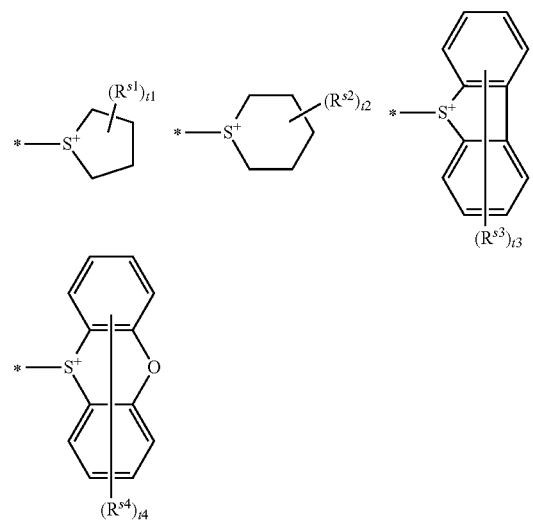

In these formulae, $R^{S1}$, $R^{S2}$, $R^{S3}$, and $R^{S4}$ each independently represent a hydroxyl group, an alkyl group having 1 to 12 carbon atoms, an alkoxy group (preferably having 1 to 12 carbon atoms), or an alicyclic hydrocarbon group (preferably having 3 to 12 carbon atoms). t1 represents an integer of 0 to 4, t2 represents an integer of 0 to 5, t3 represents an integer of 0 to 8, and t4 represents an integer of 0 to 8, respectively. * represents a bond. The alkyl group, alkoxy group, and alicyclic hydrocarbon group referred to herein include those already exemplified in the respective ranges of the number of carbon atoms. With respect to those having the following structure among the foregoing groups, one or two of the methylene groups constituting the ring may be substituted by oxygen atoms or carbonyl groups.

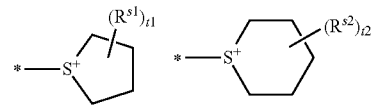

In the case where $X^+$ in General Formula (B1) is a nitrogen cation, the case where two Rx's are bonded to each other to form a ring may be a case where any one of the following structures is obtained.

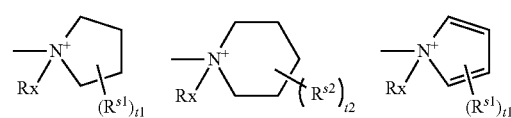

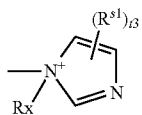

In these formulae, $R^{S1}$ and $R^{S2}$ each independently represent a hydroxyl group, an alkyl group (preferably having 1 to 12 carbon atoms), an alkoxy group (preferably having 1 to 12 carbon atoms), or an alicyclic hydrocarbon group (preferably having 3 to 12 carbon atoms). t1 represents an integer of 0 to 4, t2 represents an integer of 0 to 5, and t3 represents an integer of 0 to 3, respectively. Rx represents an alkyl group, a cycloalkyl group, an aryl group, an aralkyl group, or a heterocyclic group. Specific examples of each of the alkyl group, alkoxy group, and alicyclic hydrocarbon group referred to herein include those already exemplified in the respective ranges of the number of carbon atoms. With respect to those having the following structure among the foregoing groups, one or two of the methylene groups constituting the ring may be substituted by oxygen atoms or carbonyl groups.

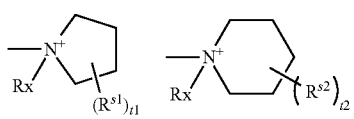

The compound (B) is preferably a tetraalkylammonium salt.

Preferred specific examples of the compound (B) include, but are not limited to, the following compounds.

B-1
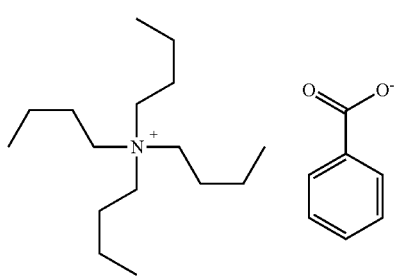

B-2
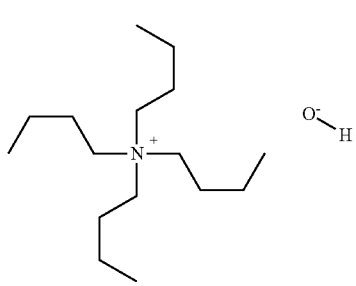

B-3
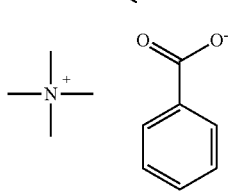

B-4
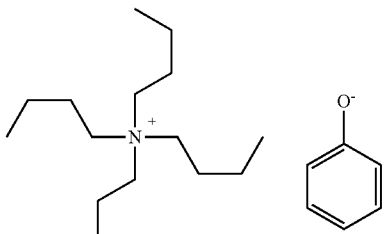

B-5
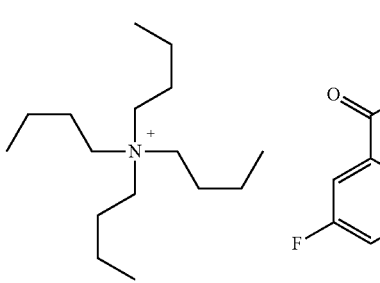

B-6
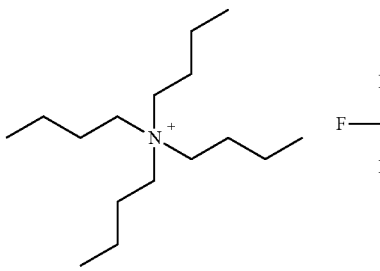

B-7
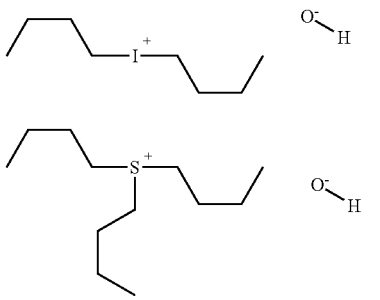

B-8
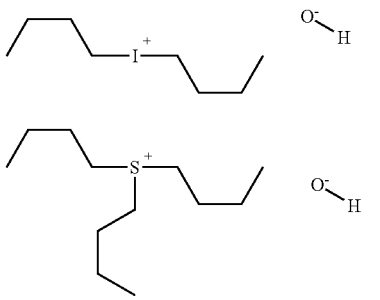

B-9
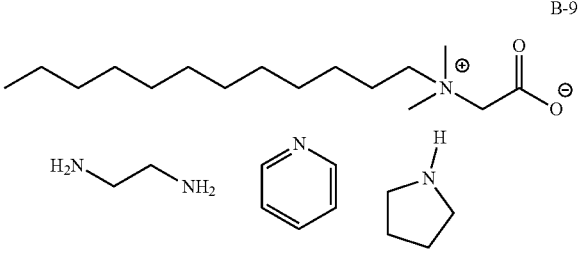

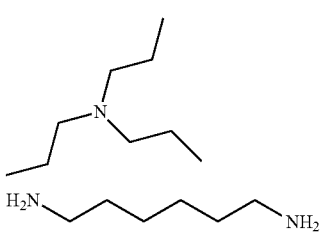

-continued

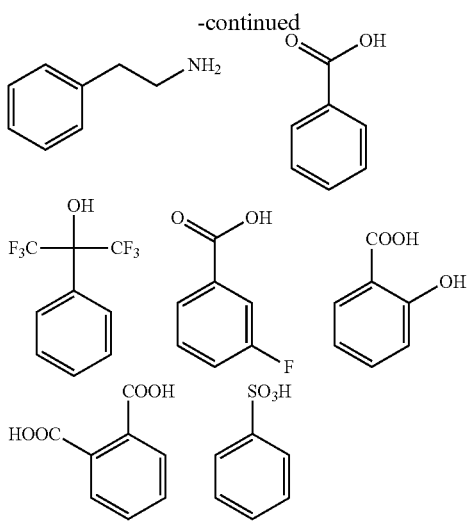

The molecular weight of the compound (B) is usually 100 to 1,500, preferably 150 to 1,300, and more preferably 200 to 1,000.

The compound (B) may be used alone or in combination of two or more thereof.

The content of the compound (B) is preferably 0.01 mass % or more, more preferably 1.0 mass % or more, and particularly preferably 3.0 mass % or more, based on the total solid content of the actinic ray-sensitive or radiation-sensitive resin composition. From the viewpoint of sensitivity and resolution, the content of the compound (B) is preferably 30 mass % or less, more preferably 25 mass % or less, and particularly preferably 20 mass % or less, based on the total solid content of the actinic ray-sensitive or radiation-sensitive resin composition.

The molar ratio of the compound (B) to the photoacid generator is preferably 0.01 to 10, more preferably 0.05 to 8, and still more preferably 0.1 to 5. In the case where this molar ratio is excessively increased, the sensitivity and resolution may decrease. In the case where this molar ratio is excessively decreased, there is a possibility that the pattern film is reduced or the resolution is lowered.

[Compound Capable of Generating Acid or Base by Actinic Rays or Radiation (C)]

The actinic ray-sensitive or radiation-sensitive resin composition preferably contains a compound capable of generating an acid or a base by actinic rays or radiation (C). In particular, the compound (C) is preferably a compound capable of generating an acid upon irradiation with actinic rays or radiation (also referred to as a "photoacid generator (PAG)").

The compound (C) may be in the form of a low molecular weight compound or may be incorporated into a part of a polymer. In addition, a form of a low molecular weight compound and a form incorporated into a part of a polymer may be used in combination.

In the case where the compound (C) is in the form of a low molecular weight compound, the molecular weight thereof is preferably 3,000 or less, more preferably 2,000 or less, and still more preferably 1,000 or less.

In the case where the compound (C) is in the form incorporated into a part of a polymer, the photoacid generator may be incorporated into a part of the resins (A) and (A') or incorporated in a resin different from the resins (A) and (A').

In the present invention, it is preferred that the compound (C) is in the form of a low molecular weight compound.

<Photoacid Generator>

The case where the compound (C) is a photoacid generator will be described.

The photoacid generator is not particularly limited as long as it is a known photoacid generator, but the photoacid generator is preferably a compound that generates an organic acid, for example, at least one of sulfonic acid, bis(alkylsulfonyl)imide, or tris(alkylsulfonyl)methide by irradiation with actinic rays or radiation, preferably electron beams or extreme ultraviolet rays.

More preferred are compounds represented by General Formulae (ZI), (ZII), and (ZIII).

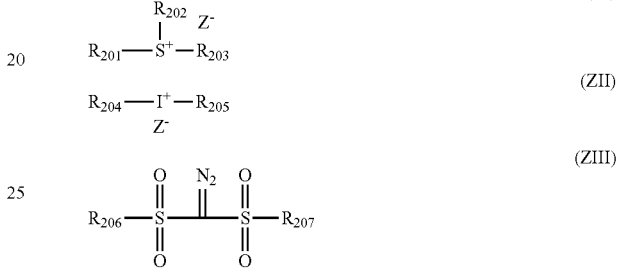

In General Formula (ZI), (ZII), and (ZIII), $R_{201}$ to $R_{207}$ each independently represent an organic group.

The number of carbon atoms in the organic group as $R_{201}$ to $R_{207}$ is generally 1 to 30 and preferably 1 to 20.

Two of $R_{201}$ to $R_{203}$ may be bonded to form a ring structure, and the ring may contain an oxygen atom, a sulfur atom, an ester bond, an amido bond, or a carbonyl group. The group formed by bonding of two of $R_{201}$ to $R_{203}$ may be, for example, an alkylene group (for example, a butylene group or a pentylene group).

$Z^-$ represents a non-nucleophilic anion (anion having a markedly low ability to cause a nucleophilic reaction).

Examples of the non-nucleophilic anion represented by $Z^-$ in General Formulae (ZI) and (ZII) include a sulfonate anion (an aliphatic sulfonate anion, an aromatic sulfonate anion, a camphorsulfonate anion, or the like), a carboxylate anion (an aliphatic carboxylate anion, an aromatic carboxylate anion, an aralkyl carboxylate anion, or the like), a sulfonylimide anion, a bis(alkylsulfonyl)imide anion, and a tris(alkylsulfonyl)methide anion.

The aliphatic moiety in the aliphatic sulfonate anion and aliphatic carboxylate anion may be an alkyl group or a cycloalkyl group, and is preferably, for example, a linear or branched alkyl group having 1 to 30 carbon atoms and a cycloalkyl group having 3 to 30 carbon atoms.

The aromatic group in the aromatic sulfonate anion and aromatic carboxylate anion is preferably an aryl group having 6 to 14 carbon atoms, and examples thereof may include a phenyl group, a tolyl group, and a naphthyl group.

The alkyl group, cycloalkyl group, and aryl group may have a substituent. Examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). For the aryl group and ring structure in the respective groups, an alkyl group (preferably having 1 to 15 carbon atoms) may be further exemplified as a substituent.

The aralkyl group in the aralkyl carboxylate anion is preferably an aralkyl group having 7 to 12 carbon atoms, and examples thereof may include a benzyl group, a phenethyl group, a naphthylmethyl group, a naphthylethyl group, and a naphthylbutyl group.

The sulfonylimide anion may be, for example, a saccharin anion.

The alkyl group in the bis(alkylsulfonyl)imide anion and tris(alkylsulfonyl)methide anion is preferably an alkyl group having 1 to 5 carbon atoms. Examples of the substituent for these alkyl groups include a halogen atom, an alkyl group substituted with a halogen atom, an alkoxy group, an alkylthio group, an alkyloxysulfonyl group, an aryloxysulfonyl group, and a cycloalkylaryloxysulfonyl group. Preferred is a fluorine atom or an alkyl group substituted with a fluorine atom.

Moreover, alkyl groups in the bis(alkylsulfonyl)imide anion may be bonded to each other to form a cyclic structure. This increases the acid strength.

Examples of the other non-nucleophilic anion may include fluorinated phosphorus (for example, $PF_6^-$), fluorinated boron (for example, $BF_4^-$), and fluorinated antimony (for example, $SbF_6^-$).

The non-nucleophilic anion is preferably an aliphatic sulfonate anion in which at least α-position of sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoro aliphatic sulfonate anion (still more preferably, having 4 to 8 carbon atoms), or a benzenesulfonate anion having a fluorine atom, and still more preferably a nonafluorobutanesulfonate anion, a perfluorooctanesulfonate anion, a pentafluorobenzenesulfonate anion, or a 3,5-bis(trifluoromethyl)benzenesulfonate anion.

From the viewpoint of sensitivity and resolution, the acid dissociation constant pKa(C) of the acid generated upon exposure of the compound (C) is preferably less than 3.0 for improving sensitivity, and more preferably −1.0 or less.

The PKa(C) is calculated by ACD/LABs pKa DB (Version 8.0) (Fujitsu Limited) for the compound (C) which has become an acid or a base.

Further, with respect to the non-nucleophilic anion, an anion represented by General Formula (AN1) can also be mentioned as a preferred embodiment.

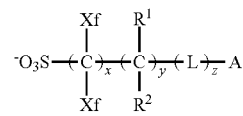
(AN1)

In the formula,

Xf's each independently represent a fluorine atom or an alkyl group substituted with at least one fluorine atom.

$R^1$ and $R^2$ each independently represent a hydrogen atom, a fluorine atom, or an alkyl group; and in the case where there is a plurality of $R^1$'s and $R^2$'s, they may be respectively the same or different from each other.

L represents a divalent linking group, and in the case where there is a plurality of L's, they may be the same or different from each other.

A represents a cyclic organic group.

x represents an integer of 1 to 20, y represents an integer of 0 to 10, and z represents an integer of 0 to 10.

General Formula (AN1) will be described in more detail.

The alkyl group in the alkyl group substituted with a fluorine atom of Xf preferably has 1 to 10 carbon atoms and more preferably 1 to 4 carbon atoms. The alkyl group substituted with a fluorine atom of Xf is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$, among which a fluorine atom or $CF_3$ is preferable. In particular, both of Xf's are preferably a fluorine atom.

The alkyl group of $R^1$ and $R^2$ may have a substituent (preferably a fluorine atom) and preferably has 1 to 4 carbon atoms. More preferred is a perfluoroalkyl group having 1 to 4 carbon atoms. Specific examples of the alkyl group having a substituent as $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, among which $CF_3$ is preferable.

$R^1$ and $R^2$ are preferably a fluorine atom or $CF_3$.

x is preferably 1 to 10 and more preferably 1 to 5.

y is preferably 0 to 4 and more preferably 0.

z is preferably 0 to 5 and more preferably 0 to 3.

The divalent linking group of L is not particularly limited, and examples thereof include —COO—, —OCO—, —CO—, —O—, —S—, —SO—, —SO$_2$—, an alkylene group, a cycloalkylene group, an alkenylene group, or a linking group formed by connecting a plurality of these groups. A linking group having a total number of carbon atoms of 12 or less is preferable. Among these, COO—, —OCO—, —CO—, or —O— is preferred, and —COO— or —OCO— is more preferable.

The cyclic organic group of A is not particularly limited as long as it has a cyclic structure, and examples thereof include an alicyclic group, an aryl group, and a heterocyclic group (including not only those having aromaticity but also those having no aromaticity).

The alicyclic group may be monocyclic or polycyclic and is preferably a monocyclic cycloalkyl group such as a cyclopentyl group, a cyclohexyl group, or a cyclooctyl group; or a polycyclic cycloalkyl group such as a norbornyl group, a tricyclodecanyl group, a tetracyclodecanyl group, a tetracyclododecanyl group, or an adamantyl group. Among them, an alicyclic group with a bulky structure having 7 or more carbon atoms such as a norbornyl group, a tricyclodecanyl group, a tetracyclodecanyl group, a tetracyclododecanyl group, or an adamantyl group is preferred from the viewpoint of inhibiting diffusivity into the film during the post exposure bake (PEB) step and improving MEEF.

Examples of the aryl group include a benzene ring, a naphthalene ring, a phenanthrene ring, and an anthracene ring.

Examples of the heterocyclic group include those derived from a furan ring, a thiophene ring, a benzofuran ring, a benzothiophene ring, a dibenzofuran ring, a dibenzothiophene ring, and a pyridine ring. Among them, those derived from a furan ring, a thiophene ring, and a pyridine ring are preferable.

A lactone structure can also be mentioned as the cyclic organic group, and specific examples thereof include lactone structures represented by General Formulae (LC1-1) to (LC1-17).

The cyclic organic group may have a substituent. Examples of the substituent may include an alkyl group (which may be linear, cyclic or branched, and which preferably has 1 to 12 carbon atoms), a cycloalkyl group (which may be monocyclic, polycyclic, or spirocyclic, and which preferably has 3 to 20 carbon atoms), an aryl group (preferably having 6 to 14 carbon atoms), a hydroxyl group, an alkoxy group, an ester group, an amido group, a urethane group, an ureido group, a thioether group, a sulfonamido group, and a sulfonic acid ester group. Incidentally, the carbon constituting the cyclic organic group (the carbon contributing to the ring formation) may also be a carbonyl carbon.

Examples of the organic group of $R_{201}$ to $R_{207}$ include an aryl group, an alkyl group, and a cycloalkyl group.

It is preferred that at least one of $R_{201}$, $R_{202}$, or $R_{203}$, $R_{204}$ or $R_{205}$, or $R_{206}$ or $R_{207}$ is an aryl group, and it is more preferred that all of $R_{201}$ to $R_{207}$ are aryl groups. Besides a phenyl group, a naphthyl group, or the like, a heteroaryl group such as an indole residue or a pyrrole residue is also possible as the aryl group. Preferred examples of the alkyl group and cycloalkyl group of $R_{201}$ to $R_{207}$ include a linear or branched alkyl group having 1 to 10 carbon atoms and a cycloalkyl group having 3 to 10 carbon atoms. More preferred examples of the alkyl group include a methyl group, an ethyl group, an n-propyl group, an i-propyl group, and an n-butyl group. The cycloalkyl group is more preferably a cyclopropyl group, a cyclobutyl group, a cyclopentyl group, a cyclohexyl group, a cycloheptyl group, or the like. These groups may further have a substituent. Examples of the substituent include, but are not limited to, a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

Preferred examples of the anion represented by General Formula (AN1) include the following anions. In the following examples, A represents a cyclic organic group.

$SO_3$—$CF_2$—$CH_2$—OCO-A, $SO_3$—$CF_2$—CHF—$CH_2$—OCO-A, $SO_3$—$CF_2$—OCO-A, $SO_3$—$CF_2$—$CF_2$—$CH_2$-A, $SO_3$—$CF_2$—CH($CF_3$)—OCO-A

In the case where two of $R_{201}$ to $R_{203}$ are bonded to each other to form a ring structure, preferred is a structure represented by General Formula (A1).

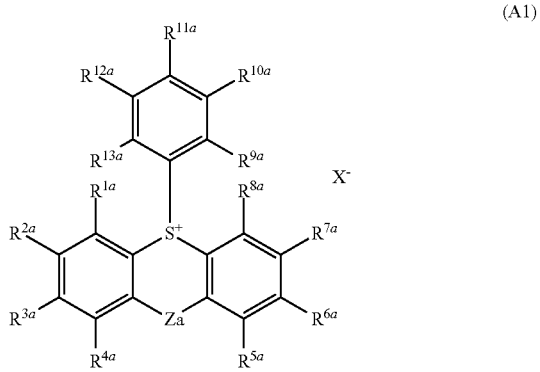

(A1)

In General Formula (A1), $R^{1a}$ to $R^{13a}$ each independently represent a hydrogen atom or a substituent.

It is preferred that one to three of $R^{1a}$ to $R^{13a}$ are not hydrogen atoms, and it is more preferred that any one of $R^{9a}$ to $R^{13a}$ is not a hydrogen atom.

Za is a single bond or a divalent linking group.

$X^-$ has the same definition as $Z^-$ in General Formula (ZI).

Specific examples of the case where $R^{1a}$ to $R^{13a}$ are not hydrogen atoms include a halogen atom, a linear, branched or cyclic alkyl group, alkenyl group or alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an aryl azo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents.

The case where $R^{1a}$ to $R^{13a}$ are not a hydrogen atom is preferably a linear, branched or cyclic alkyl group substituted with a hydroxyl group.

Examples of the divalent linking group of Za include an alkylene group, an arylene group, a carbonyl group, a sulfonyl group, a carbonyloxy group, a carbonylamino group, a sulfonylamide group, an ether bond, a thioether bond, an amino group, a disulfide group, —(CH$_2$)$_n$—CO—, —(CH$_2$)$_n$—SO$_2$—, —CH=CH—, an aminocarbonylamino group, and an aminosulfonylamino group (n is an integer of 1 to 3).

Examples of the preferred structure of the case where at least one of $R_{201}$, $R_{202}$, or $R_{203}$, $R_{204}$ or $R_{205}$, or $R_{206}$ or $R_{207}$ is not an aryl group include cation structures such as compounds illustrated in paragraphs [0046] and [0048] of JP2004-233661A and paragraphs [0040] to [0046] of JP2003-35948A, Compounds (I-1) to (I-70) illustrated in US2003/0224288A1, and Compounds (IA-1) to (IA-54) and (IB-1) to (IB-24) illustrated in US2003/0077540A1.

Further examples of the photoacid generator include compounds represented by General Formulae (ZIV), (ZV), and (ZVI).

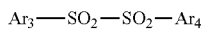
(ZIV)

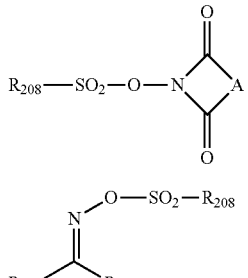
(ZV)

(ZVI)

In General Formulae (ZIV) to (ZVI), $Ar_3$ and $Ar_4$ each independently represent an aryl group.

$R_{208}$, $R_{209}$, and $R_{210}$ each independently represent an alkyl group, a cycloalkyl group, or an aryl group.

A represents an alkylene group, an alkenylene group, or an arylene group.

Specific examples of the aryl group of $Ar_3$, $Ar_4$, $R_{208}$, $R_{209}$, and $R_{210}$ are the same as the specific examples of the aryl group as $R_{201}$, $R_{202}$, and $R_{203}$ in General Formula (ZI).

Specific examples of the alkyl group and the cycloalkyl group of $R_{208}$, $R_{209}$, and $R_{210}$ are the same as the specific examples of the alkyl group and the cycloalkyl group as $R_{201}$, $R_{202}$, and $R_{203}$ in General Formula (ZI), respectively.

Examples of the alkylene group of A include alkylene groups having 1 to 12 carbon atoms (for example, a methylene group, an ethylene group, a propylene group, an isopropylene group, a butylene group, and an isobutylene group); examples of the alkenylene group of A include alkenylene groups having 2 to 12 carbon atoms (for example, an ethenylene group, a propenylene group, and a butenylene group); and examples of the arylene group of A include an arylene group having 6 to 10 carbon atoms (for example, a phenylene group, a tolylene group, and a naphthylene group), respectively.

In the present invention, from the viewpoint of suppressing diffusion of an acid generated upon exposure into a non-exposed area, thereby improving resolution, the photoacid generator is preferably a compound which generates an acid with a volume of 130 Å³ or more (more preferably, a sulfonic acid), more preferably a compound which generates an acid with a volume of 190 Å³ or more (more preferably, a sulfonic acid), still more preferably a compound which generates an acid with a volume of 270 Å³ or more (more preferably, a sulfonic acid), and particularly preferably a compound which generates an acid with a volume of 400 Å³ or more (more preferably, a sulfonic acid), upon irradiation with electron beams or extreme ultraviolet rays. Meanwhile, from the viewpoint of sensitivity or coating solvent solubility, the volume is preferably 2000 Å³ or less, and more preferably 1500 Å³ or less. The value of the volume was obtained using "WinMOPAC" manufactured by Fujitsu Limited. That is, the "accessible volume" of each acid can be calculated by, first, inputting a chemical structure of an acid according to each case, determining the most stable conformation of each acid by a molecular force field calculation using an MM3 method with an initial structure of this structure, and then performing a molecular orbital calculation using a PM3 method for the most stable conformation.

In the present invention, a photoacid generator which generates an acid exemplified below by irradiation with actinic rays or radiation is preferable. Also, some examples are given calculated values of volume (unit: Å³). Meanwhile, the value calculated herein is a volume value of an acid in which a proton is bound to an anion moiety.

1 Å corresponds to $1 \times 10^{-10}$ m.

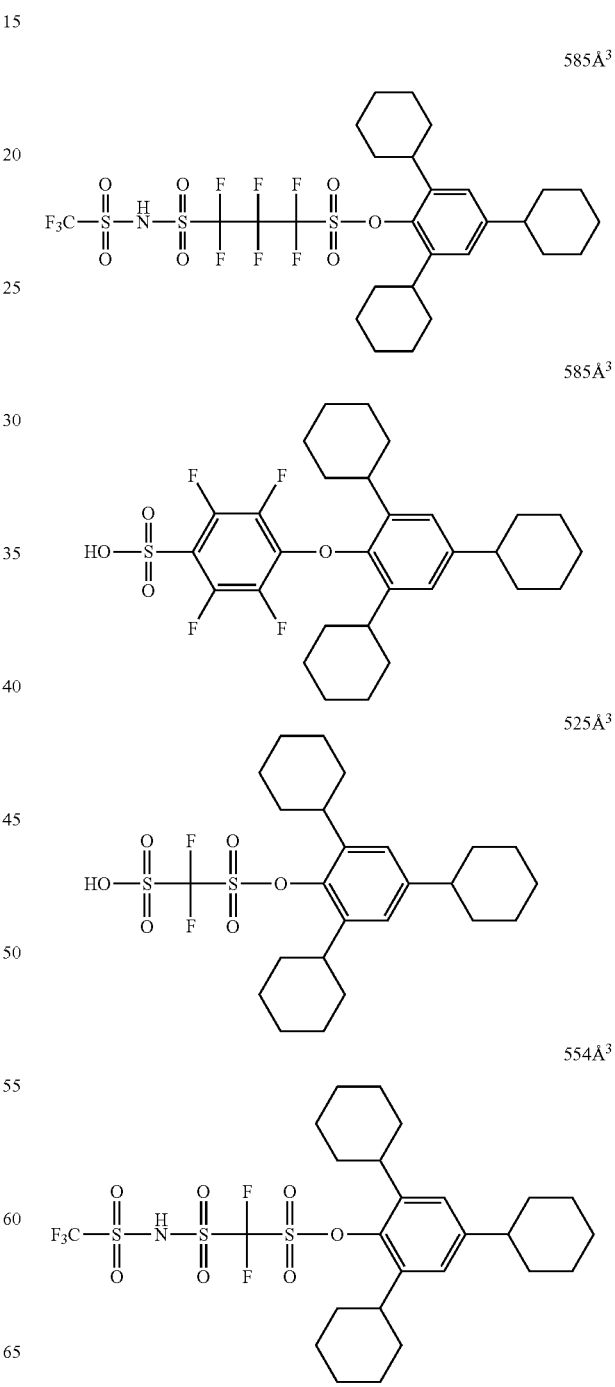

55
-continued
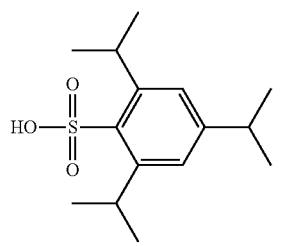
303Å³
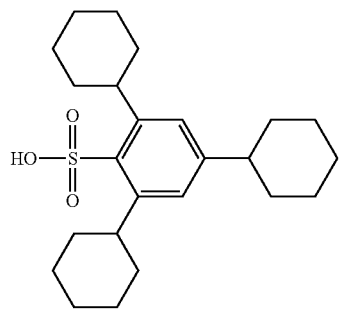
437Å³
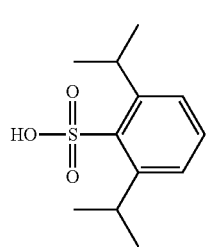
244Å³
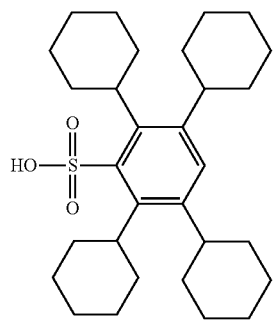
529Å³
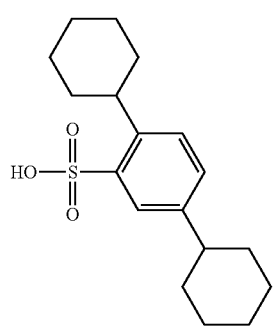
336Å³
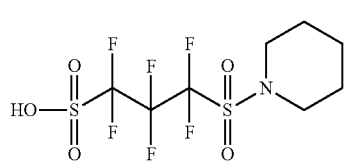
244Å³
56
-continued
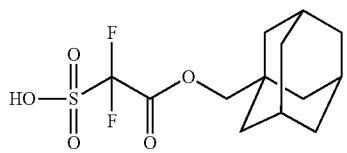
271Å³
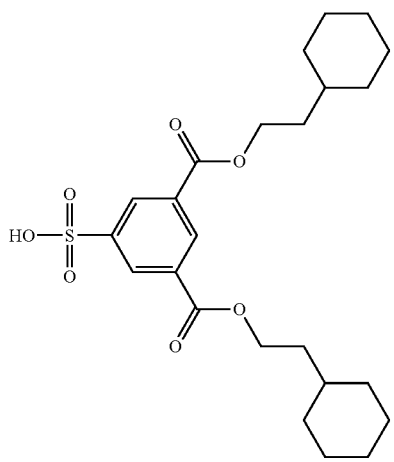
457Å³
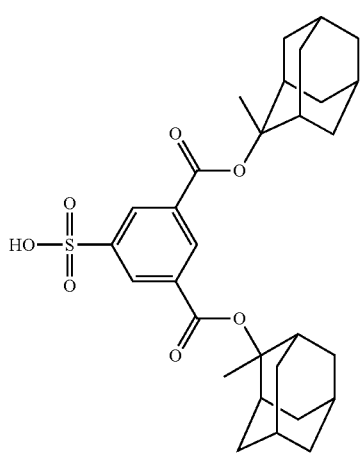
511Å³
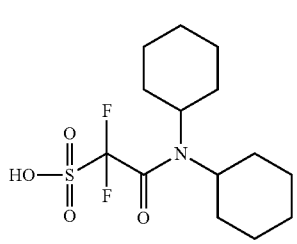
311Å³
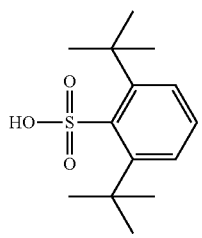
280Å³

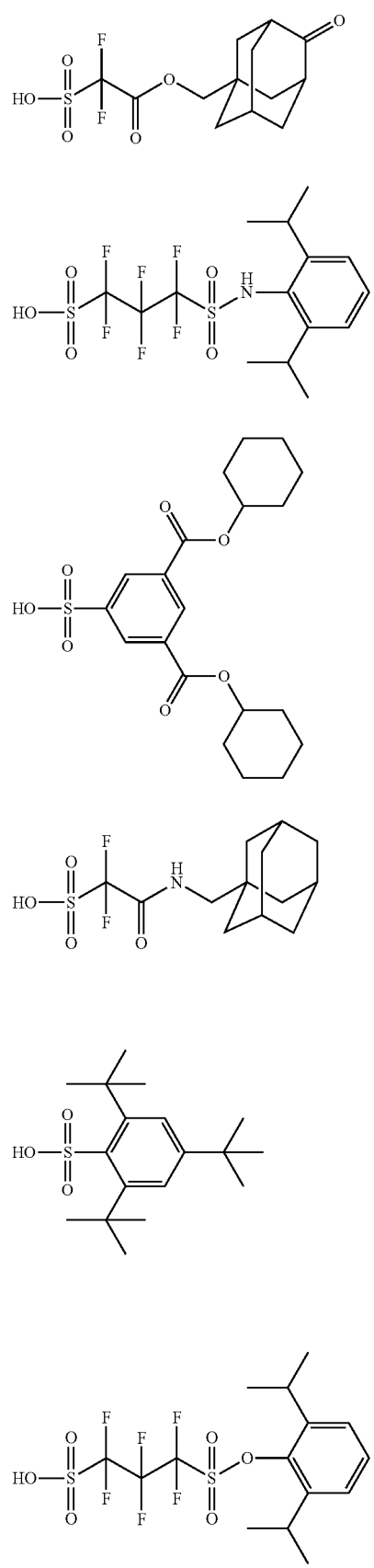

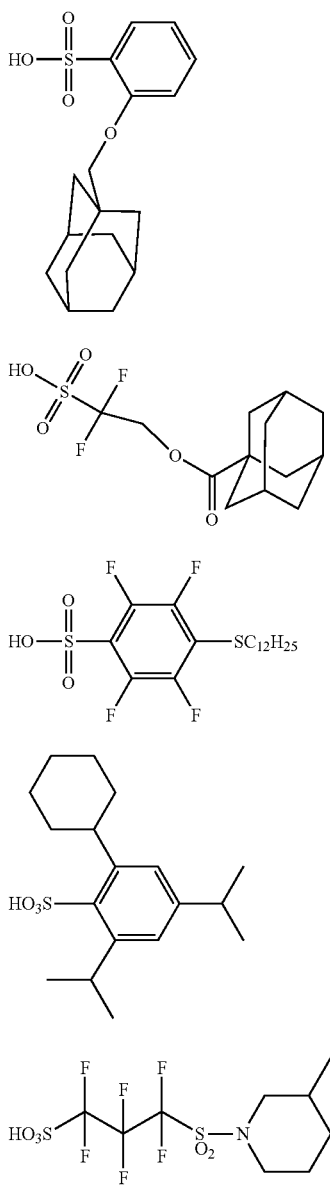
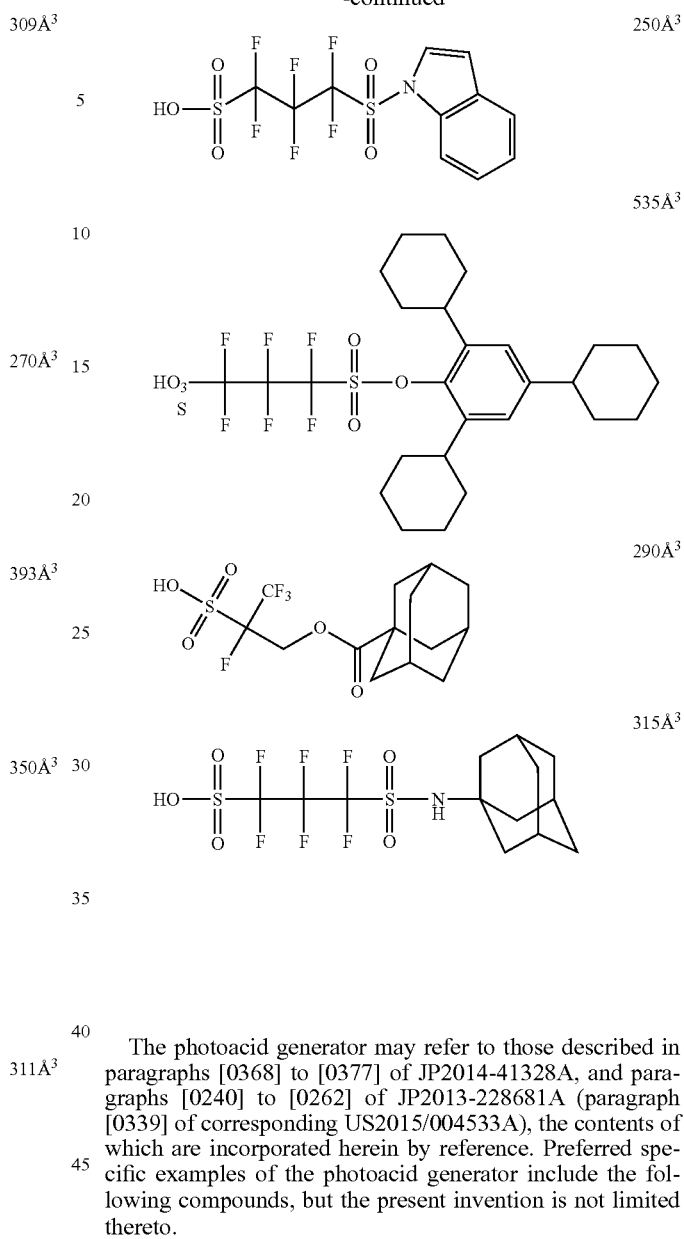
The photoacid generator may refer to those described in paragraphs [0368] to [0377] of JP2014-41328A, and paragraphs [0240] to [0262] of JP2013-228681A (paragraph [0339] of corresponding US2015/004533A), the contents of which are incorporated herein by reference. Preferred specific examples of the photoacid generator include the following compounds, but the present invention is not limited thereto.
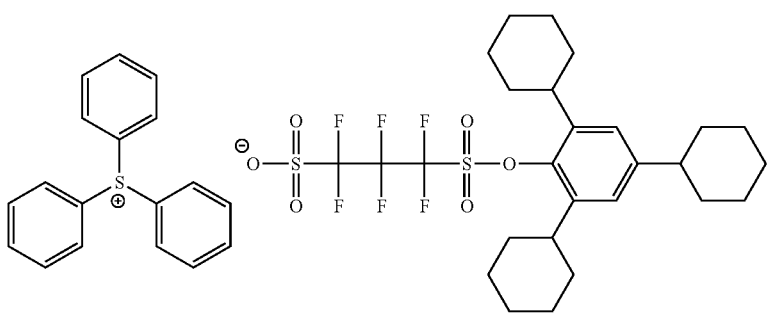
(z1)

-continued
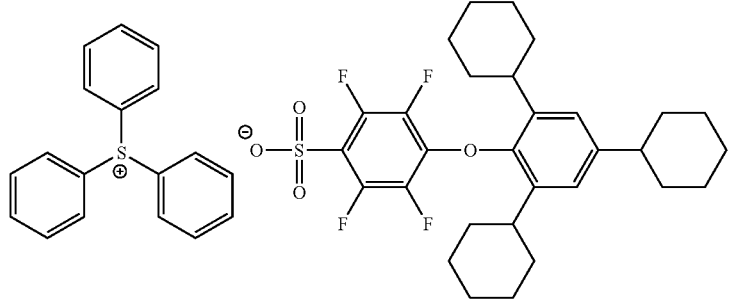
(z2)
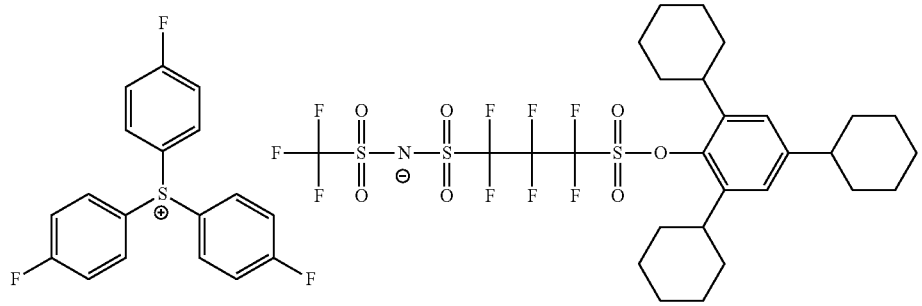
(z3)
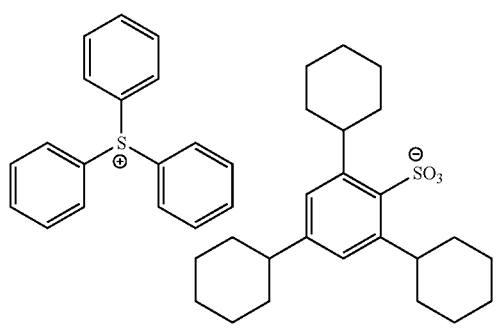
(z4)
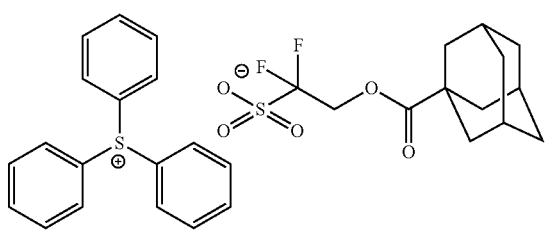
(z5)
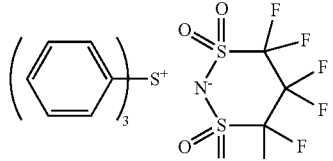
(z6)
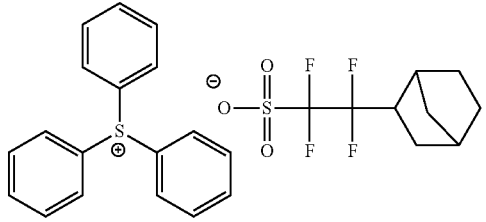
(z7)
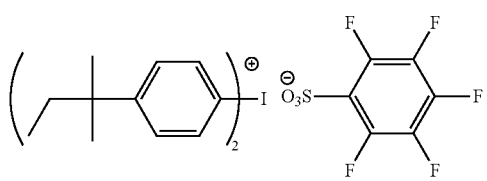
(z8)
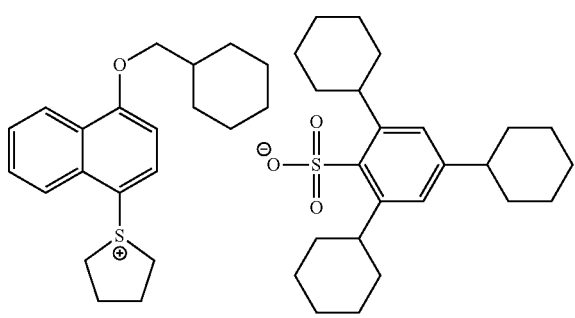
(z9)

-continued
(z10)
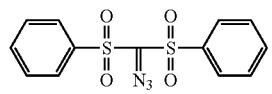
(z11)
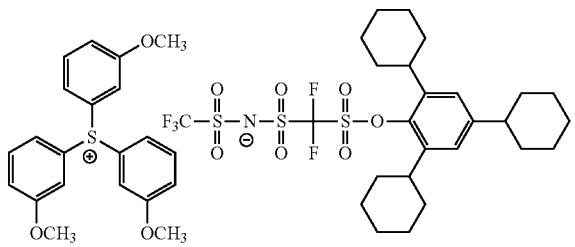
(z12)
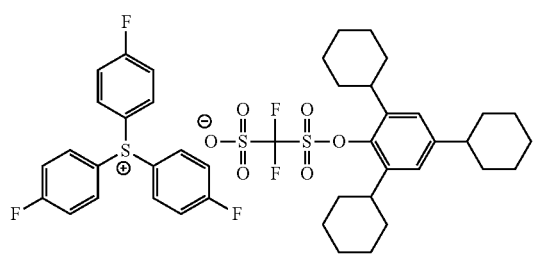
(z13)
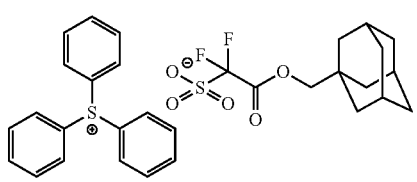
(z14)
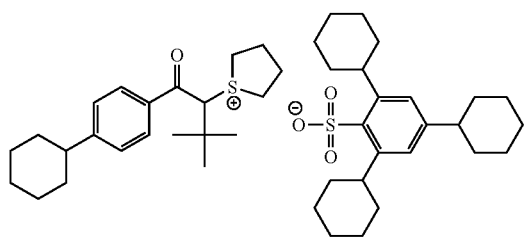
(z15)
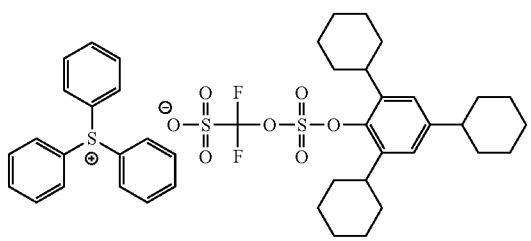
(z16)
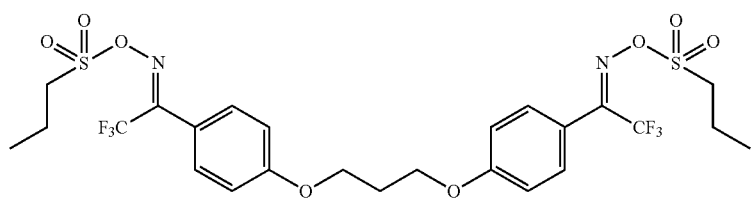
(z17)
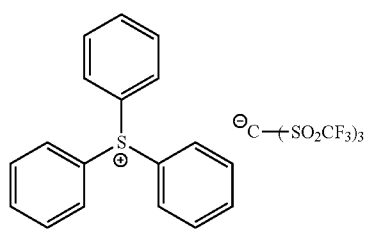
(z18)
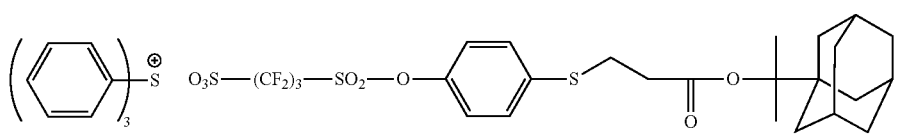

-continued
(z19)
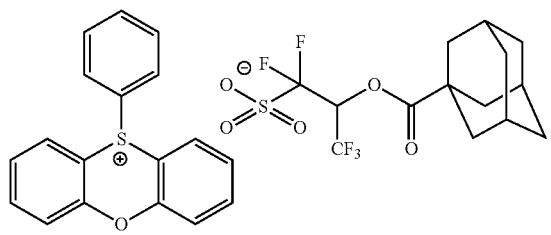
(z20)
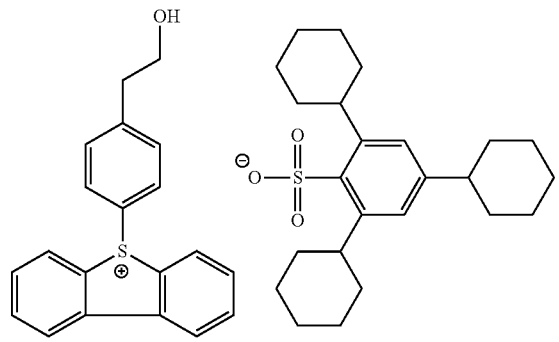
(z21)
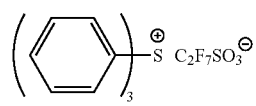
(z22)
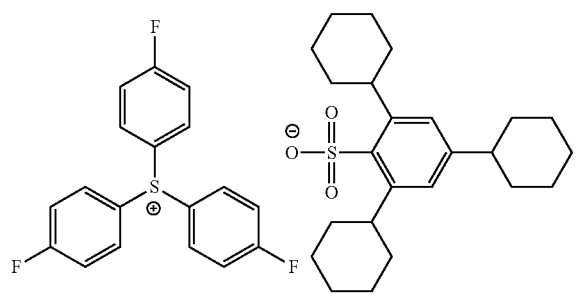
(z23)
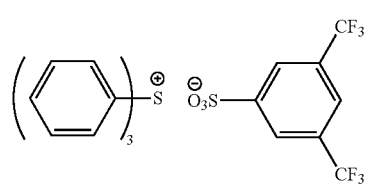
(z24)
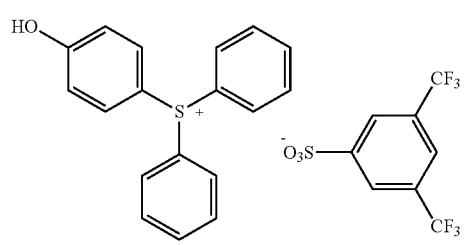
(z25)
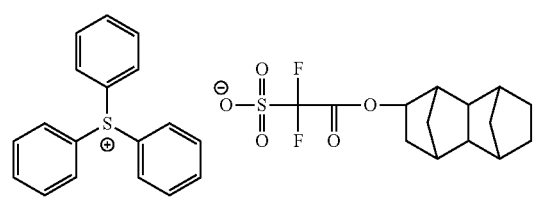
(z26)
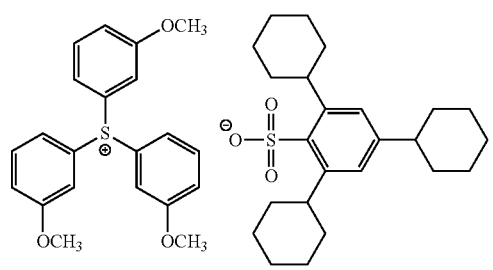
(z27)
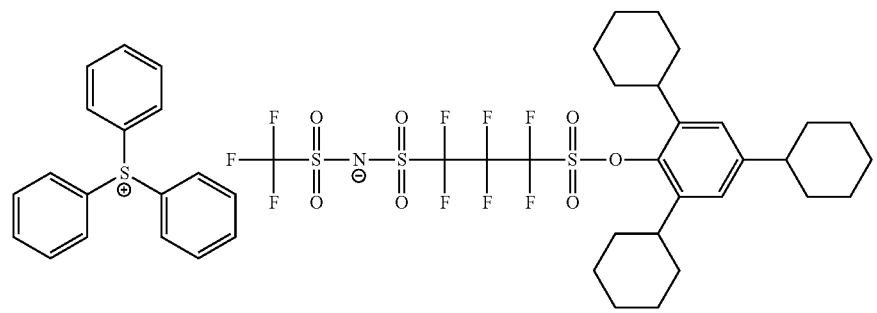

(z28) 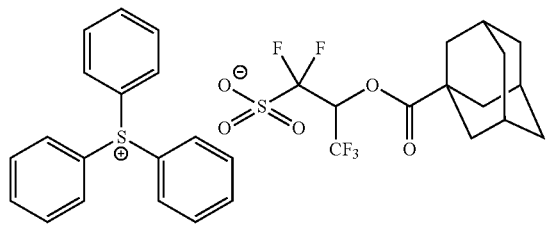
(z29) 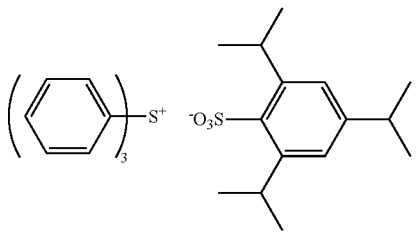
(z30) 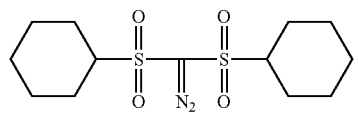
(z31) 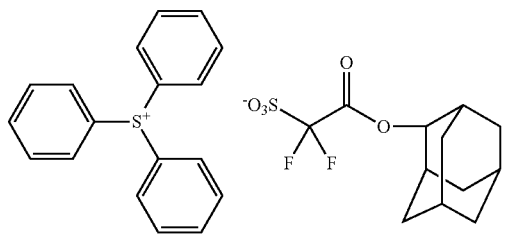
(z32) 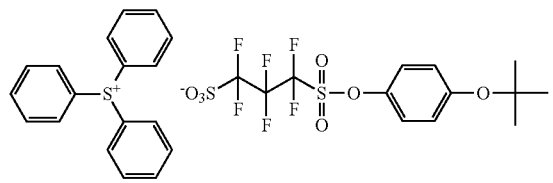
(z33) 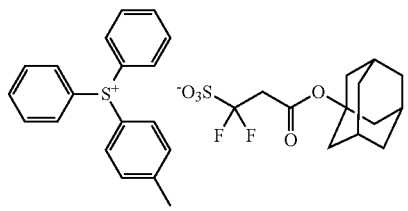
(z34) 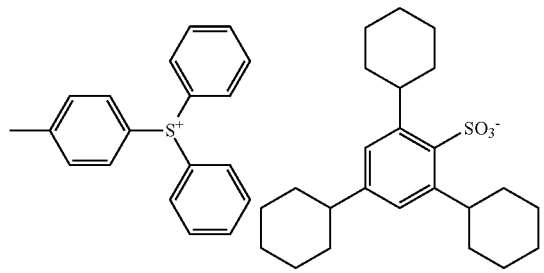
(z35) 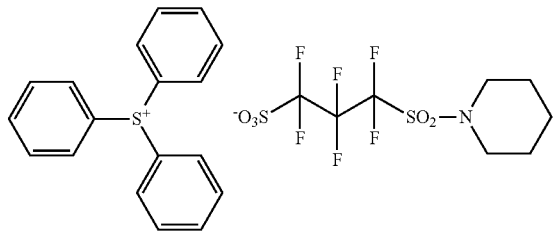
(z36) 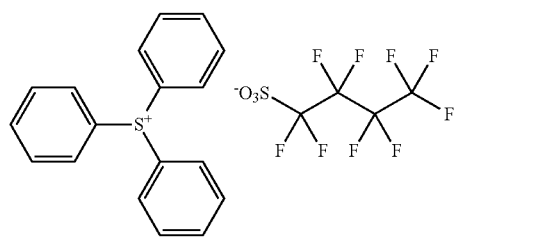
(z37) 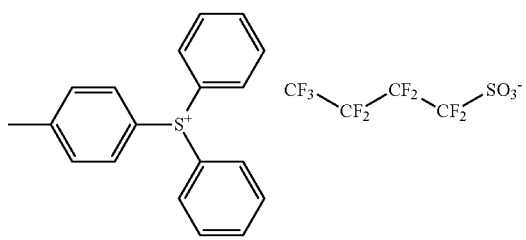
(z38) 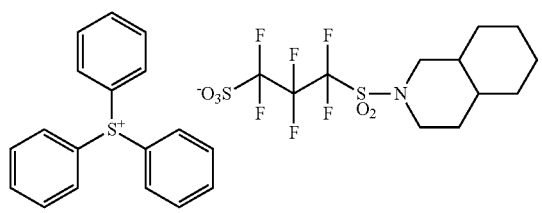
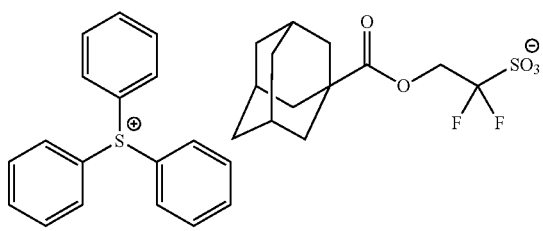

-continued

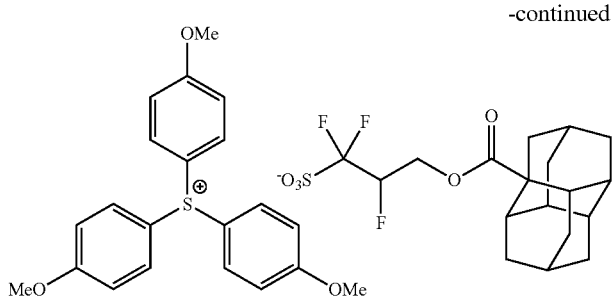
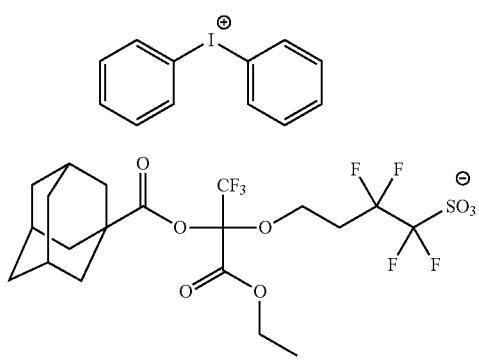
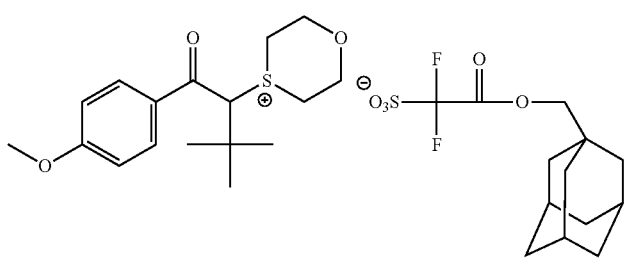
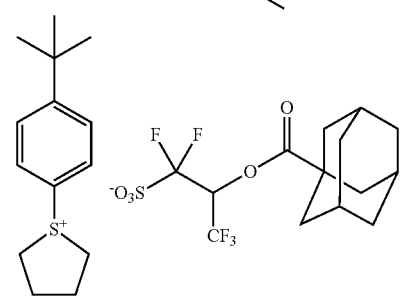

The photoacid generators may be used alone or in combination of two or more thereof.

The content of the photoacid generator in the actinic ray-sensitive or radiation-sensitive composition is preferably 0.1 mass % or more, more preferably 0.5 mass % or more, and still more preferably 2.0 mass % or more, based on the total solid content of the composition. In particular, the content of the photoacid generator is preferably as high as possible, more preferably 3.0 mass % or more, and most preferably 5.0 mass % or more, in order to achieve both high sensitivity and high resolution at the time of electron beam or extreme ultraviolet exposure. From the viewpoint of film loss and resolution, the content of the photoacid generator is preferably 30 mass % or less, more preferably 25 mass % or less, and particularly preferably 20 mass % or less, based on the total solid content of the actinic ray-sensitive or radiation-sensitive resin composition.

The absolute value of the difference pKa(A)–pKa(C) between the acid dissociation constant pKa(A) of the group generated by releasing the polar interaction of the resin (A) and the acid dissociation constant pKa(C) of the acid or base generated upon exposure of the compound (C), or the absolute value of the difference pKa(A')–pKa(C) between the acid dissociation constant pKa(A') of the polar group of the resin (A') and the acid dissociation constant pKa(C) of the acid or base generated upon exposure of the compound (C) is preferably 6.0 or more, more preferably 7 or more, and still more preferably 10 or more from the viewpoint of sensitivity.

<Photobase Generator>

The case where the compound (C) is a photobase generator will be described.

The photobase generator is a compound capable of generating a base upon exposure, and is not particularly limited as long as it shows no activity under normal conditions of ordinary temperatures and pressures, but is capable of generating a base (basic substance) in the case where irradiation of electromagnetic waves and heating are applied as an external stimulus.

The photobase generator that can be used in the present invention is not particularly limited and a known generator can be used. Examples of the photobase generator include carbamate derivatives, amide derivatives, imide derivatives, α cobalt complexes, imidazole derivatives, cinnamic acid amide derivatives, and oxime derivatives.

The basic substance generated from the photobase generator is not particularly limited, but it may be, for example, a compound having an amino group, particularly a monoamine, a polyamine such as a diamine, or an amidine.

From the viewpoint of sensitivity and resolution, a compound having an amino group with a higher basicity (with a high pKa value of a conjugate acid) is preferable as the generated basic substance.

Examples of the photobase generator include, but are not limited to, base generators having a cinnamic acid amide structure as disclosed in JP2009-80452A and WO2009/123122A, base generators having a carbamate structure as disclosed in JP2006-189591A and JP2008-247747A, base generators having an oxime structure or a carbamoyl oxime structure as disclosed in JP2007-249013A and JP2008-003581A, and compounds described in JP2010-243773A. Further, other known base generator structures may be used.

The photobase generators may be used alone or in combination of two or more thereof.

The preferred content of the photobase generator in the actinic ray-sensitive or radiation-sensitive resin composition is the same as the preferred content of the photoacid generator in the actinic ray-sensitive or radiation-sensitive resin composition.

[D] Solvent]

The actinic ray-sensitive or radiation-sensitive resin composition used in the present invention contains a solvent (D) (also referred to as a "resist solvent"). The solvent has a mass ratio of a solvent having a hydroxyl group to a solvent having no hydroxyl group of preferably 40/60 to 100/0, more preferably 50/50 to 100/0, and still more preferably 60/40 to 100/0.

More specifically, the solvent (D) preferably contains at least one of (M1) propylene glycol monoalkyl ether carboxylate or (M2) at least one selected from the group consisting of propylene glycol monoalkyl ether, lactic acid ester, acetic acid ester, alkoxypropionic acid ester, chain-like ketone, cyclic ketone, lactone, and alkylene carbonate. Further, this solvent may further contain components other than the components (M1) and (M2).

The present inventors have found that combined use of such a solvent and the above-described resin results in improved coatability of the composition and makes it possible to form a pattern with a small number of development defects. Although the reason is not always clear, the present inventors have thought that it is due to the fact that these solvents have well-balanced solubility, boiling point, and viscosity of the above-mentioned resins, so that unevenness of the film thickness of the composition film and the occurrence of precipitates during spin coating can be suppressed.

The component (M1) is preferably at least one selected from the group consisting of propylene glycol monomethyl ether acetate, propylene glycol monomethyl ether propionate, and propylene glycol monoethyl ether acetate, and particularly preferably propylene glycol monomethyl ether acetate.

The component (M2) is preferably as follows.

The propylene glycol monoalkyl ether is preferably propylene glycol monomethyl ether or propylene glycol monoethyl ether.

The lactic acid ester is preferably ethyl lactate, butyl lactate, or propyl lactate.

The acetic acid ester is preferably methyl acetate, ethyl acetate, butyl acetate, isobutyl acetate, propyl acetate, isoamyl acetate, methyl formate, ethyl formate, butyl formate, propyl formate, or 3-methoxybutyl acetate.

Butyl butyrate is also preferable.

The alkoxypropionic acid ester is preferably methyl 3-methoxypropionate (MMP) or ethyl 3-ethoxypropionate (EEP).

The chain-like ketone is preferably 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetyl acetone, acetonyl acetone, ionone, diacetonyl alcohol, acetyl carbinol, acetophenone, methylnaphthyl ketone, or methyl amyl ketone.

The cyclic ketone is preferably methylcyclohexanone, isophorone, or cyclohexanone.

The lactone is preferably α-butyrolactone.

The alkylene carbonate is preferably propylene carbonate.

The component (M2) is more preferably propylene glycol monomethyl ether, ethyl lactate, ethyl 3-ethoxypropionate, methyl amyl ketone, cyclohexanone, butyl acetate, pentyl acetate, γ-butyrolactone, or propylene carbonate.

In addition to the above-mentioned components, it is preferable to use an ester-based solvent having 7 or more carbon atoms (preferably 7 to 14, more preferably 7 to 12, and still more preferably 7 to 10) and having 2 or less heteroatoms.

Preferred examples of the ester-based solvent having 7 or more carbon atoms and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate. Isoamyl acetate is particularly preferably used.

As the component (M2), one having a flash point (hereinafter, also referred to as fp) of 37° C. or higher is preferably used. Such a component (M2) is preferably propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), or propylene carbonate (fp: 132° C.). Among these, propylene glycol monoethyl ether, ethyl lactate, pentyl acetate, or cyclohexanone is more preferable, and propylene glycol monoethyl ether or ethyl lactate is particularly preferable. The term "flash point" as used herein means the value described in the reagent catalog of Tokyo Chemical Industry Co., Ltd. or Sigma-Aldrich Corporation.

It is preferred that the solvent contains the component (M2). It is more preferred that the solvent substantially consists of only the component (M2) or is a mixed solvent of the component (M2) and other components. In the latter case, it is still more preferred that the solvent contains both the component (M1) and the component (M2).

The mass ratio of the component (M1) to the component (M2) is preferably in the range of 90:10 to 0:100, more preferably in the range of 80:20 to 0:100, and still more preferably in the range of 40:60 to 0:100. That is, it is preferred that the solvent consists of only the component (M2), or contains both the component (M1) and the component (M2), in which the mass ratio therebetween is as follows. That is, in the latter case, the mass ratio of component (M2) to component (M1) is preferably 10/90 or more, more preferably 20/80 or more, and still more preferably 60/40 or more. In the case where such a configuration is adopted, it becomes possible to further improve resist solubility.

In the case where the solvent contains both the component (M1) and the component (M2), the mass ratio of component (M1) to component (M2) is, for example, 1/99 or less.

As described above, the solvent may further contain components other than the components (M1) and (M2). In this case, the content of the components other than the components (M1) and (M2) is preferably in the range of 5 mass % to 30 mass % with respect to the total amount of the solvent.

The content of the solvent in the composition is determined such that the solid content concentration of all components is preferably 0.5 to 30 mass % and more preferably 1 to 20 mass %. This can lead to further improved coatability of the composition.

Hydrophobic Resin (E)

The actinic ray-sensitive or radiation-sensitive resin composition of the present invention may contain a hydrophobic resin (E) which is different from the resin (A) or (A').

It is preferred that the hydrophobic resin is designed to be unevenly distributed on the surface of the resist film, but unlike a surfactant, the hydrophobic resin is not necessarily required to have a hydrophilic group in the molecule, and may not contribute to uniform mixing of polar/nonpolar materials.

The effects of adding a hydrophobic resin include control of the static/dynamic contact angle of the resist film surface with respect to water, suppression of outgassing, and the like.

From the viewpoint of uneven distribution to the film surface layer, it is preferred that the hydrophobic resin contains one or more of a "fluorine atom", a "silicon atom" and a "$CH_3$ partial structure contained in the side chain portion of the resin", and it is more preferred that the hydrophobic resin contains two or more thereof. Further, it is preferred that the hydrophobic resin contains a hydrocarbon group having 5 or more carbon atoms. These groups may be present in the main chain of the resin or may be substituted on the side chain of the resin.

In the case where the hydrophobic resin contains a fluorine atom and/or a silicon atom, the fluorine atom and/or silicon atom in the hydrophobic resin may be contained in the main chain of the resin or may be contained in side chain of the resin.

In the case where the hydrophobic resin contains a fluorine atom, the hydrophobic resin is preferably a resin having a fluorine atom-containing alkyl group, a fluorine atom-containing cycloalkyl group or a fluorine atom-containing aryl group as a fluorine atom-containing partial structure.

The fluorine atom-containing alkyl group (preferably having 1 to 10 carbon atoms and more preferably having 1 to 4 carbon atoms) is a linear or branched alkyl group in which at least one hydrogen atom is substituted with a fluorine atom, and may further have a substituent other than a fluorine atom.

The fluorine atom-containing cycloalkyl group is a monocyclic or polycyclic cycloalkyl group in which at least one hydrogen atom is substituted with a fluorine atom, and may further have a substituent other than a fluorine atom.

The fluorine atom-containing aryl group is, for example, a cycloalkyl group in which at least one hydrogen atom of an aryl group such as a phenyl group or a naphthyl group is substituted with a fluorine atom and may further have a substituent other than a fluorine atom.

Examples of the repeating unit having a fluorine atom or a silicon atom include those exemplified in paragraph [0519] of US2012/0251948A1.

As mentioned above, it is also preferred that the hydrophobic resin contains a $CH_3$ partial structure in the side chain portion thereof.

Here, the $CH_3$ partial structure in the side chain portion of the hydrophobic resin is intended to include a $CH_3$ partial structure that an ethyl group, a propyl group, or the like has.

On the other hand, a methyl group directly bonded to the main chain of the hydrophobic resin (for example, α-methyl group in the repeating unit having a methacrylic acid structure) makes only a small contribution to surface localization of the hydrophobic resin owing to influence of the main chain, and therefore it is not included in the $CH_3$ partial structure in the present invention.

Regarding the hydrophobic resin, reference can be made to the description of paragraphs [0348] to [0415] of JP2014-010245A, the contents of which are incorporated herein by reference.

As the hydrophobic resin, those described in JP2011-248019A, JP2010-175859A and JP2012-032544A can also be preferably used.

In the pattern forming method of the present invention, a resist film is formed on a substrate using the actinic ray-sensitive or radiation-sensitive resin composition, and a topcoat layer may be formed on the resist film using the topcoat composition. The film thickness of this resist film is preferably 10 to 100 nm, and the film thickness of the topcoat layer is preferably 10 to 200 nm, more preferably 20 to 100 nm, and particularly preferably 40 to 80 nm.

The method of coating the actinic ray-sensitive or radiation-sensitive resin composition on the substrate is preferably spin coating, in which the rotation speed is preferably 1,000 to 3,000 rpm.

For example, the actinic ray-sensitive or radiation-sensitive resin composition is applied onto a substrate (for example, silicon/silicon dioxide-coated substrate) as used in the production of precision integrated circuit elements by a suitable coating method such as a spinner or a coater, and then dried to form a resist film. It is also possible to apply a known antireflection film in advance. Further, it is preferable to dry the resist film before forming the topcoat layer.

Next, a topcoat composition can be applied onto the resulting resist film by the same means as the foregoing method for forming a resist film and then dried to form a topcoat layer.

The resist film having the topcoat layer as the upper layer is irradiated with electron beams (EB), X-rays or EUV light, usually through a mask, preferably baked (heated) and developed. As a result, a good pattern can be obtained.

Surfactant (F)

The actinic ray-sensitive or radiation-sensitive resin composition used in the present invention may further contain a surfactant (F). The inclusion of a surfactant makes it possible to form a pattern with adhesiveness and less development defects while having good sensitivity and resolution in the case of using an exposure light source having a wavelength of 250 nm or less, particularly 220 nm or less.

As the surfactant, it is particularly preferred to use a fluorine-based and/or silicon-based surfactant.

Examples of the fluorine-based and/or silicon-based surfactant include the surfactants described in paragraph [0276] of US2008/0248425A. Further, EFTOP EF301 or EF303 (manufactured by Shin-Akita Kasei Co., Ltd.); FLUORAD FC430, 431, or 4430 (manufactured by Sumitomo 3M Limited); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Chemical Co., Ltd.); GF-300 or GF-150 (manufactured by Toagosei Co., Ltd.), SURFLON S-393 (manufactured by Seimi Chemical Co., Ltd.); EFTOP EF121, EF122A, EF122B, RF122C, EF125M, EF135M, EF351, EF352, EF801, EF802, or EF601 (manufactured by Jemco Inc.); PF636, PF656, PF6320, or PF6520 (manufactured by OMNOVA Solutions Inc.); or FTX-204G, 208G, 218G, 230G, 204D, 208D, 212D, 218D, or 222D (manufactured by Neos Company Limited) may be used. In addition, a polysiloxane polymer KP-341 (manufactured by Shin-Etsu Chemical Co., Ltd.) may also be used as the silicon-based surfactant.

Further, in addition to the above-mentioned known surfactants, the surfactant may be synthesized using a fluoroaliphatic compound produced by a telomerization method (also referred to as a telomer method) or an oligomerization method (also referred to as an oligomer method). Specifically, a polymer having a fluoroaliphatic group derived from the fluoroaliphatic compound may be used as the surfactant. This fluoroaliphatic compound can be synthesized, for example, by the method described in JP2002-90991A.

Further, surfactants other than the fluorine-based and/or silicon-based surfactants described in paragraph [0280] of US2008/0248425A may be used.

These surfactants may be used alone or in combination of two or more thereof.

In the case where the actinic ray-sensitive or radiation-sensitive resin composition used in the present invention contains a surfactant, the content thereof is preferably 0 to 2 mass %, more preferably 0.0001 to 2 mass %, and still more preferably 0.0005 to 1 mass %, based on the total solid content of the composition.

Other Additives (G)

The actinic ray-sensitive or radiation-sensitive resin composition used in the present invention may further contain a dissolution inhibiting compound, a dye, a plasticizer, a photosensitizer, a light absorber, and/or a compound promoting solubility in a developer (for example, a phenol compound having a molecular weight of 1,000 or less, or an alicyclic or aliphatic compound containing a carboxyl group).

The actinic ray-sensitive or radiation-sensitive resin composition used in the present invention may further contain a dissolution inhibiting compound. The term "dissolution inhibiting compound" as used herein is a compound having a molecular weight of 3,000 or less, which is decomposed by the action of an acid to reduce its solubility in an organic developer.

In order not to lower the transmittance for light having a wavelength of 220 nm or less, the dissolution inhibiting compound is preferably an alicyclic or aliphatic compound containing an acid-decomposable group, such as a cholic acid derivative containing an acid-decomposable group described in Proceeding of SPIE, 2724, 355 (1996). Incidentally, examples of the acid-decomposable group and the alicyclic structure are the same as those described above.

<Basic Compound>

Further, the actinic ray-sensitive or radiation-sensitive resin composition used in the present invention may contain a basic compound. A photodecomposable basic compound (a compound which initially exhibits a basicity due to a basic nitrogen atom acting as a base but decomposes upon irradiation with actinic rays or radiation to generate a zwitterionic compound having a basic nitrogen atom and an organic acid moiety and resulting from their neutralization in the molecule, is reduced in or deprived of the basicity; for example, onium salts described in JP3577743B, JP2001-215689A, JP2001-166476A, and JP2008-102383A) is also appropriately used as the basic compound.

Among these basic compounds, an ammonium salt is preferable from the viewpoint of improving resolution.

The content of the basic compound for use in the present invention is preferably 0.01 to 10 mass %, more preferably 0.03 to 5 mass %, and still more preferably 0.05 to 3 mass %, with respect to the total solid content of the composition.

In one embodiment of the present invention, the basic compound is more preferably an onium salt compound containing a nitrogen atom in the cation moiety described below.

Examples of the onium salt compound include a diazonium salt compound, a phosphonium salt compound, a sulfonium salt compound, and an iodonium salt compound. Among them, a sulfonium salt compound or an iodonium salt compound is preferable, and a sulfonium salt compound is more preferable.

Typically, the onium salt compound has a basic moiety containing a nitrogen atom in the cation moiety. As used herein, the term "basic moiety" means a site where the pKa of the conjugate acid at the cation moiety of the basic compound is −3 or more. The pKa is preferably in the range of −3 to 15, and more preferably in the range of 0 to 15. In addition, this pKa means the calculated value obtained by ACD/ChemSketch (ACD/Labs 8.00 Release Product Version: 8.08).

The basic moiety includes a structure selected from the group consisting of, for example, an amino group (a group in which one hydrogen atom has been removed from ammonia, a primary amine, or a secondary amine; the same shall apply hereinafter) and a nitrogen-containing heterocyclic group. The amino group is preferably an aliphatic amino group. As used herein, the term "aliphatic amino group" means a group in which one hydrogen atom has been removed from an aliphatic amine.

In these structures, it is preferred that all of the atoms adjacent to the nitrogen atom contained in the structure are carbon atoms or hydrogen atoms from the viewpoint of improving basicity. From the viewpoint of improving basicity, it is preferred that an electron withdrawing functional group (a carbonyl group, a sulfonyl group, a cyano group, a halogen atom, or the like) is not directly bonded to the nitrogen atom.

The onium salt compound may have two or more of the above-mentioned basic moieties.

In the case where the cation moiety of the basic compound contains an amino group, the cation moiety preferably has a partial structure represented by General Formula (N-I).

In the formula, $R_A$ and $R_B$ each independently represent a hydrogen atom or an organic group.

X represents a single bond or a linking group.

At least two of $R_A$, $R_B$, and X may be bonded to each other to form a ring.

Examples of the organic group represented by $R_A$ or $R_B$ include an alkyl group, a cycloalkyl group, an alkenyl group, an aryl group, a heterocyclic hydrocarbon group, an alkoxycarbonyl group, a lactone group, and a sultone group.

These groups may have a substituent, and examples of the substituent include an alkyl group, a cycloalkyl group, an alkoxy group, an alkoxycarbonyl group, a carboxyl group, a halogen atom, a hydroxyl group, and a cyano group.

The alkyl group represented by $R_A$ or $R_B$ may be linear or branched. The number of carbon atoms in the alkyl group is preferably 1 to 50, more preferably 1 to 30, and still more preferably 1 to 20. Examples of such an alkyl group include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, and a 2-ethylhexyl group.

The cycloalkyl group represented by $R_A$ or $R_B$ may be monocyclic or polycyclic.

The cycloalkyl group is preferably, for example, a monocyclic cycloalkyl group having 3 to 8 carbon atoms, such as a cyclopropyl group, a cyclopentyl group, or a cyclohexyl group.

The alkenyl group represented by $R_A$ or $R_B$ may be linear or branched. The number of carbon atoms in the alkenyl group is preferably 2 to 50, more preferably 2 to 30, and still more preferably 3 to 20. Examples of such an alkenyl group include a vinyl group, an allyl group, and a styryl group.

The aryl group represented by $R_A$ or $R_B$ is preferably an aryl group having 6 to 14 carbon atoms. Examples of such an aryl group include a phenyl group and a naphthyl group.

The heterocyclic hydrocarbon group represented by $R_A$ or $R_B$ is preferably a heterocyclic hydrocarbon group having 5 to 20 carbon atoms, and more preferably 6 to 15 carbon atoms. The heterocyclic hydrocarbon group may have aromaticity or may not have aromaticity. The heterocyclic hydrocarbon group preferably has aromaticity.

The heterocyclic ring contained in the foregoing group may be monocyclic or polycyclic. Examples of such a heterocyclic ring include an imidazole ring, a pyridine ring, a pyrazine ring, a pyrimidine ring, a pyridazine ring, a 2H-pyrrole ring, a 3H-indole ring, a 1H-indazole ring, a purine ring, an isoquinoline ring, a 4H-quinolizine ring, a quinoline ring, a phthalazine ring, a naphthyridine ring, a quinoxaline ring, a quinazoline ring, a cinnoline ring, a pteridine ring, a phenanthridine ring, an acridine ring, a phenanthroline ring, a phenazine ring, a perimidine ring, a triazine ring, a benzisoquinoline ring, a thiazole ring, a thiadiazine ring, an azepine ring, an azocine ring, an isothiazole ring, an isoxazole ring, and a benzothiazole ring.

The lactone group represented by $R_A$ or $R_B$ is, for example, a 5- to 7-membered ring lactone group, and may also be one in which the 5- to 7-membered ring lactone group is condensed with another ring structure in a fashion to form a bicyclo structure or a spiro structure.

The sultone group represented by $R_A$ or $R_B$ is, for example, a 5- to 7-membered ring sultone group, and may also be one in which the 5- to 7-membered ring sultone group is condensed with another ring structure in a fashion to form a bicyclo structure or a spiro structure.

Specifically, it is preferably a group having the structure shown below.

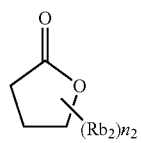
LC1-1

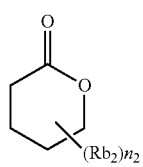
LC1-2

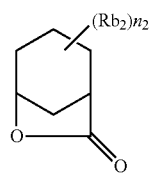
LC1-3

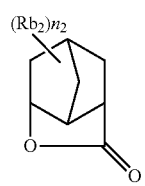
LC1-4

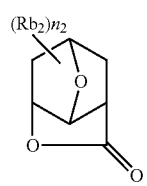
LC1-5

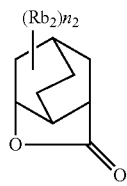
LC1-6

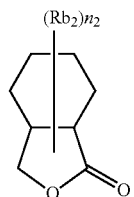
LC1-7

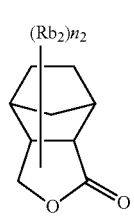
LC1-8

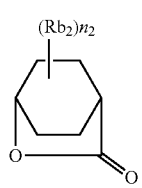
LC1-9

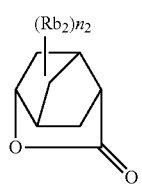
LC1-10

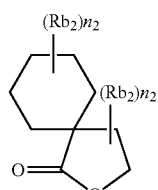
LC1-11

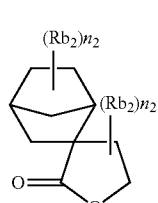
LC1-12

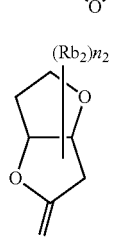
LC1-13

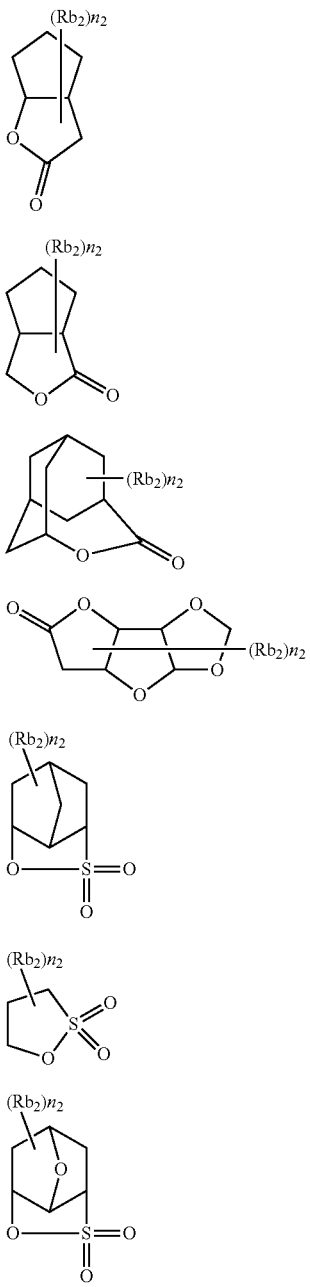

LC1-14

LC1-15

LC1-16

LC1-17

SL1-1

SL1-2

SL1-3

The lactone group and the sultone group may have or may not have a substituent ($Rb_2$). Preferred examples of the substituent ($Rb_2$) include the same substituents as those described as the substituents of $R_A$ and $R_B$ above. $n_2$ represents an integer of 0 to 4. In the case where $n_2$ is 2 or more, a plurality of substituents ($Rb_2$'s) may be the same or different. In addition, the plurality of substituents ($Rb_2$'s) may be bonded to each other to form a ring.

Examples of the linking group represented by X include a linear or branched alkylene group, a cycloalkylene group, an ether bond, an ester bond, an amido bond, a urethane bond, a urea bond, and a group formed by combining two or more thereof. X more preferably represents a single bond, an alkylene group, a group formed by combining an alkylene group and an ether bond, or a group formed by combining an alkylene group and an ester bond. The number of atoms in the linking group represented by X is preferably 20 or less, and more preferably 15 or less. The above-mentioned linear or branched alkylene group and cycloalkylene group preferably have 8 or less carbon atoms and may have a substituent. The substituent is preferably one having 8 or less carbon atoms, and examples thereof include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms).

At least two of $R_A$, $R_B$, and X may be bonded to each other to form a ring. The number of carbon atoms forming the ring is preferably 4 to 20. The ring may be monocyclic or polycyclic. The ring may contain an oxygen atom, a sulfur atom, a nitrogen atom, an ester bond, an amido bond, or a carbonyl group therein.

In the case where the cation moiety of the basic compound contains a nitrogen-containing heterocyclic group, the nitrogen-containing heterocyclic group may have aromaticity or may not have aromaticity. Further, the nitrogen-containing heterocyclic group may be monocyclic or polycyclic. The nitrogen-containing heterocyclic group may be preferably, for example, a group containing a piperidine ring, a morpholine ring, a pyridine ring, an imidazole ring, a pyrazine ring, a pyrrole ring, or a pyrimidine ring.

The onium salt compound is preferably a compound represented by General Formula (N-II).

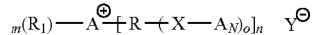

(N-II)

In the formula,

A represents a sulfur atom or an iodine atom.

$R_1$ represents a hydrogen atom or an organic group. In the case where there is a plurality of $R_1$'s, the $R_1$'s may be the same or different.

R represents an (o+1)-valent organic group. In the case where there is a plurality of R's, the R's may be the same or different.

X represents a single bond or a linking group. In the case where there is a plurality of X's, the X's may be the same or different.

$A_N$ represents a basic moiety containing a nitrogen atom. In the case where there is a plurality of $A_N$'s, the $A_N$'s may be the same or different.

In the case where A is a sulfur atom, n is an integer of 1 to 3, and m is an integer satisfying the relationship of m+n=3.

In the case where A is an iodine atom, n is 1 or 2, and m is an integer satisfying the relationship of m+n=2.

o represents an integer of 1 to 10.

$Y^-$ represents an anion (of which details will be described later as an anion moiety of the basic compound).

At least two of $R_1$, X, R, and $A_N$ may be bonded to each other to form a ring.

Examples of the (o+1)-valent organic group represented by R include a chain-like (linear or branched) or cyclic aliphatic hydrocarbon group, a heterocyclic hydrocarbon group, and an aromatic hydrocarbon group, and preferably an aromatic hydrocarbon group. In the case where R is an aromatic hydrocarbon group, it is preferred to be bonded at the p-position (1,4-position) of the aromatic hydrocarbon group.

The linking group represented by X has the same definition as the linking group represented by X in General Formula (N-I), and the same specific examples can be mentioned.

The basic moiety represented by $A_N$ has the same definition as the "basic moiety" contained in the cation moiety of the above-mentioned basic compound, and may contain, for example, an amino group or a nitrogen-containing heterocyclic group. In the case where the basic moiety contains an amino group, examples of the amino group include the $-N(R_A)(R_B)$ group in General Formula (N-I).

Examples of the organic group represented by $R_1$ include an alkyl group, an alkenyl group, an aliphatic cyclic group, an aromatic hydrocarbon group, and a heterocyclic hydrocarbon group. In the case where m=2, the two $R_1$'s may be bonded to each other to form a ring. These groups or rings may further have a substituent.

The alkyl group represented by $R_1$ may be linear or branched. The number of carbon atoms in the alkyl group is preferably 1 to 50, more preferably 1 to 30, and still more preferably 1 to 20. Examples of such an alkyl group include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, and a 2-ethylhexyl group.

The alkenyl group represented by $R_1$ may be linear or branched. The number of carbon atoms in the alkenyl group is preferably 2 to 50, more preferably 2 to 30, and still more preferably 3 to 20. Examples of such an alkenyl group include a vinyl group, an allyl group, and a styryl group.

The aliphatic cyclic group represented by $R_1$ is, for example, a cycloalkyl group. The cycloalkyl group may be monocyclic or polycyclic. The aliphatic cyclic group is preferably a monocyclic cycloalkyl group having 3 to 8 carbon atoms, such as a cyclopropyl group, a cyclopentyl group, or a cyclohexyl group.

The aromatic hydrocarbon group represented by $R_1$ is preferably an aromatic hydrocarbon group having 6 to 14 carbon atoms. Such a group may be, for example, an aryl group such as a phenyl group or a naphthyl group. The aromatic hydrocarbon group represented by $R_1$ is preferably a phenyl group.

The heterocyclic hydrocarbon group represented by $R_1$ may have aromaticity or may not have aromaticity. The heterocyclic hydrocarbon group preferably has aromaticity.

The heterocyclic ring contained in the foregoing group may be monocyclic or polycyclic. Examples of such a heterocyclic ring include an imidazole ring, a pyridine ring, a pyrazine ring, a pyrimidine ring, a pyridazine ring, a 2H-pyrrole ring, a 3H-indole ring, a 1H-indazole ring, a purine ring, an isoquinoline ring, a 4H-quinolizine ring, a quinoline ring, a phthalazine ring, a naphthyridine ring, a quinoxaline ring, a quinazoline ring, a cinnoline ring, a pteridine ring, a phenanthridine ring, an acridine ring, a phenanthroline ring, a phenazine ring, a perimidine ring, a triazine ring, a benzisoquinoline ring, a thiazole ring, a thiadiazine ring, an azepine ring, an azocine ring, an isothiazole ring, an isoxazole ring, and a benzothiazole ring.

$R_1$ is an aromatic hydrocarbon group, or it is preferred that two $R_1$'s are bonded to each other to form a ring.

The ring which may be formed by bonding of at least two of $R_1$, X, R, and $A_N$ to each other is preferably a 4- to 7-membered ring, more preferably a 5- or 6-membered ring, and particularly preferably a 5-membered ring. Further, the ring skeleton may contain a heteroatom such as an oxygen atom, a sulfur atom, or a nitrogen atom.

In the case where the group represented by $R_1$ or the ring formed by bonding of two $R_1$'s to each other further has a substituent, examples of the substituent include the following. That is, examples of the substituent include a halogen atom (—F, —Br, —Cl, or —I), a hydroxyl group, an alkoxy group, an aryloxy group, a mercapto group, an alkylthio group, an arylthio group, an amino group, an acyloxy group, a carbamoyloxy group, an alkylsulfoxy group, an arylsulfoxy group, an acylthio group, an acylamino group, a ureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, a carbamoyl group, an alkylsulfinyl group, an arylsulfinyl group, an alkylsulfonyl group, an arylsulfonyl group, a sulfo group ($-SO_3H$) and a conjugate base group thereof (referred to as a sulfonato group), an alkoxysulfonyl group, an aryloxysulfonyl group, a sulfinamoyl group, a phosphono group ($-OP_3H_2$) and a conjugate base group thereof (referred to as a phosphonato group), a phosphonooxy group ($-OPO_3H_2$) and a conjugate base group thereof (referred to as a phosphonatooxy group), a cyano group, a nitro group, an aryl group, an alkenyl group, an alkynyl group, a heterocyclic group, a silyl group, and an alkyl group.

Of these substituents, a hydroxyl group, an alkoxy group, a cyano group, an aryl group, an alkenyl group, an alkynyl group, an alkyl group, and the like are preferable.

In General Formula (N-II), o is preferably an integer of 1 to 4, more preferably 1 or 2, and still more preferably 1.

In one embodiment, the basic compound represented by General Formula (N-II) is preferably a basic compound in which at least one of an (n) number of R's in the formula is an aromatic hydrocarbon group. X in at least one of an (o) number of —(X-AN) groups bonded to at least one of the aromatic hydrocarbon groups is preferably a linking group in which the bonding site to the aromatic hydrocarbon group is a carbon atom.

That is, in the basic compound in this embodiment, the basic moiety represented by $A_N$ is bonded to the aromatic hydrocarbon group through a carbon atom directly bonded to the aromatic hydrocarbon group represented by R.

The aromatic hydrocarbon group represented by R may contain a heterocyclic ring as the aromatic ring in the aromatic hydrocarbon group. In addition, the aromatic ring may be monocyclic or polycyclic.

The aromatic ring group preferably has 6 to 14 carbon atoms. Such a group may be, for example, an aryl group such as a phenyl group, a naphthyl group, or an anthryl group. In the case where the aromatic ring group contains a heterocyclic ring, examples of the heterocyclic ring include a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

The aromatic hydrocarbon group represented by R is preferably a phenyl group or a naphthyl group, and particularly preferably a phenyl group.

The aromatic hydrocarbon group represented by R may further have a substituent besides the group represented by —(X-$A_N$) described below. As the substituent, for example, those listed above as substituents for $R_1$ can be used.

Further, in this embodiment, the linking group as X in at least one —(X-$A_N$) group substituted with the above-mentioned aromatic ring R is not particularly limited as long as the bonding site to the aromatic hydrocarbon group represented by R is a carbon atom. The linking group includes, for example, an alkylene group, a cycloalkylene group, an arylene group, —COO—, —CO—, or a combination thereof. The linking group may include a combination of each of these groups and at least one selected from the group consisting of —O—, —S—, —OCO—, —S(=O)—, —S(=O)₂—, —OS(=O)₂—, and —NR'—. Here, R' represents, for example, a hydrogen atom, an alkyl group, a cycloalkyl group, or an aryl group.

The alkylene group, which the linking group represented by X may contain, may be linear or branched. The number of carbon atoms in the alkylene group is preferably 1 to 20, and more preferably 1 to 10. Examples of such an alkylene group include a methylene group, an ethylene group, a propylene group, and a butylene group.

The cycloalkylene group, which the linking group represented by X may contain, may be monocyclic or polycyclic. The cycloalkylene group preferably has 3 to 20 carbon atoms, and more preferably 3 to 10 carbon atoms. Such a cycloalkylene group may be, for example, a 1,4-cyclohexylene group.

The number of carbon atoms in the arylene group, which the linking group represented by X may contain, is preferably 6 to 20, and more preferably 6 to 10. Examples of such an arylene group include a phenylene group and a naphthylene group.

At least one X is preferably represented by General Formula (N-III) or (N-IV).

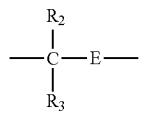
(N-III)

In the formula,
R2 and R3 represent a hydrogen atom, an alkyl group, an alkenyl group, an aliphatic cyclic group, an aromatic hydrocarbon group, or a heterocyclic hydrocarbon group. R2 and R3 may be bonded to each other to form a ring. At least one of R2 or R3 may be bonded to E to form a ring.

E represents a linking group or a single bond.

(N-IV)

In the formula,
J represents an oxygen atom or a sulfur atom.
E represents a linking group or a single bond.
Examples of the respective groups represented by $R_2$ and $R_3$ and the substituents which these groups may further have include the same ones as those described above for $R_1$. The ring that can be formed by bonding of $R_2$ and $R_3$, and the ring that can be formed by bonding of at least one of $R_2$ or $R_3$ to E are preferably a 4- to 7-membered ring and more preferably a 5- or 6-membered ring. $R_2$ and $R_3$ are each independently preferably a hydrogen atom or an alkyl group.

The linking group represented by E includes, for example, an alkylene group, a cycloalkylene group, an arylene group, —COO—, —CO—, —O—, —S—, —OCO—, —S(=O)—, —S(=O)₂—, —OS(=O)₂—, —NR—, or a combination thereof. Here, R represents, for example, a hydrogen atom, an alkyl group, a cycloalkyl group, or an aryl group.

The linking group represented by E is preferably at least one selected from the group consisting of an alkylene bond, an ester bond, an ether bond, a thioether bond, a urethane bond (group represented by

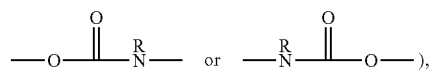

a urea bond
(group represented by

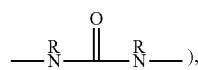

an amido bond, and a sulfonamido bond. The linking group represented by E is more preferably an alkylene bond, an ester bond, or an ether bond.

The basic compound may be a compound having a plurality of moieties containing a nitrogen atom. For example, the basic compound may be a compound in which at least one of $R_1$'s in General Formula (N-II) has a structure represented by General Formula (N-I).

In one embodiment, the basic compound represented by General Formula (N-II) is represented by General Formula (N-V).

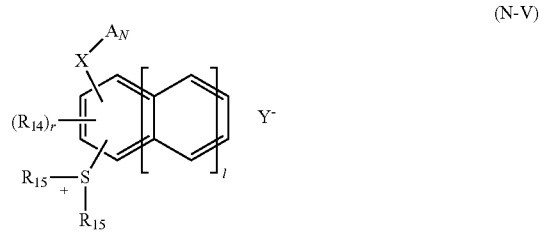
(N-V)

In the formula, X, $A_N$, and $Y^-$ have the same definitions as the respective groups in General Formula (N-II), and specific examples and preferred examples thereof are also the same.

$R_{14}$, $R_{15}$, r, and l have the same definitions as the respective groups and the indices in General Formula (ZI-4) representing one embodiment of the photoacid generator, and the specific examples and preferred examples thereof are also the same.

Further, in one embodiment, the basic compound represented by General Formula (N-II) is represented by General Formula (N-VI).

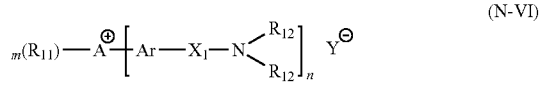
(N-VI)

In General Formula (N-VI),
A represents a sulfur atom or an iodine atom.
$R_{11}$'s each independently represent an alkyl group, an alkenyl group, an aliphatic cyclic group, an aromatic hydrocarbon group, or a heterocyclic hydrocarbon group. In the case where m=2, two $R_{11}$'s may be bonded to each other to form a ring.

Ar's each independently represent an aromatic hydrocarbon group.

$X_1$'s each independently represent a divalent linking group.

$R_{12}$'s each independently represent a hydrogen atom or an organic group.

In the case where A is a sulfur atom, m is an integer of 1 to 3, and n is an integer satisfying the relationship of m+n=3.

In the case where A is an iodine atom, m is an integer of 1 or 2, and n is an integer satisfying the relationship of m+n=2.

$Y^-$ represents an anion (of which details will be described later as an anion moiety of the basic compound).

Specific examples and preferred examples of the alkyl group, alkenyl group, aliphatic cyclic group, aromatic hydrocarbon group, and heterocyclic hydrocarbon group as $R_{11}$ are the same as the specific examples and preferred examples of the alkyl group, alkenyl group, aliphatic cyclic group, aromatic hydrocarbon group, and heterocyclic hydrocarbon group as $R_1$ in General Formula (N-II).

Specific examples and preferred examples of the aromatic hydrocarbon group as Ar are the same as the specific examples and preferred examples of the aromatic hydrocarbon group as R in General Formula (N-II).

Specific examples and preferred examples of the divalent linking group as $X_1$ are the same as the specific examples and preferred examples of the linking group as X in General Formula (N-II).

Specific examples and preferred examples of the organic group as $R_{11}$ are the same as the specific examples and preferred examples of the organic group as $R_A$ and $R_B$ in General Formula (N-I).

From the viewpoint of post exposure bake (PEB) temperature dependence and post exposure line width (PED) stability, particularly preferred is an embodiment in which X is an alkylene group (for example, a methylene group) and the two $R_{11}$'s are bonded to each other to form a ring.

The anion moiety of the basic compound is not particularly limited. The anion contained in the basic compound is preferably a non-nucleophilic anion. As used herein, the term "non-nucleophilic anion" is an anion having an extremely low ability of causing a nucleophilic reaction and capable of suppressing the decomposition over time due to the intramolecular nucleophilic reaction. Thus, temporal stability of the composition according to the present invention is improved.

Examples of the non-nucleophilic anion include a sulfonate anion, a carboxylate anion, a sulfonylimide anion, a bis(alkylsulfonyl)imide anion, and a tris(alkylsulfonyl)methyl anion.

Examples of the sulfonate anion include an aliphatic sulfonate anion, an aromatic sulfonate anion, and a camphorsulfonate anion.

Examples of the carboxylate anion include an aliphatic carboxylate anion, an aromatic carboxylate anion, and an aralkyl carboxylate anion.

The aliphatic moiety in the aliphatic sulfonate anion may be an alkyl group or a cycloalkyl group, and is preferably an alkyl group having 1 to 30 carbon atoms or a cycloalkyl group having 3 to 30 carbon atoms, examples of which include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a bornyl group.

The aromatic group in the aromatic sulfonate anion is preferably an aryl group having 6 to 14 carbon atoms, and examples thereof include a phenyl group, a tolyl group, and a naphthyl group.

The alkyl group, cycloalkyl group, and aryl group in the aliphatic sulfonate anion and the aromatic sulfonate anion may have a substituent. Examples of the substituent for the alkyl group, cycloalkyl group, and aryl group in the aliphatic sulfonate anion and the aromatic sulfonate anion include a nitro group, a halogen atom (a fluorine atom, a chlorine atom, a bromine atom, or an iodine atom), a carboxy group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). Regarding the aryl group and ring structure in the respective groups, an alkyl group (preferably having 1 to 15 carbon atoms) may be further exemplified as a substituent.

Examples of the aliphatic moiety in the aliphatic carboxylate anion include the same alkyl group and cycloalkyl group as in the aliphatic sulfonate anion.

Examples of the aromatic group in the aromatic carboxylate anion include the same aryl group as in the aromatic sulfonate anion.

The aralkyl group in the aralkylcarboxylate anion is preferably an aralkyl group having 6 to 12 carbon atoms, and examples thereof include a benzyl group, a phenethyl group, a naphthylmethyl group, a naphthylethyl group, and a naphthylbutyl group.

The alkyl group, cycloalkyl group, aryl group, and aralkyl group in the aliphatic carboxylate anion, aromatic carboxylate anion, and aralkyl carboxylate anion may have a substituent. Examples of the substituent for the alkyl group, cycloalkyl group, aryl group, and aralkyl group in the aliphatic carboxylate anion, aromatic carboxylate anion, and aralkyl carboxylate anion include the same halogen atom, alkyl group, cycloalkyl group, alkoxy group, and alkylthio group as in the aromatic sulfonate anion.

The sulfonylimide anion may be, for example, a saccharin anion.

The alkyl group in the bis(alkylsulfonyl)imide anion and tris(alkylsulfonyl)methyl anion is preferably an alkyl group having 1 to 5 carbon atoms, and examples thereof include a methyl group, an ethyl group, a propyl group, an isopropyl group, an n-butyl group, an isobutyl group, a sec-butyl group, a pentyl group, and a neopentyl group. Examples of the substituent for these alkyl groups include a halogen atom, an alkyl group substituted with a halogen atom, an alkoxy group, an alkylthio group, an alkyloxysulfonyl group, an aryloxysulfonyl group, and a cycloalkylaryloxysulfonyl group. Preferred is an alkyl group substituted with a fluorine atom. Also preferred is an embodiment in which two alkyl groups in the bis(alkylsulfonyl)imide anion are bonded to each other to form a cyclic structure. In this case, it is preferred that the formed cyclic structure is a 5- to 7-membered ring.

Examples of other non-nucleophilic anions include fluorinated phosphorus, fluorinated boron, and fluorinated antimony.

The non-nucleophilic anion is preferably an aliphatic sulfonate anion in which the α-position of sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoro aliphatic sulfonate anion having 4 to 8 carbon atoms, or a benzenesulfonate anion having a fluorine atom, and still more preferably a nonafluorobutanesulfonate anion, a perfluorooctanesulfonate anion, a pentafluorobenzenesulfonate anion, or a 3,5-bis(trifluoromethyl)benzenesulfonate anion.

Further, the non-nucleophilic anion is preferably represented by, for example, General Formula (LD1).

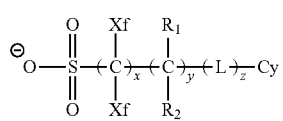

(LD1)

In the formula,

Xf's each independently represent a fluorine atom or an alkyl group substituted with at least one fluorine atom.

$R_1$ and R2 each independently represent a hydrogen atom, a fluorine atom, or an alkyl group.

L's each independently represent a divalent linking group.

Cy represents a cyclic organic group.

x represents an integer of 1 to 20.

y represents an integer of 0 to 10.

z represents an integer of 0 to 10.

Xf represents a fluorine atom or an alkyl group substituted with at least one fluorine atom. The number of carbon atoms in the alkyl group is preferably 1 to 10, and more preferably 1 to 4. Further, the alkyl group substituted with at least one fluorine atom is preferably a perfluoroalkyl group.

Xf is preferably a fluorine atom or a perfluoroalkyl group having 1 to 4 carbon atoms. More specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$.

$R_1$ and $R_2$ each independently represent a hydrogen atom, a fluorine atom, or an alkyl group. The alkyl group may have a substituent (preferably a fluorine atom), and preferably has 1 to 4 carbon atoms. More preferred is a perfluoroalkyl group having 1 to 4 carbon atoms. Specific examples of the alkyl group having a substituent as $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, among which $CF_3$ is preferable.

L represents a divalent linking group. Examples of the divalent linking group include —COO—, —OCO—, —CONH—, —CO—, —O—, —S—, —SO—, —$SO_2$—, an alkylene group, a cycloalkylene group, and an alkenylene group. Among them, —CONN—, —CO—, or —$SO_2$— is preferable, and —CONH— or —$SO_2$— is more preferable.

Cy represents a cyclic organic group. Examples of the cyclic organic group include an alicyclic group, an aryl group, and a heterocyclic group.

The alicyclic group may be monocyclic or polycyclic. The monocyclic alicyclic group may be, for example, a monocyclic cycloalkyl group such as a cyclopentyl group, a cyclohexyl group, or a cyclooctyl group. The polycyclic alicyclic group may be, for example, a polycyclic cycloalkyl group such as a norbomyl group, a tricyclodecanyl group, a tetracyclodecanyl group, a tetracyclododecanyl group, or an adamantyl group. Among them, an alicyclic group with a bulky structure having 7 or more carbon atoms, such as a norbomyl group, a tricyclodecanyl group, a tetracyclodecanyl group, a tetracyclododecanyl group, or an adamantyl group, is preferred from the viewpoint of inhibiting diffusivity into the film during post exposure bake (PEB) process and improving a mask error enhancement factor (MEEF).

The aryl group may be monocyclic or polycyclic. Examples of the aryl group include a phenyl group, a naphthyl group, a phenanthryl group, and an anthryl group. Among them, a naphthyl group having a relatively low light absorbance at 193 nm is preferable.

The heterocyclic group may be monocyclic or polycyclic, but a polycyclic heterocyclic group may further inhibit diffusion of an acid. Also, the heterocyclic group may have aromaticity or may not have aromaticity. Examples of the heterocyclic ring having aromaticity include a furan ring, a thiophene ring, a benzofuran ring, a benzothiophene ring, a dibenzofuran ring, a dibenzothiophene ring, and a pyridine ring. Examples of the heterocyclic ring having no aromaticity include a tetrahydropyran ring, a lactone ring, and a decahydroisoquinoline ring. As the heterocyclic ring in the heterocyclic group, a furan ring, a thiophene ring, a pyridine ring, or a decahydroisoquinoline ring is particularly preferred. Also, examples of the lactone ring include lactone rings illustrated in connection with $R_A$ and $R_B$ in General Formula (N-I).

The cyclic organic group may have a substituent. Examples of the substituent include an alkyl group, a cycloalkyl group, an aryl group, a hydroxyl group, an alkoxy group, an ester group, an amido group, a urethane group, an ureido group, a thioether group, a sulfonamido group, and a sulfonic acid ester group. The alkyl group may be linear or branched. In addition, the alkyl group preferably has 1 to 12 carbon atoms. The cycloalkyl group may be monocyclic or polycyclic. Also, the cycloalkyl group preferably has 3 to 12 carbon atoms. The aryl group preferably contains 6 to 14 carbon atoms.

x is preferably 1 to 8, more preferably 1 to 4, and particularly preferably 1. y is preferably 0 to 4, and more preferably 0. z is preferably 0 to 8, and more preferably 0 to 4.

Further, the non-nucleophilic anion is also preferably represented by, for example, General Formula (LD2).

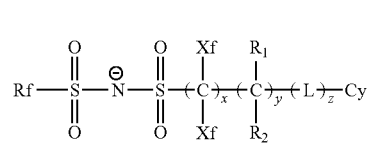

(LD2)

In General Formula (LD2), Xf, R1, R2, L, Cy, x, y, and z have the same definitions as those in General Formula (LD1), respectively. Rf is a group containing a fluorine atom.

Examples of the fluorine atom-containing group represented by Rf include an alkyl group having at least one fluorine atom, a cycloalkyl group having at least one fluorine atom, and an aryl group having at least one fluorine atom.

These alkyl group, cycloalkyl group, and aryl group may be substituted by a fluorine atom or may be substituted by another fluorine atom-containing substituent. In the case where Rf is a cycloalkyl group having at least one fluorine atom or an aryl group having at least one fluorine atom, the another fluorine-containing substituent may be, for example, an alkyl group substituted with at least one fluorine atom.

Also, these alkyl group, cycloalkyl group, and aryl group may be further substituted by a fluorine atom-free substituent. Examples of this substituent include those not containing a fluorine atom out of those described above for Cy.

Examples of the alkyl group having at least one fluorine atom represented by Rf are the same as those described above as the alkyl group substituted with at least one fluorine atom represented by Xf. Examples of the cycloalkyl group having at least one fluorine atom represented by Rf include a perfluorocyclopentyl group and a perfluorocyclohexyl group.

The aryl group having at least one fluorine atom represented by Rf may be, for example, a perfluorophenyl group.

A preferred embodiment of the anion moiety of the basic compound may be, for example, a structure illustrated as the preferred anion structure of the photoacid generator, in addition to the structures represented by General Formulae (LD1) and (LD2).

Further, the fluorine content of the basic compound, as expressed in terms of (total mass of all fluorine atoms in compound)/(total mass of all atoms in compound), is preferably 0.30 or less, more preferably 0.25 or less, still more preferably 0.20 or less, particularly preferably 0.15 or less, and most preferably 0.10 or less.

Specific examples of the basic compound may refer to paragraphs [0108] to [0116] of JP2014-134686A, the contents of which are incorporated herein by reference.

An onium salt compound containing a nitrogen atom in the anion moiety is also preferable as the basic compound.

The onium salt compound containing a nitrogen atom in the anion moiety is preferably a basic compound or an ammonium salt compound whose basicity decreases upon irradiation with actinic rays or radiation.

The onium salt compound containing a nitrogen atom in the anion moiety is preferably a compound (E-1) having a basic functional group or an ammonium group and a group capable of generating an acidic functional group upon irradiation with actinic rays or radiation. That is, the onium salt compound containing a nitrogen atom in the anion moiety is preferably a basic compound having a basic functional group and a group capable of generating an acidic functional group upon irradiation with actinic rays or radiation, or a basic compound having an ammonium group and a group capable of generating an acidic functional group upon irradiation with actinic rays or radiation.

As the compound having a reduced basicity which is generated by decomposition of an onium salt compound containing a nitrogen atom in the anion moiety upon irradiation with actinic rays or radiation, a compound represented by General Formula (PA-I), (PA-II), or (PAIII) may be exemplified. From the viewpoint that all of LWR, local pattern dimension uniformity, and DOF can achieve excellent effects at a high level, a compound represented by General Formula (PA-II) or (PA-III) is particularly preferable.

First, the compound represented by General Formula (PA-I) will be described.

Q-A1-(X)n—B—R　　(PA-I)

In General Formula (PA-I),

A1 represents a single bond or a divalent linking group.

Q represents —SO$_3$H or —CO$_2$H. Q corresponds to an acidic functional group generated upon irradiation with actinic rays or radiation.

X represents —SO$_2$— or —CO—.

n represents 0 or 1.

B represents a single bond, an oxygen atom, or —N(Rx)-.

Rx represents a hydrogen atom or a monovalent organic group.

R represents a monovalent organic group having a basic functional group or a monovalent organic group having an ammonium group.

Next, the compound represented by General Formula (PA-II) will be described.

Q1-X1-NH-X2-Q2　　(PA-II)

In General Formula (PA-II),

Q1 and Q2 each independently represent a monovalent organic group, provided that either one of Q1 and Q2 has a basic functional group. Q1 and Q2 are bonded to each other to form a ring, and the formed ring may have a basic functional group.

X1 and X2 each independently represent —CO— or —SO$_2$—.

—NH— corresponds to an acidic functional group generated upon irradiation with actinic rays or radiation.

Next, the compound represented by General Formula (PA-III) will be described.

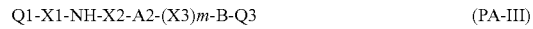

Q1-X1-NH-X2-A2-(X3)m-B-Q3　　(PA-III)

In General Formula (PA-III),

Q1 and Q3 each independently represent a monovalent organic group, provided that either one of Q1 and Q3 has a basic functional group. Q1 and Q3 are bonded to each other to form a ring, and the formed ring may have a basic functional group.

X1, X2, and X3 each independently represent —CO— or —SO$_2$—.

A2 represents a divalent linking group.

B represents a single bond, an oxygen atom, or —N(Qx)-.

Qx represents a hydrogen atom or a monovalent organic group.

In the case where B is —N(Qx)-, Q3 and Qx may be bonded to each other to form a ring.

m represents 0 or 1.

—NH— corresponds to an acidic functional group generated upon irradiation with actinic rays or radiation.

Examples of the onium salt compound containing a nitrogen atom in the anion moiety may refer to paragraphs [0421] to [0428] of JP2014-41328A, the contents of which are incorporated herein by reference.

Specific examples of the onium salt compound containing a nitrogen atom in the cation moiety or the onium salt compound containing a nitrogen atom in the anion moiety include, but are not limited to, the following compounds.

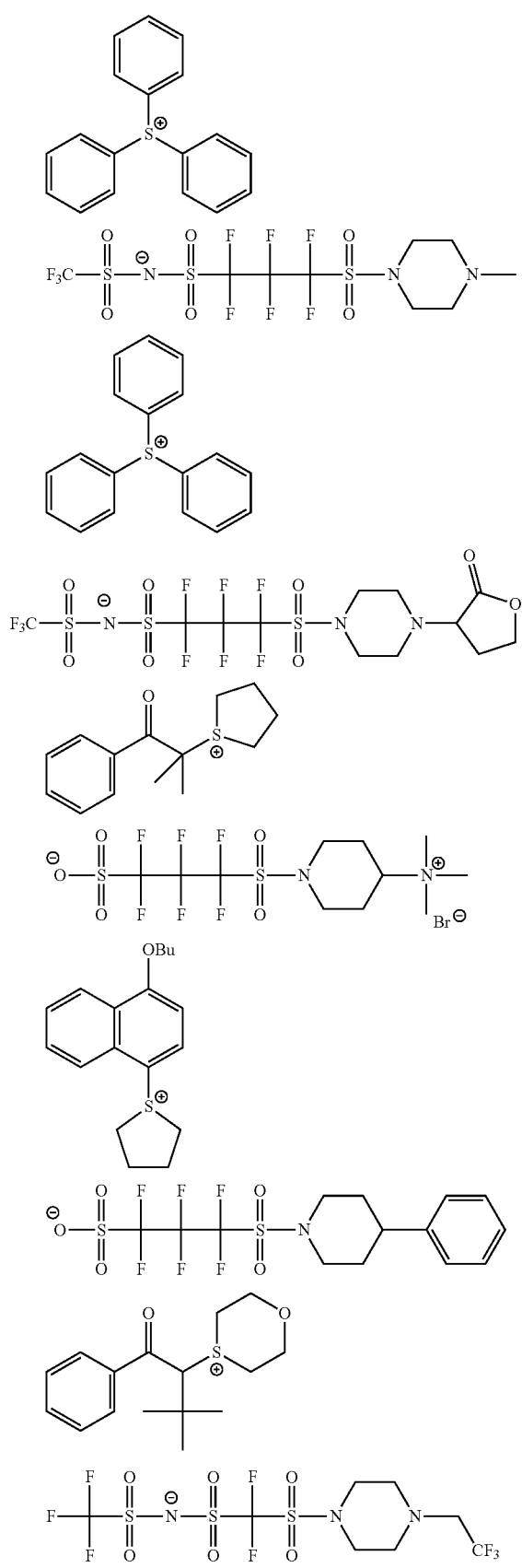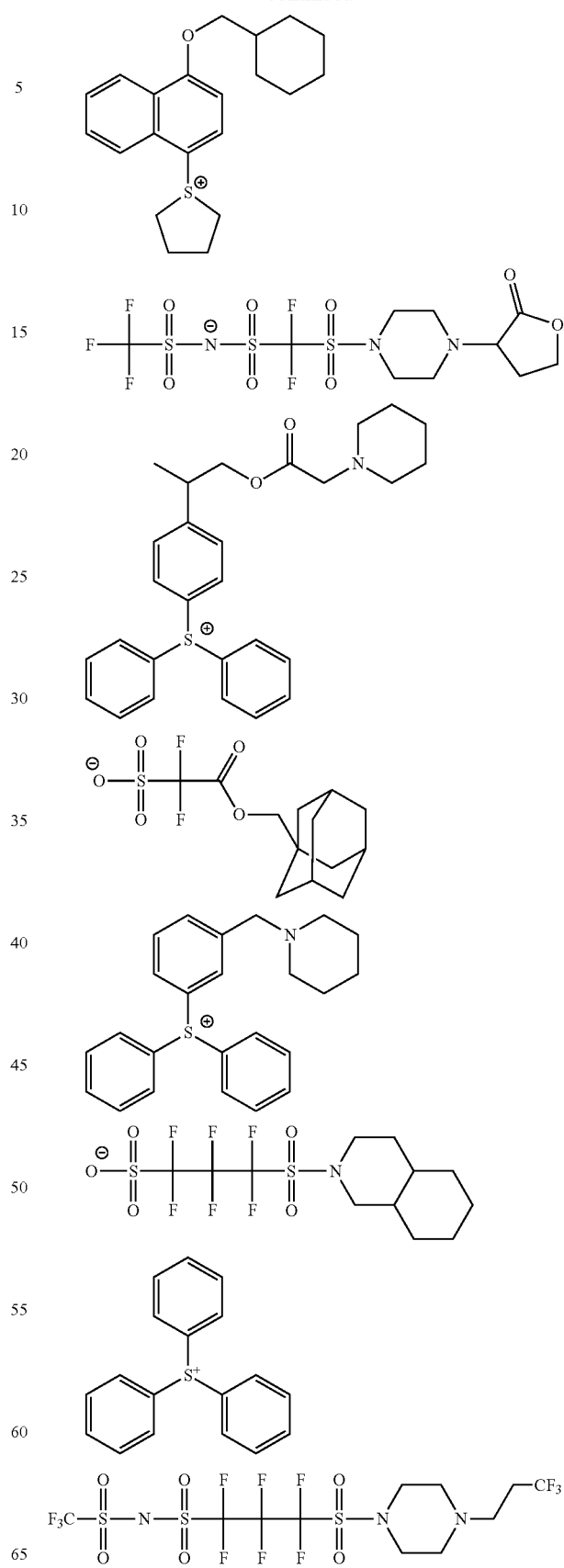

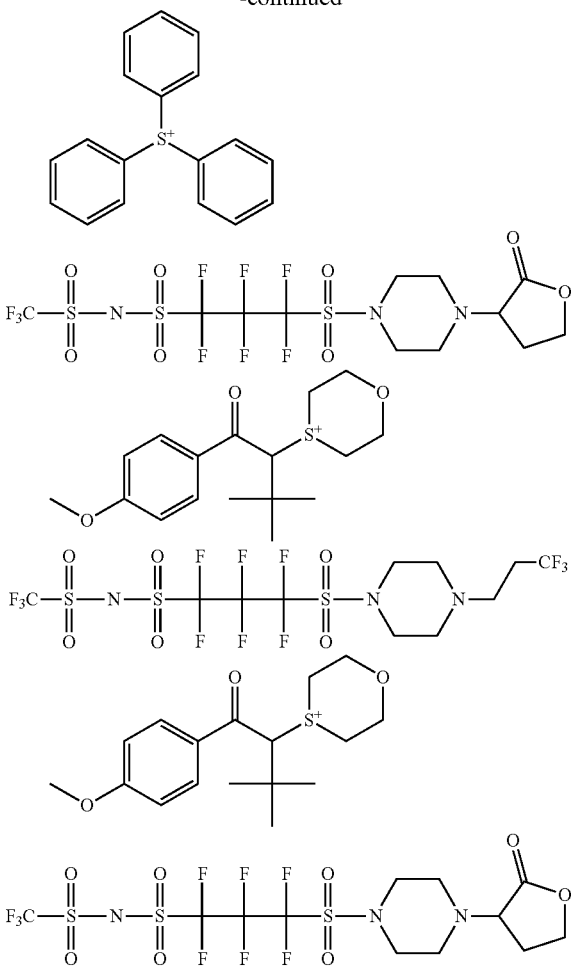

<Acid Proliferation Agent>

The actinic ray-sensitive or radiation-sensitive composition according to the present invention may further contain one or two or more compounds capable of decomposing by the action of an acid to generate an acid (hereinafter, also referred to as an acid proliferation agent). The acid generated from the acid proliferation agent is preferably a sulfonic acid, a methide acid, or an imide acid. The content of the acid proliferation agent is preferably 0.1 to 50 mass %, more preferably 0.5 to 30 mass %, and still more preferably 1.0 to 20 mass %, based on the total solid content of the composition.

The ratio of the acid proliferation agent to the acid generator (solid content of acid proliferation agent based on total solid content in composition/solid content of acid generator based on total solid content in composition) is not particularly limited, but it is preferably 0.01 to 50, more preferably 0.1 to 20, and particularly preferably 0.2 to 1.0.

Examples of the acid proliferation agent may refer to the description of paragraph [0381] of JP2014-41328A, the contents of which are incorporated herein by reference.

Hereinafter, the pattern forming method of the present invention will be described in more detail.

<<Steps (1) and (1')>>

In step (1) of the first aspect of the pattern forming method of the present invention, or in step (1') of the second aspect of the pattern forming method of the present invention, a film is formed using an actinic ray-sensitive or radiation-sensitive resin composition. Generally, the above film is formed on a substrate.

The step of forming the film of the composition on the substrate can be carried out by a commonly known method.

The substrate is not particularly limited. As this substrate, it is possible to use a substrate which is commonly used for a production process of a semiconductor such as an IC, a production process of a circuit board of, for example, a liquid crystal or a thermal head, and other lithography processes of photofabrication. Examples of such a substrate include inorganic substrates such as silicon, SiN, and $SiO_2$, and coated inorganic substrates such as SOG. Further, according to necessity, an organic antireflection film may be formed between the film and the substrate.

It is also preferred to include a prebake (PB) step after the film formation and before the exposure step.

The PB step is carried out at the heating temperature of preferably 40° C. to 130° C., more preferably 50° C. to 120° C., and still more preferably 60° C. to 120° C.

The heating time is preferably 30 to 300 seconds, more preferably 30 to 180 seconds, and still more preferably 30 to 90 seconds.

<<Step (2)>>

The formed film is exposed using actinic rays or radiation. The step of exposing the film can also be carried out by a commonly known method.

The light source used for exposure is preferably X-rays, extreme ultraviolet rays (EUV), or electron beams (EB).

In the present invention, pattern formation is carried out by using a non-chemically amplified mechanism, so that diffusion of an acid can be completely suppressed without performing a post exposure bake (PEB) step, whereby satisfactory resolution can be obtained.

As described above, in the present invention, in order to simplify the manufacturing process, it is preferable not to include the PEB step after the step (2), but it may include the PEB step. In the case of including the PEB step, the heating temperature is preferably 60° C. to 90° C.

The film formed using the actinic ray-sensitive or radiation-sensitive resin composition used in the present invention may be subjected to immersion exposure. This may further improve the resolution. As the immersion medium to be used, any liquid can be used as long as it has a refractive index higher than that of air. The immersion medium is preferably pure water.

In this case, a hydrophobic resin may be previously added to the composition, and after the film is formed, a topcoat may be provided thereon. The performance required for the topcoat, the use method thereof, and the like are described in "Process and Materials of Immersion Lithography", Chapter 7, published by CMC Publishing Co., Ltd.

In the case of peeling the topcoat after exposure, a developer may be used, or a release agent may be used separately. A solvent having a small penetration into the film is preferable as the release agent. From the viewpoint that the peeling step can be carried out at the same time as the development processing step of the film, it is preferred that the film can be peeled off with a developer.

<<Step (3)>>

After the exposure step (2), a positive tone pattern is formed by development using a developer containing an organic solvent. The development step can be carried out by a commonly known method.

As the developing method, use can be made of, for example, a method in which a substrate is dipped in a bath filled with a developer for a given period of time (dip method), a method in which a developer is puddled on the surface of a substrate by its surface tension and allowed to stand still for a given period of time to thereby effect development (puddle method), a method in which a developer is sprayed onto the surface of a substrate (spray method), or a method in which a developer is continuously ejected onto a substrate spinning at a given speed while scanning a developer discharge nozzle at a given speed (dynamic dispense method).

In the case where the various developing methods include a step of discharging the developer from the developing nozzle of the developing apparatus toward the resist film, the discharge pressure of the discharged developer (flow rate of discharged developer per unit area) is preferably 2 mL/sec/mm$^2$ or less, more preferably 1.5 mL/sec/mm$^2$ or less, and still more preferably 1 mL/sec/mm$^2$ or less. There is no lower limit of the flow rate, but it is preferably 0.2 mL/sec/mm$^2$ or more upon considering the throughput.

By setting the discharge pressure of the discharged developer to the above-specified range, it is possible to remarkably reduce defects in the pattern derived from the resist residues after development.

Although details of this mechanism are not clear, it is probably considered that setting the discharge pressure within the above-specified range reduces the pressure applied to the resist film by the developer, so that the composition film and/or pattern is prevented from being accidentally scraped or collapsed.

The discharge pressure (mL/sec/mm$^2$) of the developer is a value at the developing nozzle exit in the developing apparatus.

As a method of adjusting the discharge pressure of the developer, for example, a method of adjusting a discharge pressure of the developer with a pump or the like and a method of adjusting a pressure by supply of the developer from a pressurizing tank can be mentioned.

Further, after the step of carrying out the development, a step of stopping the development may be carried out while replacing the solvent with another solvent.

<Developer>

The developer is used in the development step (3) described hereinbefore and can also be referred to as an organic developer since it contains an organic solvent.

(Organic Solvent)

The vapor pressure of the organic solvent (or overall vapor pressure thereof in the case of a mixed solvent) at 20° C. is preferably 5 kPa or less, more preferably 3 kPa or less, and particularly preferably 2 kPa or less. By setting the vapor pressure of the organic solvent to 5 kPa or less, evaporation of the developer on a substrate or in a development cup is suppressed, the temperature uniformity in the wafer plane is improved, and as a result, the dimensional uniformity in the wafer plane is improved.

Various organic solvents are widely used as the organic solvent for use in the developer. For example, solvents such as an ester-based solvent, a ketone-based solvent, an alcohol-based solvent, an amide-based solvent, an ether-based solvent, and a hydrocarbon-based solvent may be used.

In the present invention, the ester-based solvent refers to a solvent having an ester bond in the molecule, the ketone-based solvent refers to a solvent having a ketone group in the molecule, the alcohol-based solvent refers to a solvent having an alcoholic hydroxyl group in the molecule, the amide-based solvent refers to a solvent having an amide group in the molecule, and the ether-based solvent refers to a solvent having an ether bond in the molecule. Among these solvents, there is also a solvent having a plurality of the above-mentioned functional groups in one molecule, but in this case, such a solvent shall correspond to any solvent type containing the functional group possessed by the solvent. For example, it is assumed that diethylene glycol monomethyl ether shall also fall under any of an alcohol-based solvent and an ether-based solvent in the above-mentioned categories. The hydrocarbon-based solvent is a hydrocarbon-based solvent having no substituent.

In particular, preferred is a developer containing at least one solvent selected from a ketone-based solvent, an ester-based solvent, an alcohol-based solvent, and an ether-based solvent.

Examples of the ester-based solvent include methyl acetate, ethyl acetate, butyl acetate, isobutyl acetate, pentyl acetate, propyl acetate, isopropyl acetate, amyl acetate (pentyl acetate), isoamyl acetate (isopentyl acetate, 3-methylbutyl acetate), 2-methylbutyl acetate, 1-methylbutyl acetate, hexyl acetate, heptyl acetate, octyl acetate, methoxyethyl acetate, ethoxyethyl acetate, butyl butyrate, methyl 2-hydroxyisobutyrate, propylene glycol monomethyl ether acetate (PGMEA; also known as 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, pentyl propionate, hexyl propionate, heptyl propionate, butyl butanoate, isobutyl butanoate, pentyl butanoate, hexyl butanoate, isobutyl isobutanoate, propyl pentanoate, isopropyl pentanoate, butyl pentanoate, pentyl pentanoate, ethyl hexanoate, propyl hexanoate, butyl hexanoate, isobutyl hexanoate, methyl heptanoate, ethyl heptanoate, propyl heptanoate, cyclohexyl acetate, cycloheptyl acetate, 2-ethylhexyl acetate, cyclopentyl propionate, 2-hydroxymethyl propionate, 2-hydroxyethyl propionate, methyl-3-methoxy propionate, ethyl-3-methoxy propionate, ethyl-3-ethoxy propionate, and propyl-3-methoxy propionate. Among these, preferred is butyl acetate, amyl acetate, isoamyl acetate, 2-methylbutyl acetate, 1-methylbutyl acetate, hexyl acetate, pentyl propionate, hexyl propionate, heptyl propionate, or butyl butanoate, and particularly preferred is isoamyl acetate.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenyl acetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, and γ-butyrolactone, among which preferred is 2-heptanone.

Examples of the alcohol-based solvent include an alcohol (monohydric alcohol), such as methanol, ethanol, 1-propanol, isopropanol, 1-butanol, 2-butanol, 3-methyl-1-butanol, tert-butyl alcohol, 1-pentanol, 2-pentanol, 1-hexanol, 1-heptanol, 1-octanol, 1-decanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonanol, 9-methyl-2-decanol, or 3-methoxy-1-butanol; a glycol-based solvent, such as ethylene glycol, diethylene glycol, or triethylene glycol; and a glycol ether-based solvent containing a hydroxyl group, such as ethylene glycol monomethyl ether, propylene glycol monomethyl ether (PGME; also known as 1-methoxy-2-propanol), diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, or propylene glycol monophenyl ether. Among these, preferred is a glycol ether-based solvent.

Examples of the ether-based solvent include, in addition to the glycol ether-based solvent containing a hydroxyl group, a glycol ether-based solvent containing no hydroxyl group, such as propylene glycol dimethyl ether, propylene glycol diethyl ether, dipropylene glycol dimethyl ether, dipropylene glycol diethyl ether, diethylene glycol dimethyl ether, or diethylene glycol diethyl ether; an aromatic ether-based solvent such as anisole or phenetole; a cycloaliphatic ether-based solvent such as dioxane, tetrahydrofuran, tetrahydropyran, perfluoro-2-butyl tetrahydrofuran, perfluorotetrahydrofuran, 1,4-dioxane, cyclopentyl isopropyl ether, cyclopentyl sec-butyl ether, cyclopentyl tert-butyl ether, cyclohexyl isopropyl ether, cyclohexyl sec-butyl ether, or cyclohexyl tert-butyl ether; an acyclic aliphatic ether-based solvent having a linear alkyl group, such as di-n-propyl ether, di-n-butyl ether, di-n-pentyl ether, or di-n-hexyl ether; and an acyclic aliphatic ether-based solvent having a branched alkyl group, such as diisohexyl ether, methylisopentyl ether, ethylisopentyl ether, propylisopentyl ether, diisopentyl ether, methylisobutyl ether, ethylisobutyl ether, propylisobutyl ether, diisobutyl ether, diisopropyl ether, ethylisopropyl ether, or methylisopropyl ether. Preferred is a glycol ether-based solvent, or an aromatic ether-based solvent such as anisole.

Examples of the amide-based solvent include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include an aliphatic hydrocarbon-based solvent such as pentane, hexane, octane, nonane, decane, dodecane, undecane, hexadecane, 2,2,4-trimethylpentane, 2,2,3-trimethylhexane, perfluorohexane, or perfluoroheptane; an aromatic hydrocarbon-based solvent such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, or dipropylbenzene; and an unsaturated hydrocarbon-based solvent such as octene, nonene, decene, undecene, dodecene, or hexadecene.

The double bond and the triple bond contained in the unsaturated hydrocarbon-based solvent may be plural, and may be present at any position of the hydrocarbon chain. Cis and trans forms of an unsaturated hydrocarbon-based solvent compound occurring due to having a double bond may be mixed.

The hydrocarbon-based solvent may be a mixture of compounds having the same number of carbon atoms and a different structure. For example, in the case of using decane as the aliphatic hydrocarbon-based solvent, 2-methylnonane, 2,2-dimethyloctane, 4-ethyloctane, isodecane, and the like, which are compounds having the same number of carbon atoms and a different structure, may be included in the aliphatic hydrocarbon-based solvent.

The compounds having the same number of carbon atoms and a different structure may be included alone, or may be included as a plurality of compounds as described above.

From the viewpoint of being capable of suppressing swelling of a resist film in the case of using EUV and EB in the exposure step described hereinbefore, the developer to be used is preferably an ester-based solvent having 7 or more carbon atoms (preferably 7 to 14 carbon atoms, more preferably 7 to 12 carbon atoms, and still more preferably 7 to 10 carbon atoms), and having 2 or less heteroatoms.

The heteroatom in the ester-based solvent is an atom other than a carbon atom and a hydrogen atom, and examples thereof include an oxygen atom, a nitrogen atom, and a sulfur atom. The number of heteroatoms is preferably 2 or less.

Preferred examples of the ester-based solvent having 7 or more carbon atoms and having 2 or less heteroatoms include amyl acetate, isoamyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, among which it is particularly preferred to use isoamyl acetate.

In the case of using EUV and EB in the exposure step described hereinbefore, the developer to be used may be a mixed solvent of the above-mentioned ester-based solvent and the above-mentioned hydrocarbon-based solvent or a mixed solvent of the above-mentioned ketone-based solvent and the above-mentioned hydrocarbon-based solvent in place of the above-mentioned ester-based solvent having 7 or more carbon atoms and having 2 or less heteroatoms. Also in this case, it is effective in suppressing swelling of a resist film.

In the case where an ester-based solvent and a hydrocarbon-based solvent are used in combination, it is preferred to use isoamyl acetate as the ester-based solvent. From the viewpoint of preparing the solubility of a resist film, the hydrocarbon-based solvent to be used is preferably a saturated hydrocarbon-based solvent (for example, octane, nonane, decane, dodecane, undecane, or hexadecane).

In the case where a ketone-based solvent and a hydrocarbon-based solvent are used in combination, it is preferred to use 2-heptanone as the ketone-based solvent. From the viewpoint of preparing the solubility of a resist film, the hydrocarbon-based solvent to be used is preferably a saturated hydrocarbon-based solvent (for example, octane, nonane, decane, dodecane, undecane, or hexadecane).

In the case where the above-mentioned mixed solvent is used, the content of the hydrocarbon-based solvent depends on solvent solubility of a resist film and is not particularly limited. Therefore, the necessary amount of the hydrocarbon-based solvent may be determined by appropriately preparing such a mixed solvent.

The above-mentioned organic solvent may be used as a mixture of a plurality of solvents, or may be used in admixture with water or a solvent other than those described above. However, in order to fully achieve the effect of the present invention, it is preferred that the moisture content of the whole developer is less than 10 mass %, and it is more preferred that the developer is substantially free of water. The concentration of the organic solvent (total concentration of solvents in the case of mixing a plurality of solvents) in the developer is preferably 50 mass % or more, more preferably 50 to 100 mass %, still more preferably 85 to 100 mass %, even still more preferably 90 to 100 mass %, and particularly preferably 95 to 100 mass %. Most preferred is the case consisting of substantially only an organic solvent. The case consisting of substantially only an organic solvent is intended to include a case containing a trace amount of a surfactant, an antioxidant, a stabilizer, an anti-foaming agent, or the like.

The organic solvent used as a developer may be suitably, for example, an ester-based solvent.

It is also preferred that the developer contains an antioxidant, so that the generation of an oxidant over time can be suppressed and the content of the oxidant can be further reduced. A known antioxidant may be used as the antioxidant. In the case where the antioxidant is used for semiconductor applications, an amine-based antioxidant or a phenol-based antioxidant is preferably used.

The content of the antioxidant is not particularly limited, but it is preferably 0.0001 to 1 mass %, more preferably 0.0001 to 0.1 mass %, and still more preferably 0.0001 to 0.01 mass %, with respect to the total mass of the developer. If the content of the antioxidant is 0.0001 mass % or more, a superior antioxidant effect is obtained. If the content of the antioxidant is 1 mass % or less, there is a tendency that generation of development residues can be suppressed.

The developer may contain a basic compound. A specific example of the basic compound may be the same one as the compound (B) that may be contained in the actinic ray-sensitive or radiation-sensitive composition according to the present invention.

It is preferred that the pattern forming method according to the present invention further includes a rinsing step (a step of cleaning the film with a rinsing liquid containing an organic solvent) after the above-mentioned development step, since the effect of the present invention is superior.

<Rinsing Liquid>

The rinsing liquid which is a kind of organic treatment liquid is used in the rinsing step described hereinbefore, and can also be referred to as an organic rinsing liquid since it contains an organic solvent. This rinsing liquid is used in "cleaning" of a resist film (that is, "rinsing" of the resist film) using the organic treatment liquid.

The vapor pressure at 20° C. of the rinsing liquid (overall vapor pressure of solvents in the case of being a mixed solvent) is preferably 0.05 kPa or more and 5 kPa or less, more preferably 0.1 kPa or more and 5 kPa or less, and most preferably 0.12 kPa or more and 3 kPa or less. In the case where the vapor pressure of the rinsing liquid is set to 0.05 kPa or more and 5 kPa or less, temperature uniformity in the wafer plane is improved, the swelling due to permeation of the rinsing liquid is further suppressed, and the dimensional uniformity in the wafer plane is improved.

(Organic Solvent)

Various organic solvents are used as the organic solvent to be contained in the rinsing liquid. It is preferred to use at least one organic solvent selected from the group consisting of a hydrocarbon-based solvent, a ketone-based solvent, an ester-based solvent, an alcohol-based solvent, an amide-based solvent, and an ether-based solvent.

Specific examples of these organic solvents are the same as the organic solvents described for the developer.

In particular, in the case where an ether-based solvent is used as the organic solvent to be contained in the rinsing liquid, the ether-based solvent is preferably an acyclic aliphatic ether-based solvent having 8 to 12 carbon atoms, more preferably an acyclic aliphatic ether-based solvent having a branched alkyl group having 8 to 12 carbon atoms, and particularly preferably diisobutyl ether or diisopentyl ether or diisohexyl ether, from the viewpoint of in-plane uniformity of the wafer.

With regard to the organic solvent contained in the rinsing liquid, in the case of using extreme ultraviolet (EUV) or electron beams (EB) in the exposure step described hereinbefore, it is preferred to use a hydrocarbon-based solvent among the above-mentioned organic solvents and it is more preferred to use an aliphatic hydrocarbon-based solvent. From the viewpoint of the effect being more improved, the aliphatic hydrocarbon-based solvent used in the rinsing liquid is preferably an aliphatic hydrocarbon-based solvent having 5 or more carbon atoms (for example, pentane, hexane, octane, decane, undecane, dodecane, or hexadecane), more preferably an aliphatic hydrocarbon-based solvent having 8 or more carbon atoms, and still more preferably an aliphatic hydrocarbon-based solvent having 10 or more carbon atoms.

The upper limit of the number of carbon atoms of the aliphatic hydrocarbon-based solvent is not particularly limited, but it may be, for example, 16 or less, preferably 14 or less, and more preferably 12 or less.

Among the foregoing aliphatic hydrocarbon-based solvents, particularly preferred is decane, undecane, or dodecane, and most preferred is undecane.

Thus, by using a hydrocarbon-based solvent (especially an aliphatic hydrocarbon-based solvent) as the organic solvent to be contained in the rinsing liquid, the developer which has been slightly impregnated into the resist film after the development is washed away to further exert the effects of further suppressing the swelling and suppressing the pattern collapse.

Further examples of the hydrocarbon-based solvent also include unsaturated hydrocarbon-based solvents such as octene, nonene, decene, undecene, dodecene, and hexadecene.

The double bond and the triple bond contained in the unsaturated hydrocarbon-based solvent may be plural, and may be present at any position of the hydrocarbon chain. Cis and trans forms of an unsaturated hydrocarbon-based solvent compound occurring due to having a double bond may be mixed.

The aliphatic hydrocarbon-based solvent, which is a hydrocarbon-based solvent, may be a mixture of compounds having the same number of carbon atoms and a different structure. For example, in the case of using decane as the aliphatic hydrocarbon-based solvent, 2-methylnonane, 2,2-dimethyloctane, 4-ethyloctane, isodecane, and the like, which are compounds having the same number of carbon atoms and a different structure, may be included in the aliphatic hydrocarbon-based solvent.

The compounds having the same number of carbon atoms and a different structure may be included alone, or may be included as a plurality of compounds as described above.

A plurality of organic solvents may be mixed, or the organic solvent may be used in admixture with an organic solvent other than those described above. The above-mentioned solvent may be mixed with water, but the moisture content in the rinsing liquid is usually 60 mass % or less, preferably 30 mass % or less, still more preferably 10 mass % or less, and most preferably 5 mass % or less. By setting the moisture content to 60 mass % or less, good rinsing properties can be obtained.

The rinsing liquid preferably contains a surfactant. Thereby, the wettability to a resist film is improved, and the cleaning effects tend to be further improved.

As the surfactant, use can be made of the same surfactants as those used in the actinic ray-sensitive or radiation-sensitive composition described hereinbefore.

The content of the surfactant is usually 0.001 to 5 mass %, preferably 0.005 to 2 mass %, and still more preferably 0.01 to 0.5 mass %, with respect to the total mass of the rinsing liquid.

The rinsing liquid preferably contains an antioxidant. Thereby, generation of an oxidant over time can be suppressed, and the content of the oxidant can be further reduced. Specific examples and the content of the antioxidant are as described in the section <Developer>.

In the rinsing step, the wafer subjected to development is subjected to cleaning by using the above-mentioned rinsing liquid. The method of cleaning treatment is not particularly limited, and examples thereof include a method of continuously ejecting a rinsing liquid on a substrate spinning at a given speed (spin coating method), a method of dipping a substrate in a bath filled with a rinsing liquid for a given period of time (dip method), or a method of spraying a rinsing liquid on a substrate surface (spray method). Among them, it is preferred that the cleaning treatment is carried out by the spin coating method and then the substrate is spun at a rotation speed of 2,000 rpm to 4,000 rpm to remove the rinsing liquid from the substrate.

Generally, the developer and the rinsing liquid are stored in a waste liquid tank through a pipe after use. At that time, in the case where a hydrocarbon-based solvent is used as the rinsing liquid, the resist dissolved in the developer is precipitated and adheres to the rear surface of the wafer, the side surface of the pipe or the like. In order to prevent the above problem, there is a method of passing a solvent in which the resist dissolves again through the pipe. As the method of passing the solvent through the pipe, there are a method in which the rear surface, the side surface, and the like of the substrate are cleaned with a solvent in which the resist dissolves and then the solvent is allowed to flow after cleaning with the rinsing liquid, and a method of flowing a solvent in which a resist dissolves without being in contact with the resist so as to pass through a pipe.

<Accommodating Container>

As an organic solvent (hereinafter, referred to as "organic treatment liquid") usable for a developer and a rinsing liquid, it is preferred to use one stored in an accommodating container for accommodating an organic treatment liquid for patterning a chemically amplified resist film, in which the container has an accommodating portion. The accommodating container is preferably, for example, an accommodating container for accommodating an organic treatment liquid for patterning a chemically amplified resist film, in which the inner wall of the accommodating portion being in contact with the organic treatment liquid is formed of a resin different from a polyethylene resin, a polypropylene resin, and a polyethylene-polypropylene resin, or of a metal subjected to a rust prevention/metal elution prevention treatment. An organic solvent to be used as an organic treatment liquid for patterning a chemically amplified resist film is accommodated in the accommodating portion of the accommodating container, and the organic solvent discharged from the accommodating portion can be used at the time of patterning the chemically amplified resist film.

In the case where the accommodating container further has a sealing part for sealing the accommodating portion, the sealing part is also preferably formed of a resin different from a polyethylene resin, a polypropylene resin, and a polyethylene-polypropylene resin, or of a metal subjected to a rust prevention/metal elution prevention treatment.

Here, the seal portion refers to a member capable of shielding the accommodating portion from the outside air, examples of which suitably include packing, an O ring, and the like.

The resin different from a polyethylene resin, a polypropylene resin, and a polyethylene-polypropylene resin is preferably a perfluoro resin.

Examples of the perfluoro resin include a tetrafluoroethylene resin (PTFE), a tetrafluoroethylene-perfluoroalkyl vinyl ether copolymer resin (PFA), a tetrafluoroethylene-hexafluoropropylene copolymer resin (FEP), a tetrafluoroethylene-ethylene copolymer resin (ETFE), a trifluoroethylene chloride-ethylene copolymer resin (ECTFE), a polyvinylidene fluoride resin (PVDF), a trifluoroethylene chloride resin (PCTFE), and a polyvinyl fluoride resin (PVF).

Examples of the particularly preferred perfluoro resin include a tetrafluoroethylene resin, a tetrafluoroethylene-perfluoroalkyl vinyl ether copolymer, and a tetrafluoroethylene-hexafluoropropylene copolymer resin.

Examples of the metal in the metal subjected to a rust prevention/metal elution prevention treatment include carbon steel, alloy steel, nickel chromium steel, nickel chromium molybdenum steel, chromium steel, chromium molybdenum steel, and manganese steel.

As for the rust prevention/metal elution prevention treatment, it is preferred to apply a coating technique.

The coating technique is roughly divided into three types of metal coating (various plating), inorganic coating (various chemical conversion treatments, glass, concrete, ceramics, and the like), and organic coating (rust preventive oil, paint, rubber, and plastics).

Examples of the preferred coating technique include a rust preventive oil, a rust inhibitor, a corrosion inhibitor, a chelate compound, a strippable plastic, and a surface treatment with a lining agent.

Among them, corrosion inhibitors, such as various chromates, nitrites, silicates, phosphates, oleic acid, dimer acid, carboxylic acids such as naphthenic acid, carboxylic acid metal soaps, sulfonates, amine salts, and esters (glycerol esters of higher fatty acids and phosphoric acid esters); chelate compounds such as ethylene diamine tetraacetic acid, gluconic acid, nitrilotriacetic acid, hydroxyethyl ethylene diamine triacetic acid, and diethylenetriamine pentaacetic acid; and fluorine resin lining are preferable. Particularly preferred are a phosphate treatment and fluorine resin lining.

Although it does not directly prevent rust when compared with a direct coating treatment, it is also preferred to adopt "pretreatment" which is a step prior to a rust prevention treatment, as a treatment method leading to prolongation of the rust prevention period by a coating treatment.

As a specific example of such a pretreatment, a treatment for removing a variety of corrosive factors such as chlorides and sulfates present on the metal surface by cleaning or polishing can be suitably exemplified.

Specific examples of the accommodating container include the following.

FluoroPurePFA composite drum manufactured by Entegris Inc. (wetted inner surface; PFA resin lining)
Steel drum manufactured by JFE Corporation (wetted inner surface; zinc phosphate coating)

Further, examples of the accommodating container that can be used in the present invention include the containers described in paragraphs [0013] to [0030] of JP1999-021393A (JP-H11-021393A) and paragraphs [0012] to [0024] of JP1998-45961A (JP-H10-45961A).

In order to prevent breakdown of chemical liquid piping and various parts (a filter, an O-ring, a tube, and the like) due to electrostatic charging and subsequent electrostatic discharging, a conductive compound may be added to the organic treatment liquid of the present invention. The conductive compound is not particularly limited and is, for example, methanol. The addition amount of the conductive compound is not particularly limited, but it is preferably 10 mass % or less and more preferably 5 mass % or less from the viewpoint of maintaining favorable development properties. Regarding the members of the chemical liquid piping, it is possible to use various pipes coated with SUS (stainless steel), or a polyethylene resin, a polypropylene resin, or a fluororesin (a polytetrafluoroethylene resin, a perfluoroalkoxy resin, or the like) subjected to an antistatic treatment. Likewise, a polyethylene resin, a polypropylene resin, or a fluororesin (a polytetrafluoroethylene resin, a perfluoroalkoxy resin, or the like) subjected to an antistatic treatment may also be used for a filter and an O-ring.

Generally, the pattern obtained by the pattern forming method of the present invention is suitably used as an etching mask of a semiconductor device or the like, but it can also be used for other applications. Other applications include, for example, formation of a guide pattern in Directed Self-Assembly (DSA) (see, for example, ACS Nano Vol. 4 No. 8 Page 4815-4823), and use as a core material (core) of a so-called spacer process (see, for example, JP1991-270227A (JP-H03-270227A) and JP2013-164509A).

Further, the present invention also relates to an electronic device manufacturing method including the above-mentioned pattern forming method of the present invention and an electronic device manufactured by such a manufacturing method.

The electronic device of the present invention is suitably mounted on electric electronic equipment (such as a home electronic device, an OA.media-related device, an optical device, and a communication device).

EXAMPLES

Hereinafter, the present invention will be described in more detail with reference to the following Examples, but the present invention is not limited thereto.

Resins A-1 to A-6 and A-20 were used as the resin (A), and resins A-7 to A-19 and A-22 to A-29 were used as the resin (A'). As a comparative example, Resin A-21 was used. The resins A-1 to A-20 and A-22 to A-29 were synthesized according to the method described in JP2013-8020A. The structures, weight-average molecular weight (Mw), dispersity (Mw/Mn) and repeating unit ratio (molar ratio) of the resins A-1 to A-21, and in the resin (A), the acid dissociation constant pKa(A) of the group generated by releasing the polar interaction and in the resin (A'), the value of the acid dissociation constant pKa(A') of the polar group are shown. The value of pKa(A) or pKa(A') is a value calculated by using ACD/LABs pKa DB (Version 8.0) (Fujitsu Limited) for the monomer corresponding to the repeating unit.

A-1

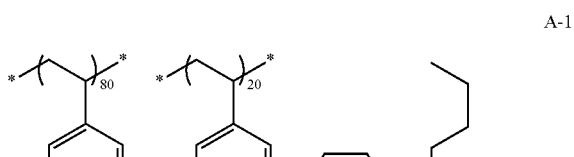

A-2

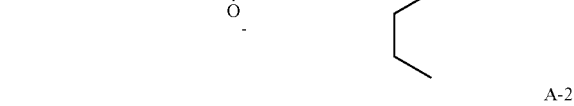

A-3

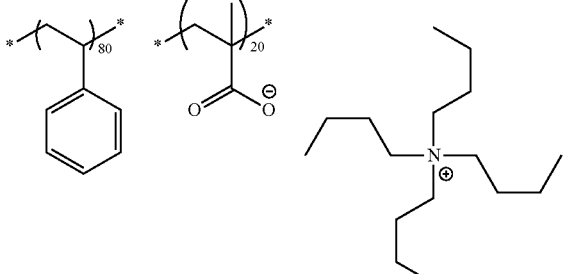

A-4

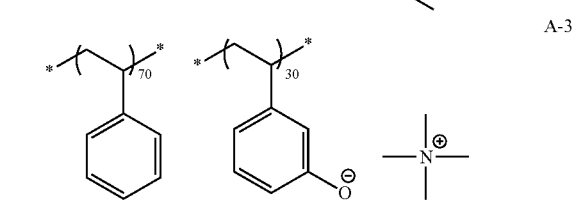

A-5

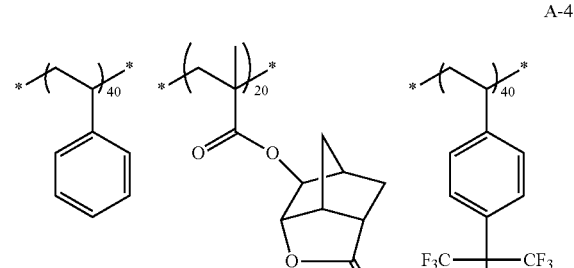

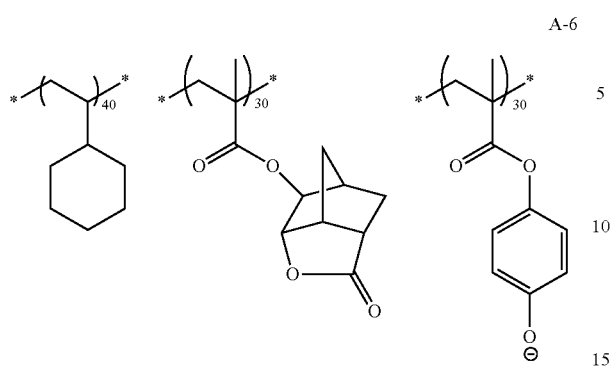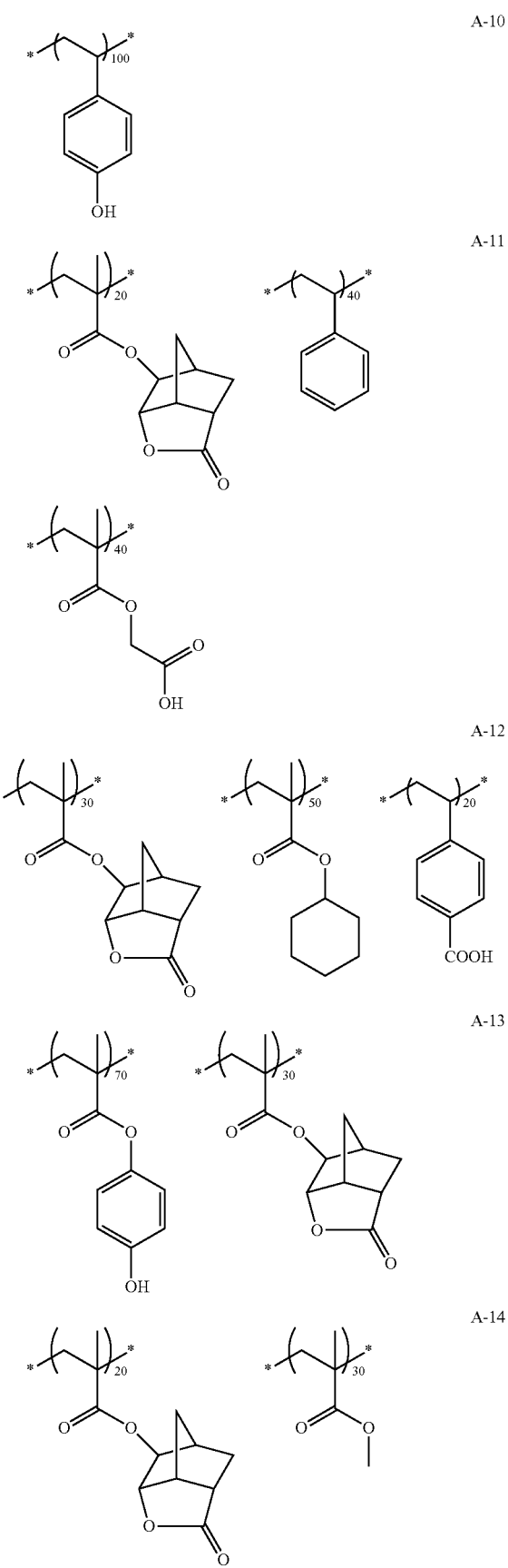

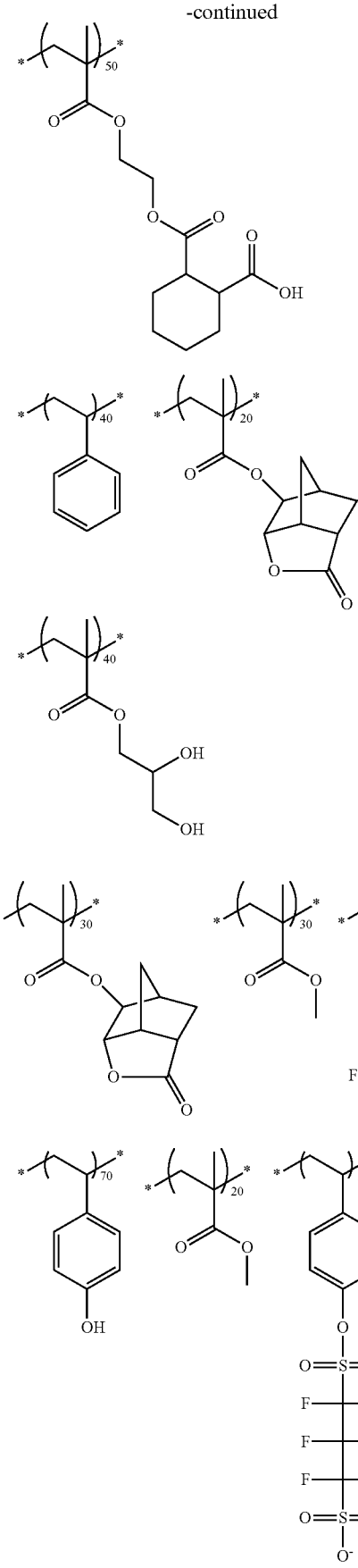
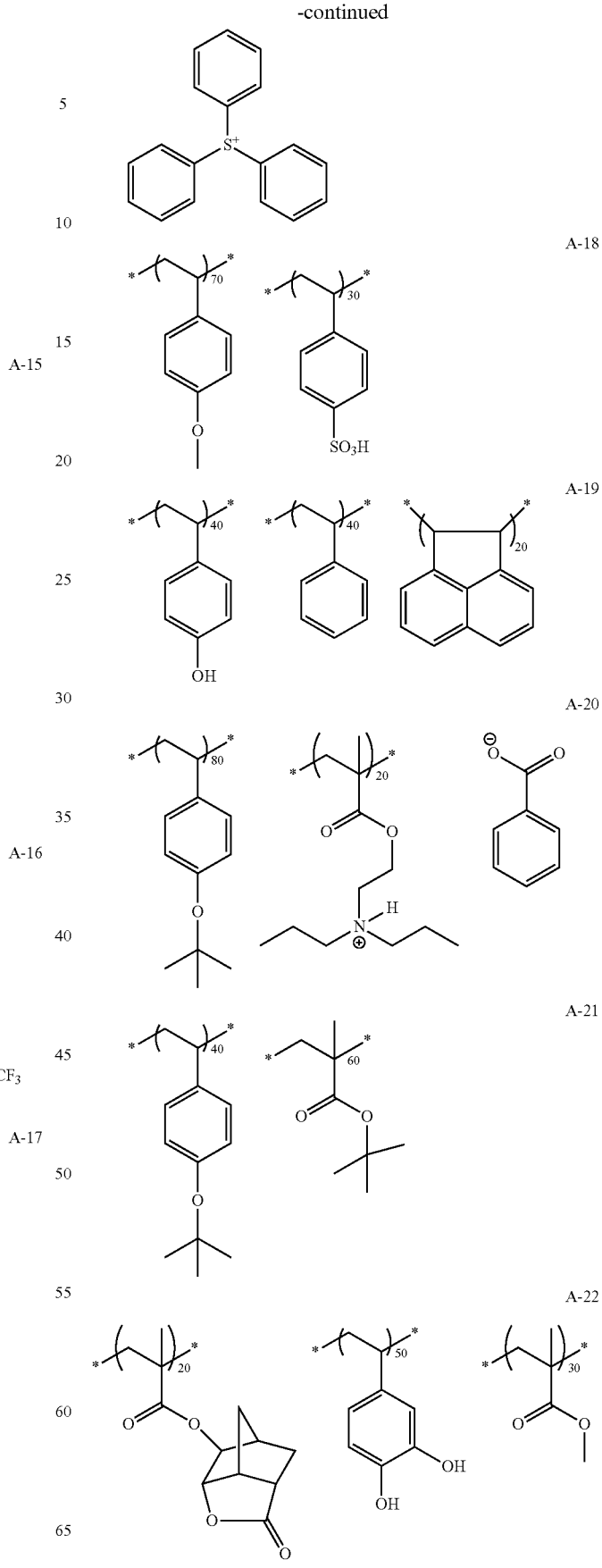

-continued
A-23
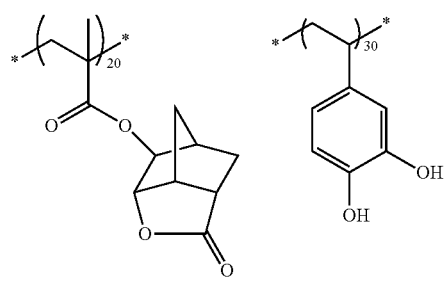
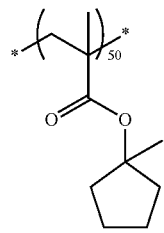
A-24
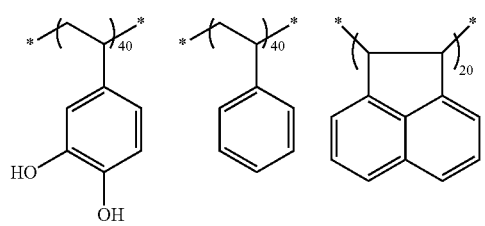
A-25
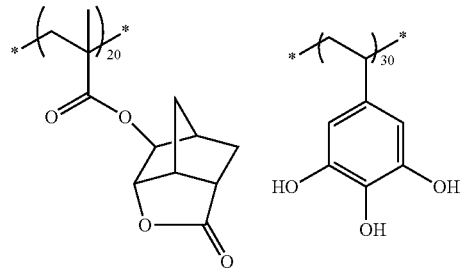
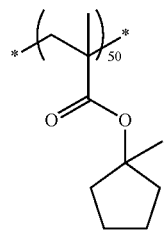
A-26
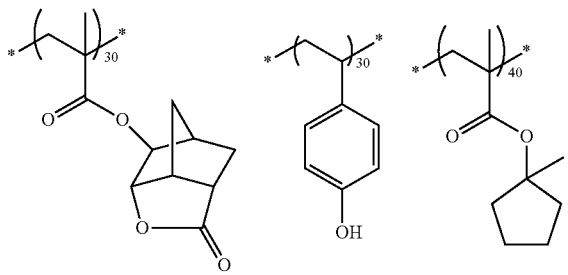
-continued
A-27
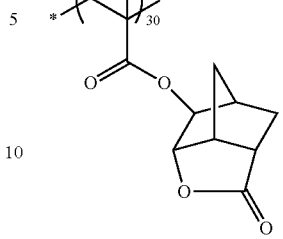
A-28
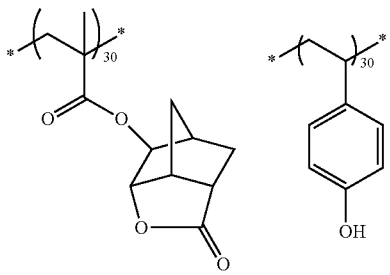
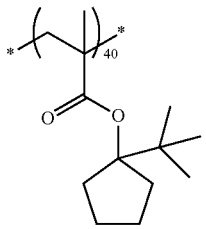
A-29
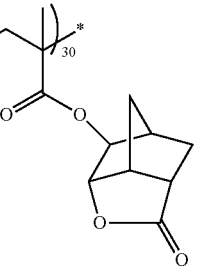
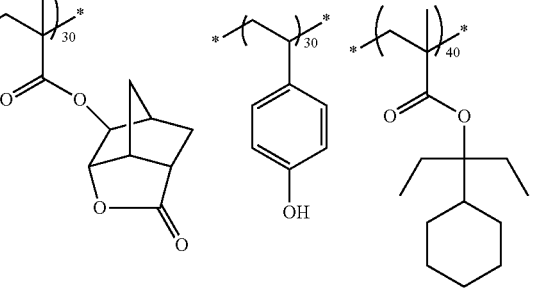
TABLE 1
| | Weight-average molecular weight (Mw) | Dispersity (Mw/Mn) | pKa(A) | pKa(A') |
|---|---|---|---|---|
| A-1 | 14000 | 1.55 | 10.11 | — |
| A-2 | 13500 | 1.57 | 4.97 | — |
| A-3 | 13000 | 1.50 | 10.05 | — |
| A-4 | 15000 | 1.57 | 9.32 | — |
| A-5 | 14000 | 1.50 | 10.11 | — |
| A-6 | 14500 | 1.50 | 9.44 | — |
| A-7 | 13500 | 1.46 | — | 4.97 |
| A-8 | 14000 | 1.51 | — | 4.97 |
| A-9 | 15000 | 1.53 | — | 10.11 |
| A-10 | 15000 | 1.58 | — | 10.11 |
| A-11 | 15000 | 1.50 | — | 2.66 |
| A-12 | 13000 | 1.49 | — | 4.32 |
| A-13 | 12000 | 1.55 | — | 9.44 |

TABLE 1-continued
|  | Weight-average molecular weight (Mw) | Dispersity (Mw/Mn) | pKa(A) | pKa(A') |
| --- | --- | --- | --- | --- |
| A-14 | 14000 | 1.56 | — | 4.35 |
| A-15 | 16500 | 1.55 | — | 13.10 |
| A-16 | 14500 | 1.51 | — | 9.32 |
| A-17 | 15000 | 1.49 | — | 10.11 |
| A-18 | 15000 | 1.48 | — | −0.48 |
| A-19 | 16000 | 1.59 | — | 10.11 |
| A-20 | 13000 | 1.63 | 8.43 |  |
| A-21 | 10000 | 1.41 | — | 10.11 |
| A-22 | 8000 | 1.51 | — | 9.88 |
| A-23 | 7000 | 1.49 | — | 9.88 |
| A-24 | 6000 | 1.49 | — | 9.88 |
| A-25 | 7000 | 1.43 | — | 9.37 |
| A-26 | 8000 | 1.52 | — | 4.97 |
| A-27 | 5000 | 1.49 | — | 4.97 |
| A-28 | 7000 | 1.54 | — | 4.97 |
| A-29 | 7000 | 1.45 | — | 4.97 |
The following compounds B-1 to B-9 were used as the compound (B) capable of forming a polar interaction with the resin (A').
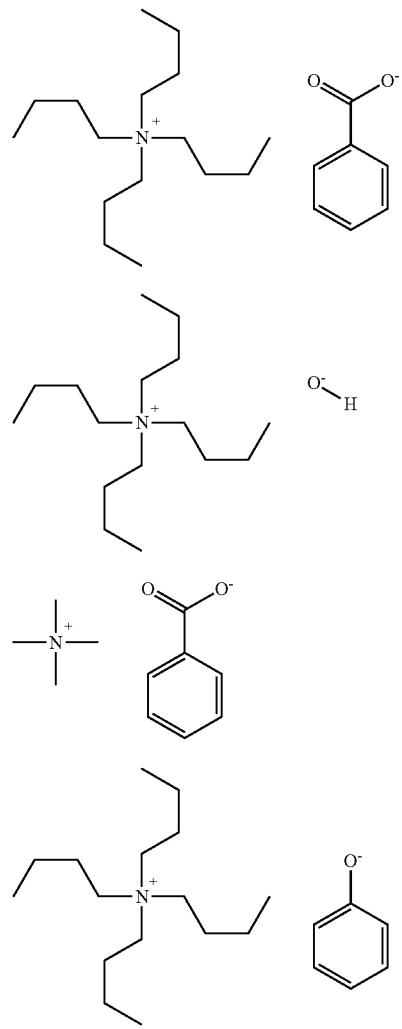
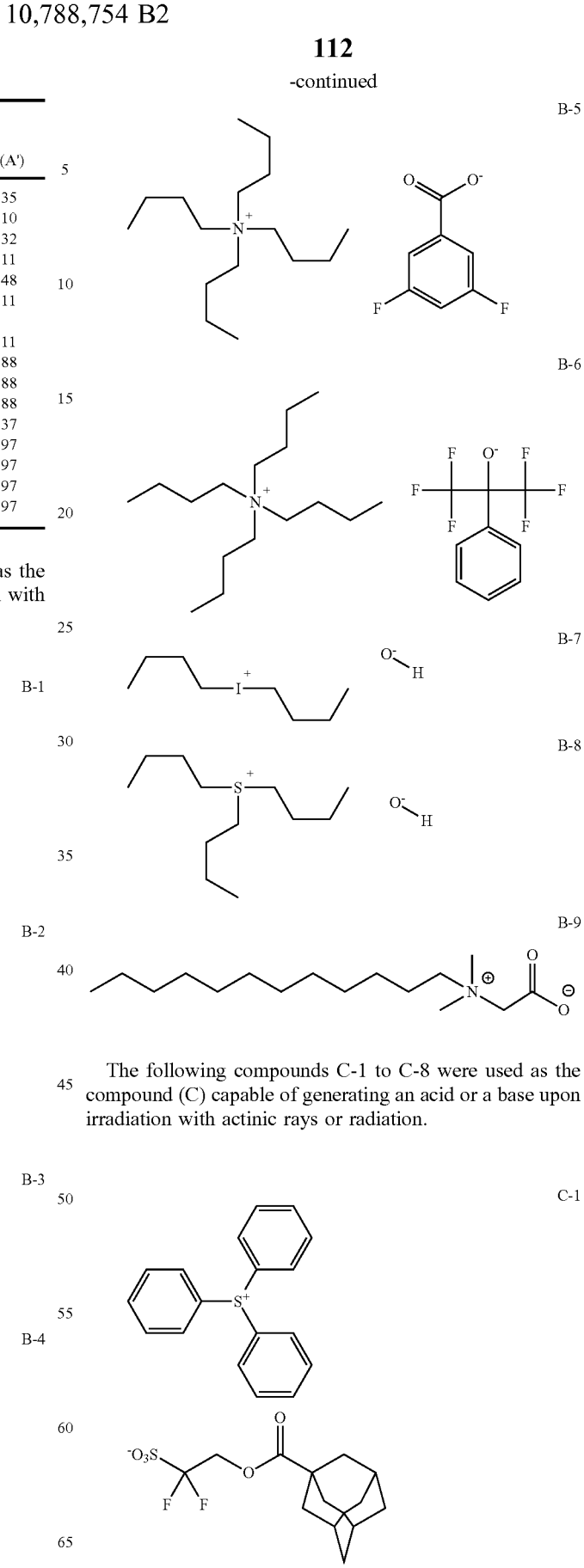
The following compounds C-1 to C-8 were used as the compound (C) capable of generating an acid or a base upon irradiation with actinic rays or radiation.

-continued
C-2
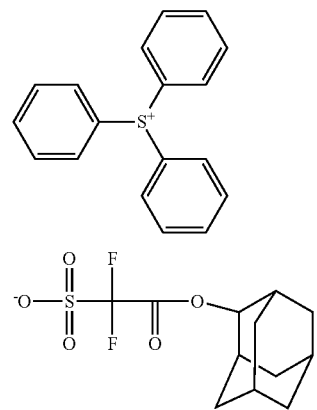
C-3
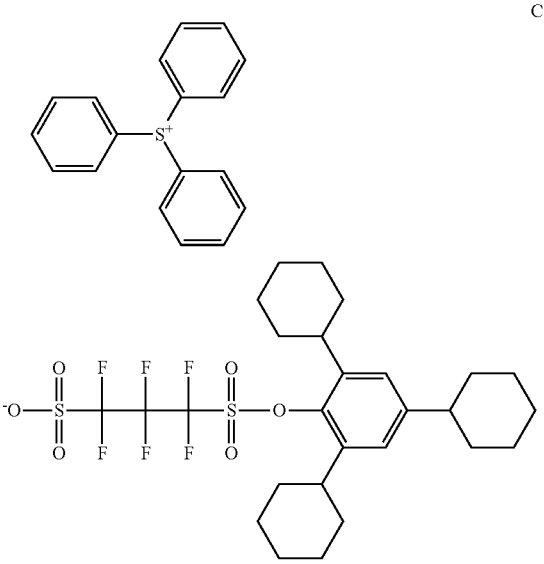
C-4
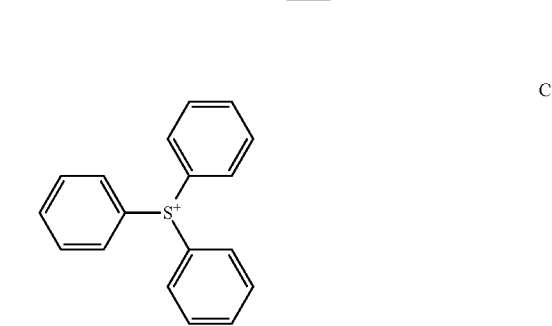
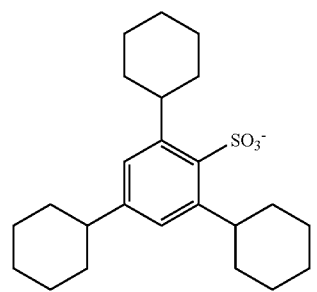
-continued
C-5
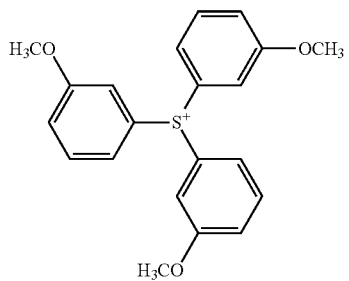
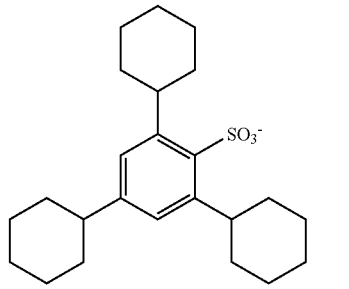
C-6
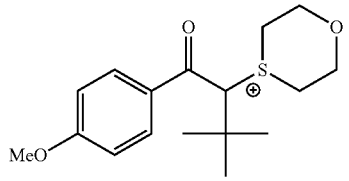
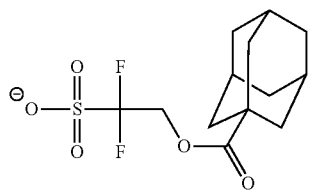
C-7
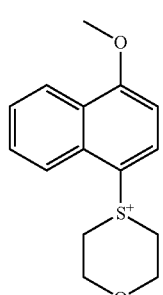
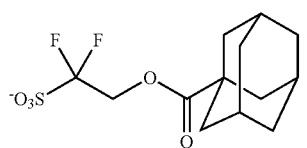

-continued

C-8
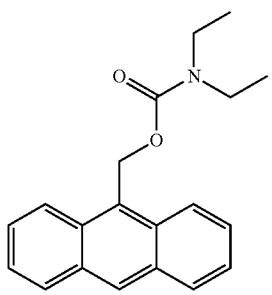

TABLE 2

| | pKa(C) |
|---|---|
| C-1 | −2.70 |
| C-2 | −3.32 |
| C-3 | −3.40 |
| C-4 | −0.22 |
| C-5 | −0.22 |
| C-6 | −2.70 |
| C-7 | −2.70 |
| C-8 | 10.76 |

The following compounds were used as the surfactant.

W1: MEGAFACEE F 176 (manufactured by DIC Corporation) (fluorine-based)

W2: MEGAFACE R08 (manufactured by DIC Corporation) (fluorine- and silicon-based)

W3: Polysiloxane polymer KP-341 (manufactured by Shin-Etsu Chemical Co., Ltd.) (silicon-based)

W4: TROYSOL S-366 (manufactured by Troy Chemical Corporation)

W5: KH-20 (manufactured by Asahi Kasei Corporation)

W6: Poly Fox™ PF-6320 (manufactured by OMNOVA Solutions Inc.) (fluorine-based)

The following compounds were used as the solvent.

Group a

SL-1: propylene glycol monomethyl ether acetate (PGMEA)

SL-2: propylene glycol monomethyl ether propionate

SL-3: 2-heptanone

Group b

SL-4: ethyl lactate

SL-5: propylene glycol monomethyl ether (PGME)

SL-6: 1-butanol

Group c

SL-7: γ-butyrolactone

The following compounds were used as the developer and the rinsing liquid.

DR-1: 3-methylbutyl acetate

DR-2: butyl acetate

DR-3: MAK (methyl amyl ketone)

DR-4: aqueous 2.38 mass % tetramethylammonium hydroxide solution

DR-5: undecane

DR-6: decane

DR-7: MIBC (methyl isobutyl carbinol=4-methyl-2-pentanol)

DR-8: pure water

Preparation of Resist Composition

Examples 1 to 48 (Extreme Ultraviolet (EUV) Exposure, Organic Solvent Development)

The components shown in Tables 3 and 4 below were dissolved in a solvent and each solution was filtered through a polyethylene filter having a pore size of 0.03 μm to prepare resist compositions of Examples 1 to 48. Parts by mass of each component and solvent are shown in Tables 3 and 4.

<Formation of Resist Film, Pattern Formation and Development (Extreme Ultraviolet (EUV) Exposure)>

An organic antireflection film ARC29SR (manufactured by Nissan Chemical Industries, Ltd.) was coated on a silicon wafer and baked at 205° C. for 60 seconds to form an antireflection film having a film thickness of 86 nm. Each resist composition prepared above was coated thereon and baked (PB) at 120° C. for 60 seconds to form a resist film having a film thickness of 40 nm. Using an EUV exposure apparatus (Micro Exposure Tool, NA 0.3, Quadrupole, outer sigma 0.68, and inner sigma 0.36, manufactured by Exitech Corporation), the wafer having the resist film formed thereon was subjected to pattern-wise exposure using an exposure mask (mask having line/space=1/1, and a hole-shaped light-transmitting portion). After the developer was puddled to carry out development for 30 seconds, the wafer was rotated at 2000 rpm for 30 seconds, and then a 1:1 line and space pattern with a line width of 20 nm, and a contact hole pattern with a pore size (hole diameter) of 30 nm and a pitch size of 150 nm were obtained.

In Examples 41 to 48, the resist composition described in Example 1 was subjected to pattern formation through EUV exposure by changing the developer and the rinsing liquid as shown in Table 4. The ratio in Table 4 is a mass ratio.

Comparative Examples 1 and 2 (Extreme Ultraviolet (EUV) Exposure), Alkali Development The preparation of a resist composition and the pattern formation were carried out in the same manner as in Example 1, except that after changing the composition as shown in Table 3 below and carrying out pattern-wise exposure, baking (PEB) was carried out on a hot plate at 120° C. for 60 seconds, the development was carried out using an alkaline aqueous solution (TMAH; an aqueous 2.38 mass % tetramethylammonium hydroxide solution) in place of an organic developer, pure water was used as the rinsing liquid, and PEB was carried out.

TABLE 3

| | | Resin (A) | | Compound (B) | | Compound (C) | | Surfactant (D) | | Solvent (E) | | | |
|---|---|---|---|---|---|---|---|---|---|---|---|---|---|
| | | Compound No. | Parts by mass | Compound No. | Parts by mass | Compound No. | Parts by mass | Compound No. | Parts by mass | Compound No. | Parts by mass | Developer | Rinsing |
| Example | 1 | A-7 | 39 | B-1 | 3 | C-1 | 8 | | | SL-1/SL-4 | 1225/1225 | DR-1 | DR-5 |
| Example | 2 | A-8 | 40 | B-1 | 3 | C-2 | 7 | | | SL-1/SL-4 | 1225/1225 | DR-1 | DR-5 |
| Example | 3 | A-1 | 41 | | | C-1 | 8 | W1 | 1 | SL-1/SL-4 | 1225/1225 | DR-1 | DR-5 |
| Example | 4 | A-1 | 43 | | | C-1 | 7 | | | SL-1/SL-5 | 1225/1225 | DR-1 | DR-5 |
| Example | 5 | A-17 | 41 | B-1 | 4 | C-2 | 5 | | | SL-3/SL-4 | 1225/1225 | DR-1 | DR-5 |
| Example | 6 | A-7 | 39 | B-3 | 3 | C-1 | 7 | W2 | 1 | SL-1/SL-6 | 1225/1225 | DR-1 | DR-5 |
| Example | 7 | A-8 | 37 | B-1 | 8 | C-1 | 5 | | | SL-2/SL-4 | 1225/1225 | DR-1 | DR-5 |
| Example | 8 | A-2 | 43 | | | C-1 | 7 | | | SL-1/SL-4 | 1225/1225 | DR-1 | DR-5 |
| Example | 9 | A-15 | 36 | B-7 | 5 | C-2 | 8 | W6 | 1 | SL-1/SL-4 | 1225/1225 | DR-1 | DR-5 |
| Example | 10 | A-9 | 39 | B-4 | 3 | C-2 | 8 | | | SL-1/SL-5 | 1225/1225 | DR-1 | DR-5 |
| Example | 11 | A-10 | 38 | B-1 | 4 | C-6 | 8 | | | SL-1/SL-4 | 1225/1225 | DR-1 | DR-5 |
| Example | 12 | A-3 | 40 | | | C-1 | 10 | | | SL-1/SL-4 | 1225/1225 | DR-1 | DR-5 |
| Example | 13 | A-18 | 36 | B-2 | 5 | C-1 | 8 | W4 | 1 | SL-1/SL-4 | 1225/1225 | DR-1 | DR-5 |
| Example | 14 | A-11 | 37 | B-1 | 4 | C-3 | 9 | | | SL-1/SL-5 | 1225/1225 | DR-1 | DR-5 |
| Example | 15 | A-16 | 35 | B-1 | 5 | C-1 | 10 | | | SL-1/SL-5 | 1225/1225 | DR-1 | DR-5 |
| Example | 16 | A-7 | 41 | B-3 | 3 | C-2 | 5 | W3 | 1 | SL-1/SL-6 | 1225/1225 | DR-1 | DR-5 |
| Example | 17 | A-19 | 42 | B-2 | 2 | C-1 | 6 | | | SL-1/SL-4 | 1225/1225 | DR-1 | DR-5 |
| Example | 18 | A-14 | 40 | B-6 | 4 | C-1 | 6 | | | SL-1/SL-5 | 1225/1225 | DR-1 | DR-5 |
| Example | 19 | A-19 | 41 | B-8 | 2 | C-4 | 7 | | | SL-1/SL-5 | 1225/1225 | DR-1 | DR-5 |
| Example | 20 | A-4 | 42 | | | C-2 | 7 | W5 | 1 | SL-1/SL-4 | 1225/1225 | DR-1 | DR-5 |
| Example | 21 | A-12 | 39 | B-5 | 4 | C-1 | 7 | | | SL-1/SL-4 | 1225/1225 | DR-1 | DR-5 |
| Example | 22 | A-5 | 42 | | | C-5 | 8 | | | SL-2/SL-5 | 1225/1225 | DR-1 | DR-5 |
| Example | 23 | A-8 | 40 | B-9 | 3 | C-2 | 7 | | | SL-1/SL-4 | 1225/1225 | DR-1 | DR-5 |
| Example | 24 | A-7 | 39 | B-1 | 3 | C-2 | 8 | | | SL-1/SL-5 | 1225/1225 | DR-1 | DR-5 |
| Example | 25 | A-6 | 41 | | | C-2 | 9 | | | SL-1/SL-4 | 1225/1225 | DR-1 | DR-5 |
| Example | 26 | A-1 | 41 | | | C-7 | 9 | | | SL-1/SL-4 | 1225/1225 | DR-1 | DR-5 |
| Example | 27 | A-13 | 39 | B-2 | 3 | C-2 | 8 | | | SL-1/SL-4 | 1225/1225 | DR-1 | DR-5 |
| Example | 28 | A-1/A-10 | 20/20 | B-1 | 5 | C-1 | 5 | | | SL-1/SL-4 | 1225/1225 | DR-1 | DR-5 |
| Example | 29 | A-10 | 34 | B-1/B-5 | 3/3 | C-1 | 10 | | | SL-1/SL-4 | 1225/1225 | DR-1 | DR-5 |
| Example | 30 | A-10 | 38 | B-1 | 6 | C-1/C-6 | 4/2 | | | SL-1/SL-4 | 1225/1225 | DR-1 | DR-5 |
| Example | 31 | A-20 | 40 | | | C-8 | 10 | | | SL-1/SL-4 | 1225/1225 | DR-1 | DR-5 |
| Example | 32 | A-10 | 37 | B-2 | 7 | C-1 | 6 | | | SL-1/SL-4 | 1225/1225 | DR-1 | DR-5 |
| Example | 33 | A-22 | 40 | B-1 | 7 | C-1 | 3 | | | SL-1/SL-4 | 1225/1225 | DR-1 | DR-5 |
| Example | 34 | A-23 | 40 | B-1 | 7 | C-1 | 3 | | | SL-1/SL-4 | 1225/1225 | DR-1 | DR-5 |
| Example | 35 | A-24 | 40 | B-1 | 7 | C-1 | 3 | | | SL-1/SL-4 | 1225/1225 | DR-1 | DR-5 |
| Example | 36 | A-25 | 40 | B-2 | 7 | C-1 | 3 | | | SL-1/SL-4 | 1225/1225 | DR-1 | DR-5 |
| Example | 37 | A-26 | 40 | B-1 | 7 | C-2 | 3 | | | SL-1/SL-4 | 1225/1225 | DR-1 | DR-5 |
| Example | 38 | A-27 | 40 | B-1 | 7 | C-1 | 3 | | | SL-1/SL-4 | 1225/1225 | DR-1 | DR-5 |
| Example | 39 | A-28 | 40 | B-2 | 7 | C-1 | 3 | | | SL-1/SL-4 | 1225/1225 | DR-1 | DR-5 |
| Example | 40 | A-29 | 40 | B-1 | 7 | C-1 | 3 | | | SL-1/SL-4 | 1225/1225 | DR-1 | DR-5 |
| Comparative Example | 1 | A-21 | 41 | B-1 | 1 | C-1 | 8 | | | SL-1/SL-5 | 1225/1225 | DR-4 | DR-8 |
| Comparative Example | 2 | A-21 | 41.5 | B-2 | 0.5 | C-2 | 8 | | | SL-1/SL-5 | 1225/1225 | DR-4 | DR-8 |

TABLE 4

| | | Developer | | Rinsing | |
|---|---|---|---|---|---|
| | | Compound No. | Ratio | Compound No. | Ratio |
| Example | 41 | DR-1/DR-2 | 50/50 | DR-5 | 100 |
| Example | 42 | DR-1/DR-2 | 75/25 | DR-5 | 100 |
| Example | 43 | DR-2 | 100 | DR-6 | 100 |
| Example | 44 | DR-3 | 100 | DR-5/DR-7 | 90/10 |
| Example | 45 | DR-1/DR-3 | 75/25 | DR-5/DR-1 | 90/10 |
| Example | 46 | DR-1/DR-5 | 75/25 | DR-5/DR-1 | 80/20 |
| Example | 47 | DR-1/DR-5 | 90/10 | DR-5/DR-1 | 70/30 |
| Example | 48 | DR-1 | 100 | DR-5/DR-6 | 50/50 |

[Evaluation of Resist Pattern/EUV]

Performance evaluation of the resist pattern was carried out using a scanning electron microscope (S-9380 II manufactured by Hitachi, Ltd.).

<Sensitivity and Resolution (LS)>

The optimum exposure dose in the case of resolving a resist pattern with a line width of 20 nm (line:space=1:1) was taken as sensitivity (Eopt) (mJ/cm$^2$). The limiting resolution (the minimum line width at which the line and the space (line:space=1:1) were separated and resolved) at the determined optimum exposure dose (Eopt) was taken as LS resolution (nm). A smaller value indicates better resolution and satisfactory performance.

<Line Width Roughness (LWR)>

With respect to the line width roughness, in the above Eopt, the line width was measured for arbitrary 50 points in the longitudinal direction of 0.5 μm in a line and space pattern (line:space=1:1) with a line width of 20 nm. The standard deviation of the measured values was determined, and 3a (nm) was computed therefrom. A smaller value indicates better performance.

<Sensitivity and Resolution (Contact Hole)>

The optimum exposure dose in the case of resolving a resist pattern with a pore size (hole diameter) of 30 nm and a pitch size of 150 nm in the contact hole was taken as sensitivity (Eopt) (mJ/cm$^2$). The limiting resolution (the minimum dimension at which the contact hole was separated and resolved) at the determined optimum exposure dose (Eopt) was taken as contact hole resolution (nm). A smaller value indicates better resolution and satisfactory performance.

<Local Pattern Dimension Uniformity (Local-CDU)>

Within one shot exposed at the optimum exposure dose, arbitrary 25 holes in each of 20 regions spaced apart by a gap of 20 μm (that is, 500 holes in total) were measured for the hole size. The standard deviation of the measured values was determined, and 3σ was computed therefrom. A smaller value indicates less dimensional variation and satisfactory performance.

<pKa(A)−pKa(C) or pKa(A')−pKa(C)>

The values of pKa(A) and pKa(A') are values calculated and determined for the monomer corresponding to the repeating unit.

In the compound (C), the acid dissociation constant of an acid or a base generated by the action of exposure is expressed in terms of pKa(C).

All of the above calculations were carried out using ACD/LABs pKa DB (Version 8.0) (Fujitsu Limited).

The absolute value of pKa(A)−pKa(C) or pKa(A')−pKa(C) represents the releasability of the polar interaction formed in the unexposed area. A larger absolute value indicates larger contrast and satisfactory performance.

In the case where the compound (C) is a photoacid generator, the sign of pKa(A)−pKa(C) becomes positive and in the case where the compound (C) is a photobase generator, the sign of pKa(A)−pKa(C) becomes negative.

TABLE 5

|  | pKa(A)-pKa(C) or pKa(A')-pKa(C) | Line and space performance evaluation | | | Contact hole performance evaluation | | |
|---|---|---|---|---|---|---|---|
|  |  | Sensitivity (mJ/cm$^2$) | LS resolution (nm) | LWR (3σ) (nm) | Sensitivity (mJ/cm$^2$) | Contact hole resolution (nm) | Local-CDU (3σ) (nm) |
| Example 1 | 7.7 | 12 | 17 | 3.0 | 18 | 26 | 3.6 |
| Example 2 | 8.3 | 14 | 18 | 3.1 | 20 | 27 | 3.7 |
| Example 3 | 12.8 | 12 | 18 | 3.1 | 18 | 27 | 3.7 |
| Example 4 | 12.8 | 13 | 18 | 3.1 | 20 | 28 | 3.7 |
| Example 5 | 13.4 | 13 | 18 | 3.2 | 19 | 27 | 3.8 |
| Example 6 | 7.7 | 13 | 17 | 3.0 | 19 | 26 | 3.6 |
| Example 7 | 7.7 | 12 | 18 | 3.0 | 18 | 27 | 3.6 |
| Example 8 | 7.7 | 13 | 18 | 3.1 | 19 | 28 | 3.7 |
| Example 9 | 16.4 | 13 | 18 | 3.1 | 19 | 28 | 3.7 |
| Example 10 | 13.4 | 12 | 18 | 3.1 | 18 | 27 | 3.7 |
| Example 11 | 12.8 | 17 | 18 | 3.2 | 25 | 27 | 3.8 |
| Example 12 | 12.8 | 13 | 18 | 3.1 | 19 | 27 | 3.7 |
| Example 13 | 2.2 | 16 | 20 | 3.5 | 22 | 30 | 4.2 |
| Example 14 | 6.1 | 14 | 18 | 3.2 | 21 | 28 | 3.8 |
| Example 15 | 12.0 | 13 | 18 | 3.3 | 19 | 27 | 3.9 |
| Example 16 | 8.3 | 13 | 17 | 3.0 | 19 | 26 | 3.6 |
| Example 17 | 12.8 | 14 | 20 | 3.6 | 20 | 30 | 4.3 |
| Example 18 | 7.1 | 13 | 18 | 3.3 | 20 | 27 | 4.0 |
| Example 19 | 10.3 | 13 | 18 | 3.3 | 20 | 27 | 3.9 |
| Example 20 | 12.6 | 13 | 18 | 3.3 | 19 | 27 | 4.0 |
| Example 21 | 7.0 | 14 | 18 | 3.3 | 20 | 27 | 3.9 |
| Example 22 | 10.3 | 13 | 18 | 3.2 | 20 | 27 | 3.8 |
| Example 23 | 8.3 | 13 | 18 | 3.2 | 19 | 28 | 3.8 |
| Example 24 | 8.3 | 15 | 17 | 3.1 | 23 | 26 | 3.6 |
| Example 25 | 12.8 | 13 | 18 | 3.3 | 19 | 27 | 4.0 |
| Example 26 | 12.8 | 17 | 18 | 3.2 | 25 | 28 | 3.8 |
| Example 27 | 12.8 | 17 | 17 | 3.2 | 25 | 26 | 3.8 |
| Example 28 | 12.8 | 16 | 18 | 3.3 | 23 | 27 | 3.9 |
| Example 29 | 12.8 | 12 | 18 | 3.4 | 18 | 27 | 4.0 |
| Example 30 | 12.8 | 12 | 18 | 3.4 | 18 | 27 | 4.0 |
| Example 31 | −2.3 | 16 | 19 | 3.6 | 19 | 28 | 4.5 |
| Example 32 | 12.8 | 13 | 19 | 3.2 | 19 | 27 | 3.8 |
| Example 33 | 12.6 | 13 | 17 | 3.2 | 20 | 25 | 3.5 |
| Example 34 | 12.6 | 13 | 17 | 3.1 | 19 | 25 | 3.6 |
| Example 35 | 12.6 | 13 | 17 | 3.1 | 19 | 26 | 3.6 |
| Example 36 | 12.1 | 13 | 17 | 3.2 | 20 | 25 | 3.5 |
| Example 37 | 8.3 | 15 | 19 | 3.3 | 22 | 27 | 3.5 |
| Example 38 | 7.7 | 13 | 18 | 3.3 | 19 | 26 | 3.6 |
| Example 39 | 7.7 | 13 | 18 | 3.3 | 19 | 26 | 3.6 |
| Example 40 | 7.7 | 13 | 19 | 3.4 | 19 | 26 | 3.5 |
| Example 41 | 7.7 | 14 | 19 | 3.3 | 19 | 29 | 4.0 |
| Example 42 | 7.7 | 14 | 19 | 3.3 | 19 | 29 | 3.9 |
| Example 43 | 7.7 | 13 | 20 | 3.3 | 20 | 30 | 4.0 |
| Example 44 | 7.7 | 11 | 20 | 3.5 | 17 | 30 | 4.2 |
| Example 45 | 7.7 | 15 | 19 | 3.3 | 22 | 29 | 3.9 |
| Example 46 | 7.7 | 15 | 18 | 3.2 | 23 | 28 | 3.8 |
| Example 47 | 7.7 | 15 | 18 | 3.2 | 22 | 27 | 3.8 |
| Example 48 | 7.7 | 13 | 18 | 3.3 | 19 | 28 | 3.9 |
| Comparative Example 1 | 12.8 | 23 | 20 | 3.8 | 35 | 30 | 4.6 |
| Comparative Example 2 | 12.8 | 15 | 24 | 4.5 | 20 | 36 | 5.1 |

From Table 5, the pattern forming methods of Examples 1 to 48 showed the satisfactory results of sensitivity, resolution, LWR performance, and Local-CDU performance as compared to Comparative Examples 1 and 2.

<Evaluation in Case of Using Electron Beam (EB) Irradiation Apparatus>

A pattern was formed in the same manner as described above, except that the exposure was carried out so as to form a line pattern with a line width of 18 nm to 25 nm (length direction: 0.2 mm, number of lines drawn: 40) in steps of 2.5 nm by using an electron beam irradiation apparatus (JBX6000, manufactured by JEOL, accelerating voltage: 50 keV) in place of an EUV exposure apparatus while varying the exposure dose. The thus obtained pattern was subjected to the same evaluation as described above. As a result, it was confirmed that excellent sensitivity, limiting resolution, LWR, and Local-CDU can be achieved even in the case where an electron beam (EB) irradiation apparatus is used.

After storage of the organic treatment liquid according to the present invention in a FluoroPurePFA composite drum manufactured by Entegris Inc. (wetted inner surface; lined with a PFA resin) and a steel drum manufactured by JFE Corporation (wetted inner surface; coated with zinc phosphate) for 14 days at room temperature in a manner described in JP2014-112176A, the wet particles, organic impurity concentration analysis, and metal impurity concentration analysis showed that it was able to obtain better results in the FluoroPurePFA composite drum manufactured by Entegris Inc. (wetted inner surface; lined with a PFA resin) than the steel drum manufactured by JFE Corporation (wetted inner surface; coated with zinc phosphate).

Similar results can be obtained even in the case of further adding the basic compound described in paragraphs [0218] to [0247] in the Examples of the present application.

According to the present invention, it is possible to provide a positive tone pattern forming method which is capable of forming a pattern having excellent sensitivity, resolution, line width roughness (LWR) performance, and local pattern dimension uniformity (Local-CDU performance), in particular, in the formation of an ultrafine pattern (for example, a line and space pattern with a line width of 20 nm or less, a contact hole pattern with a pore size of 30 nm or less, or the like). Further, according to the present invention, it is possible to provide an electronic device manufacturing method including such a pattern forming method, and an electronic device manufactured by such a manufacturing method.

While the present invention has been described in detail and with reference to specific embodiments, it will be apparent to those skilled in the art that various changes and modifications can be made without departing from the spirit and scope of the invention.

What is claimed is:

1. A positive tone pattern forming method, comprising the successive steps of:
   a step (1') of forming a film using an actinic ray-sensitive or radiation-sensitive resin composition containing
   (A') a resin having a repeating unit having a polar group,
   (B) a compound capable of forming a polar interaction with the polar group of the resin (A'),
   (C) a compound capable of generating an acid or a base upon irradiation with actinic rays or radiation, and
   (D) a solvent,
   wherein the polar interaction formed between the polar group of the resin (A') and the compound (B) is released by the action of the acid or the base, thus decreasing the polarity of the composition and increasing the solubility of the composition in an organic solvent;
   a step (2) of exposing the film; and
   a step (3) of developing the exposed film using a developer containing an organic solvent after exposure
   wherein the compound (B) is a tetraalkylammonium salt
   wherein the organic solvent contained in the developer is selected from the group consisting of an ester-based solvent, a ketone-based solvent, an alcohol-based solvent, an amide-based solvent, an ether-based solvent, and a hydrocarbon-based solvent.

2. The pattern forming method according to claim 1, wherein an acid dissociation constant pKa(A') of the polar group of the resin (A') is 3.0 or more and 13.10 or less.

3. The pattern forming method according to claim 1, wherein the polar group of the resin (A') is a carboxyl group or a hydroxyl group.

4. The pattern forming method according to claim 1, wherein the content of the repeating unit having a polar group in the resin (A') is 5 to 50 mol % with respect to all repeating units of the resin (A').

5. The pattern forming method according to claim 1, wherein the compound (B) is an ionic basic compound.

6. The pattern forming method according to claim 1, wherein the compound (B) is represented by General Formula (B1):

(B1)

in General Formula (B1),
$A^-$ represents an organic acid anion,
$X^+$ represents a nitrogen cation,
Ry represents a hydrogen atom, an alkyl group, a cycloalkyl group, an aryl group, an aralkyl group, or a heterocyclic group,
Rx represents an alkyl group; a plurality of Rx's may be the same or different; the plurality of Rx's may be bonded to each other to form a ring; and the formed ring may have a nitrogen atom, an oxygen atom, or a sulfur atom as a ring member, and
n2 represents 4.

7. The pattern forming method according to claim 1, wherein the content of the compound (B) is 3.0 mass % or more in the total solid content of the actinic ray-sensitive or radiation-sensitive resin composition.

8. The pattern forming method according to claim 1, wherein the compound (C) is a compound capable of generating an acid upon irradiation with actinic rays or radiation.

9. The pattern forming method according to claim 1, wherein an acid dissociation constant pKa(C) of the acid generated upon exposure of the compound (C) is −3.40 or more and less than 3.0.

10. The pattern forming method according to claim 1, wherein the content of the compound (C) is 5.0 mass % or more in the total solid content of the actinic ray-sensitive or radiation-sensitive resin composition.

11. The pattern forming method according to claim 1, wherein an absolute value of the difference pKa(A')−pKa(C) between the acid dissociation constant pKa(A') of the polar group of the resin (A') and the acid dissociation constant pKa(C) of the acid or base generated upon exposure of the compound (C) is 6.0 or more.

12. The pattern forming method according to claim 1, wherein the mass ratio of a solvent having a hydroxyl group to a solvent having no hydroxyl group in the solvent (D) is 40/60 to 100/0.

13. The pattern forming method according to claim 1, wherein a heating step is not provided after the step (2).

* * * * *